United States Patent

Muragishi

Patent Number: 5,536,951
Date of Patent: Jul. 16, 1996

[54] SEMICONDUCTOR DEVICE HAVING THIN FILM TRANSISTOR WITH DIFFUSION PREVENTING LAYER

[75] Inventor: Takeo Muragishi, Hyogo, Japan

[73] Assignee: Mitsubishi Denki Kabushiki Kaisha, Tokyo, Japan

[21] Appl. No.: 489,698

[22] Filed: Jun. 13, 1995

Related U.S. Application Data

[63] Continuation of Ser. No. 235,023, Apr. 28, 1994, abandoned.

[30] Foreign Application Priority Data

Jun. 24, 1993 [JP] Japan ................................. 5-153705
Nov. 25, 1993 [JP] Japan ................................. 5-295285

[51] Int. Cl.[6] .......................... H01L 29/76; H01L 29/04; H01L 27/01
[52] U.S. Cl. ................ 257/69; 257/67; 257/72; 257/74; 257/351; 257/354
[58] Field of Search ............... 257/66, 67, 69, 257/351, 354, 70, 72, 74

[56] References Cited

U.S. PATENT DOCUMENTS

| | | | |
|---|---|---|---|
| 4,772,927 | 9/1988 | Saito et al. | 257/67 |
| 5,060,036 | 10/1991 | Choi | 257/354 |
| 5,308,998 | 5/1994 | Yamazaki et al. | 257/351 |
| 5,327,001 | 7/1994 | Wakai et al. | 257/354 |
| 5,349,206 | 9/1994 | Kimura | 257/69 |

FOREIGN PATENT DOCUMENTS

| | | | |
|---|---|---|---|
| 55-110069 | 8/1980 | Japan . | |
| 61-183971 | 8/1986 | Japan . | |
| 63-260162 | 10/1988 | Japan | 257/67 |
| 1-235383 | 9/1989 | Japan . | |
| 2-271677 | 11/1990 | Japan | 257/354 |
| 4-21349 | 4/1992 | Japan . | |
| 4-21348 | 4/1992 | Japan . | |
| 4-179272 | 6/1992 | Japan | 257/66 |

OTHER PUBLICATIONS

"Stacked CMOS SRAM Cell", C. E. Chen et al., IEEE Electron Device Letters, vol. EDL-4, No. 8, Aug. 1983, pp. 272-274.

A High Density SRAM Cell Using Poly-Si PMOS FET, T. Yamanaka et al., Electronic Information Communication Institute, Technology Research Report, vol. 89, No. 67, 1989, pp. 1-6.

Primary Examiner—Mahshid Saadat
Attorney, Agent, or Firm—Lowe, Price, LeBlanc & Becker

[57] ABSTRACT

A p-well region is formed in a main surface of a semiconductor substrate. A contact electrode is electrically connected to a predetermined n-type impurity region formed in a surface of the p-well region. A diffusion preventing layer is formed between the contact electrode and a drain region of a TFT. An interconnection layer is formed on the semiconductor substrate with an interlayer insulating film therebetween. A diffusion preventing layer is also formed between the interconnection layer and a source region of the TFT. Diffusion preventing layers are further formed between a channel region of the TFT and the source/drain regions of the TFT.

16 Claims, 47 Drawing Sheets

SEMICONDUCTOR DEVICE HAVING THIN FILM TRANSISTOR WITH DIFFUSION PREVENTING LAYER

This application is a continuation of Application Ser. No. 08/235,023 filed Apr. 28, 1994, now abandoned.

BACKGROUND OF THE INVENTION

1. Field of the Invention

The present invention relates to a semiconductor device having a thin film transistor (which will also be referred to merely as a "TFT") and a method of manufacturing the same. In particular, the present invention relates to a semiconductor device having a TFT which can prevent reduction of a channel length of the TFT and can reduce a contact resistance of a connection between the TFT and an interconnection layer, and also relates to a method of manufacturing the same.

2. Description of the Related Art

As is well known, a static random access memory (which will be referred to merely as an "SRAM" hereinafter) is a kind of a semiconductor device having a TFT. A structure of the conventional SRAM and a method of manufacturing the same will be described below with reference to FIGS. 61–74.

FIG. 61 is an equivalent circuit diagram showing an example of a memory cell of the conventional SRAM. Referring to FIG. 61, a memory cell 150 includes a CMOS flip-flop connected between a power supply Vcc and a ground Vss, bit lines 151 and 152, and NMOS field effect transistors Q5 and Q6 for access which are provided between the CMOS flip-flop and bit lines 151 and 152, respectively.

The flip-flop includes two cross-coupled CMOS inverters. One of the inverters is formed of a PMOS field effect transistor Q1 and an NMOS field effect transistor Q2. The other inverter is formed of a PMOS field effect transistor Q3 and an NMOS field effect transistor Q4. Gate electrodes of the transistors Q5 and Q6 are connected to a word line 153.

FIG. 62 is a plan showing an example of the conventional SRAM. FIG. 63 is a cross section taken along line A—A in FIG. 62. The sectional structure of the SRAM shown in FIG. 63 is disclosed, e.g., in *IEEE Electron Device Letters*, Vol. EDL-4, No. 8, 1983, pp 272–274 and *Electronic Information Communication Institute Technology Research Report.*, Vol. 89, No. 67, 1989, pp 1–6.

Referring to FIGS. 62 and 63, a semiconductor substrate 101 is provided at its main surface with a p-well region 102. Element isolating oxide films 104 are formed in the surface of the p-well region 102. At the vicinity of the lower surface of each element isolating oxide film 104, there is formed a p-type impurity region 103 which functions as a channel stopper.

The p-well region 102 is provided at its surface with n-type low concentration impurity regions 107a and 107b with predetermined spaces therebetween. The p-well region 102 is also provided at its surface with n-type high concentration impurity regions 109a and 109b partially overlapping the n-type low concentration impurity regions 107a and 107b. The p-well region 102 is further provided at its surface with n-type impurity regions 110 and 120 which are located in contact portions between the n-type high concentration impurity regions 109b and interconnection layers located above the same for reducing a contact resistance.

On the surface of the p-well region 102, there are formed gate electrodes 106a and 106b with gate insulating films 105a and 105b therebetween. Side wall insulating films 108a and 108b are formed on side walls of the gate electrodes 106a and 106b, respectively. The n-type impurity region 110 is electrically connected to a drain region 116b of a TFT through a contact electrode 111a formed on the n-type impurity region 110.

The gate electrode 106a is covered with interlayer insulating films 112 (112a and 112b). An interconnection layer 111b which is electrically connected to the power supply Vcc is formed at a predetermined position on the interlayer insulating film 112a.

The contact electrode 111a and interconnection layer 111b contain n-type impurity introduced thereinto because they are connected to the n-type impurity region. A gate electrode 113 of the TFT is formed at a predetermined position on the interlayer insulating film 112b. The gate electrode 113 of the TFT is covered with a gate insulating film 113a. On the gate insulating film 113a, there are formed source/drain regions 116b and 116c of the TFT, between which a channel region 116a of the TFT is formed.

The source/drain regions 116b and 116c of the TFT and the channel region 116a of the TFT are formed in the same layer, e.g., made of polysilicon. The source/drain regions 116b and 116c of the TFT are electrically connected to the interconnection layer 111b and the contact electrode 111a, respectively.

The TFT and gate electrode 106b are covered with an interlayer insulating film 118, which is provided at a predetermined position with a contact hole 119. A barrier metal layer 121 is formed on the interlayer insulating film 118 and the inner surface of the contact hole 119. An aluminum interconnection layer 122 is formed on the barrier metal layer 121. A passivation film (P-SiN film) 123 is formed on the aluminum interconnection layer 122.

In the above structure, a pair of the n-type low concentration impurity regions 107a, a pair of the n-type high concentration impurity regions 109a, the gate insulating film 105a and the gate electrode 106a constitute the N-type MOS transistor. Also, a pair of the n-type low concentration impurity regions 107b, a pair of the n-type high concentration impurity regions 109b, the gate insulating film 105b and the gate electrode 106b constitute the N-type MOS transistor.

The gate electrode 113, gate insulating film 113a, source/drain regions 116b and 116c, and channel region 116a constitute the TFT.

Referring now to FIGS. 64–74, a method of manufacturing the conventional SRAM having the structure described above will be described below. FIGS. 64–74 are fragmentary cross sections showing first to eleventh steps of a process of manufacturing the conventional SRAM having the structure described above.

Referring to FIG. 64, the n-type semiconductor substrate 101 is first prepared. Referring to FIG. 65, the p-well region 102 is formed in the main surface of the semiconductor substrate 101. The element isolating oxide films 104 are formed at predetermined positions in the surface of the p-well region 102. The p-type impurity region 103 which functions as the channel stopper is formed at the vicinity of the lower surface of each element isolating oxide film 104. The gate insulating film 105 is formed on the surface of the p-well region 102.

Referring now to FIG. 66, a polysilicon layer 106 is formed on the gate insulating film 105 by the CVD method or the like. A resist pattern 130 is formed at predetermined positions on the polysilicon layer 106. Using the resist pattern 130 as a mask, the polysilicon layer 106 is etched to form the gate electrodes 106a and 106b, as shown in FIG. 67.

Using the gate electrodes 106a and 106b, n-type impurity is introduced into the main surface of the semiconductor substrate 101, whereby the n-type low concentration impurity regions 107a and 107b are formed. The side wall insulating films 108a and 108b are formed on the side walls of the gate electrodes 106a and 106b, respectively.

Using the gate electrodes 106a and 106 as well as side wall insulating films 108a and 108b as a mask, n-type impurity is introduced into the main surface of the semiconductor substrate 101, whereby the n-type high concentration impurity regions 109a and 109b are formed. Thereby, the adjacent two N-type MOS transistors are completed.

Referring to FIG. 68, the interlayer insulating film 112a is formed entirely on the main surface of the semiconductor substrate 101 by the CVD method or the like. A contact hole is formed at a portion of the interlayer insulating film 112a at which the n-type impurity region 110 is to be formed. n-type impurity is introduced into the main surface of the semiconductor substrate 101 through the contact hole to form the n-type impurity region 110. The contact electrode 111a which is electrically connected to the n-type impurity region 110 is formed on the n-type impurity region 110. Simultaneously with this, the interconnection layer 111b to be electrically connected to the power supply Vcc is formed at the predetermined position on the interlayer insulating film 112a.

Referring to FIG. 69, the interlayer insulating film 112b is formed on the interlayer insulating film 112a. The gate electrode 113 of the TFT is formed at the predetermined position on the interlayer insulating film 112b.

Referring to FIG. 70, the gate insulating film 113a is formed to cover the gate electrode 113. A contact hole 115a is formed in portions of the interlayer insulating film 112b and gate insulating film 113a located above the contact electrode 111a. Simultaneously, a contact hole 115b is formed in portions of the interlayer insulating film 112b and gate insulating film 113a located above the interconnection layer 111b.

Referring to FIG. 71, a polysilicon layer 116 is formed, which extends over the contact electrode 111a and interconnection layer 111b and has a portion located above the gate electrode 113 with the gate insulating film 113a therebetween. The polysilicon layer 116 contains n-type impurity introduced thereinto.

Referring to FIG. 72, a resist pattern 131 is formed on a region of the polysilicon layer 116 in which the channel region 116a is to be formed. Using the resist 131 as a mask, p-type impurity (e.g., $BF_2^+$) is implanted into the polysilicon layer 116 to form the source/drain regions 116b and 116c of the TFT. Thereafter, the resist pattern 131 is removed.

Referring to FIG. 73, the interlayer insulating film 118 is formed entirely on the main surface of the semiconductor substrate 101. The interlayer insulating film 118 is reflowed. The contact hole 119 is formed at a predetermined position in the interlayer insulating film 118. n-type impurity is introduced through the contact hole 119 into the main surface of the semiconductor substrate 101 to form the n-type impurity region 120.

Referring to FIG. 74, the barrier metal layer 121 is formed on the interlayer insulating film 118 and the inner surface of the contact hole 119. The aluminum interconnection layer 122 is formed on the barrier metal layer 121 by the sputtering method. The passivation film (P-SiN) 123 is formed on the aluminum interconnection layer 122. Through the steps described above, the conventional SRAM shown in FIG. 63 is completed.

The conventional SRAM described above, however, has following problems, which will be described below with reference to FIGS. 75–77, which are schematic diagrams showing the problems of the conventional SRAM.

Referring first to FIG. 75, a first problem of the conventional SRAM will be described below. Referring to FIG. 75, two interfaces 125a and 125b exist between the channel region 116a and the source/drain regions 116b and 116c immediately after the formation of the TFT. The interfaces 125a and 125b are spaced by a distance L as shown in FIG. 77. In other words, the TFT has a channel length of L.

However, the interlayer insulating film 118 is formed on this TFT, as shown in FIG. 63. The interlayer insulating film 118 is thermally treated for planarization. During this treatment, the p-type impurity introduced into the source/drain regions 116b and 116c diffuses into the channel region 116a.

As a result, two interfaces 126a and 126b are newly formed between the source/drain regions 116b and 116c and the channel region 116a. A distance L1 between the interfaces 126a and 126b is smaller than the distance L between the interfaces 125a and 125b. Thus, the channel length of the TFT is reduced.

Thereby, the source/drain withstanding voltage of the TFT decreases. This results in a problem that punchthrough is liable to occur in the TFT. If the degree of integration is further improved in the future, such a problem may arise that the channel region 116a may disappear due to the diffusion of impurity described above.

As a measure for overcoming the above problem, conditions for the heat treatment effected on the interlayer insulating film 118 may be modified, for example, by lowering the temperature of the heat treatment and/or reducing a time period for the same. This can suppress the degree of diffusion of the p-type impurity. However, the change of conditions for the heat treatment causes a problem that difference in level in the SRAM cannot be sufficiently reduced.

In order to avoid the above problem relating to reduction of the channel length of the TFT without modifying the conditions for heat treatment, the channel length itself of the TFT may be set in advance to be longer than the desired channel length. However, the channel of the TFT initially having the long length may disadvantageously affect the high integration.

Then, a second problem of the conventional SRAM will be described below with reference to FIGS. 76 and 63. This second problem is caused in a portion corresponding to a connection region H between the source region of the PMOS field effect transistor and the power supply Vcc in FIG. 61.

Referring to FIGS. 76 and 63, the source region 116b of the TFT is connected to the interconnection layer 111b, which is connected to the power supply Vcc and generally contains n-type impurity introduced thereinto.

Meanwhile, the source region 116b of the TFT contains p-type impurity introduced thereinto. Therefore, if the power supply Vcc, e.g., of 5 V is used, a positive potential (5 V) is applied at a connection portion between the source region 116b of the TFT and the interconnection layer 111b, and the interconnection layer 111b containing the n-type impurity introduced thereinto receives the same. Thus, reverse bias is applied to a pn junction portion formed between the source region 116b of the TFT and the interconnection layer 111b. Consequently, the junction portion has a large resistance. As a result, such a problem is caused that characteristics of SRAM, e.g., relating to an operation speed are adversely affected.

A third problem of the conventional SRAM will be described below with reference to FIGS. 77 and 63. The contact electrode 111a is electrically connected to the drain region 116c of the TFT as shown in FIGS. 77 and 63.

It is preferable, in general, that a thickness of the semiconductor layer in which the source/drain regions 116b and 116c and channel region 116a of the TFT are formed is thin by the following reason. As is well known, a leak current flows through the TFT during standby of SRAM (i.e., in a data holding state) even if the TFT is off.

In order to suppress the amount of leak current, several measures are employed such as reduction of a thickness of the semiconductor layer in which the channel region is formed. Thereby, a sectional area of the portion of the semiconductor layer forming the channel region can be small. As a result, the amount of leak current flowing through the channel region can be reduced.

By the above reason, it has been considered that, in the TFT, it is preferable to reduce the thickness of the semiconductor layer in which the channel region 116a and source/drain regions 116b and 116c are formed.

As described above, the following problem is caused by the reduction of thickness of the semiconductor layer including the source/drain regions 116b and 116c of the TFT.

Referring to FIG. 77 again, the p-type impurity is introduced into the source/drain regions 116b and 116c of the TFT, as described before. However, since the source/drain regions 116b and 116c of the TFT are formed in the thin layer, the p-type impurity such as $BF_2$ is liable to be introduced into a portion, i.e., contact electrode 111a in this case, which is located under the drain region 116c during introduction of the p-type impurity. The same is true with respect to the junction portion between the source region 116b of the TFT and the interconnection layer 111b.

Simultaneously, the n-type impurity is introduced into the contact electrode 111a, as described before. Therefore, there is high possibility that an interface of pn junction is formed in the contact electrode 111a due to the fact that the p-type impurity penetrates the drain region of the TFT and is introduced into the contact electrode 111a.

If the polysilicon layer containing the n-type impurity introduced thereinto is in contact with the polysilicon layer containing the p-type impurity introduced thereinto, a smaller resistance is obtained in the case where the pn junction is formed at the interface (contact surface) between the two polysilicon layers, compared with the case where the pn junction is formed in one of the polysilicon layers. The is due to the fact that a substantial contact area of the contact surface between the two polysilicon layers is relatively small.

Therefore, the resistance becomes large due to the formation of an interface 124 of pn junction in the contact electrode 111a, compared with the case where the pn junction is formed at the interface between the contact electrode 111a and drain region 116c. This results in the problem that the performance of the TFT is adversely affected.

SUMMARY OF THE INVENTION

Accordingly, it is an object of the invention to provide a semiconductor device having a TFT and a method of manufacturing the same, overcoming the above-noted problems, in which reduction of a channel length of the TFT is prevented, and thereby a source/drain withstanding voltage of the TFT is improved.

Another object of the invention is to provide a semiconductor device having a TFT and a method of manufacturing the same, in which reduction of a channel length of the TFT is effectively prevented, and thereby high integration thereof is easily allowed.

Still another object of the invention is to provide a semiconductor device having a TFT and a method of manufacturing the same, in which diffusion of impurity is prevented at junction portions between source/drain regions of the TFT and another interconnection layers, and thereby resistances of contact portions between the source/drain regions and the interconnection layers are reduced, resulting in a high performance of the TFT.

A further object of the invention is to provide a semiconductor device having a TFT and a method of manufacturing the same, in which impurity used for forming source/drain regions of the TFT is prevented from reaching interconnection layers electrically connected to the source/drain regions of the TFT, and thereby the TFT has a high performance.

A thin film transistor according to the invention includes source/drain regions formed in a thin semiconductor layer, which is formed on a semiconductor substrate with an insulating film therebetween, containing impurity of a first conductivity type and defining a channel region, and also includes a gate electrode formed at a position opposed to the channel region with a gate insulating film therebetween. An impurity diffusion preventing layer for preventing diffusion of the impurity of the first conductivity type from the source/drain regions into the channel region is formed at least on one of interfaces between the channel region and the source/drain regions.

According to the thin film transistor of the invention, the impurity diffusion preventing layer is formed at least on one of the interfaces between the channel region and the source/drain regions. Thereby, it is possible to prevent diffusion of the impurity of the first conductivity type from the source/drain regions to the channel region. As a result, reduction of the channel length of the thin film transistor can be prevented.

In accordance with one aspect, the semiconductor device having a thin film transistor in accordance with the present invention has a thin film transistor and a MOS transistor. The thin film transistor has a pair of first impurity regions of a first conductivity type formed in a thin semiconductor layer formed on the main surface of a semiconductor substrate with an insulating film posed therebetween to define a first channel region, and a first gate electrode formed at a position opposite to the first channel region with a gate insulating film posed therebetween. The MOS transistor has a pair of second impurity regions of a second conductivity type formed to define a second channel region on the main surface of the semiconductor substrate, one of which is connected to one of the first impurity regions, and a second gate electrode formed on the second channel region with a gate insulating film posed therebetween. Between the first channel region and the first impurity region, an impurity diffusion preventing layer is formed in order to let a current flow to the thin film transistor when the thin film transistor is on, which current is higher than a leak current flowing in the MOS transistor in the off state of the MOS transistor and larger than a leak current flowing in the thin film transistor when the thin film transistor is off.

As described above, in the semiconductor device having the thin film transistor in accordance with the present invention, in one aspect, an impurity diffusion preventing layer is formed between the first channel region and the first impurity region. Consequently, short channeling of the thin film transistor can be effectively prevented. As a result, when the thin film transistor is on, a current which is not lower than the leak current flowing in the MOS transistor when it is off and larger than the leak current flowing in the thin film transistor when this thin film transistor is off, can flow in the thin film transistor. Consequently, data holding characteristic can be improved, and hence reliability of the semiconductor device having the thin film transistor can be improved.

A semiconductor device having a thin film transistor according to another aspect of the invention includes a first conductive layer formed in a thin semiconductor layer, which is formed on a semiconductor substrate with an insulating film therebetween, containing impurity of a first conductivity type and forming source/drain regions of the thin film transistor, a second conductive layer formed on the semiconductor substrate, being electrically connected to the first conductive layer and containing impurity of a second conductivity type, and an impurity diffusion preventing layer formed in an interface between the first conductive layer and the second conductive layer for preventing diffusion of impurity.

According to the semiconductor device having the thin film transistor according to the above aspect of the invention, the impurity diffusion preventing layer is formed in the interface between the first conductive layer of the first conductivity type and the second conductive layer of the second conductivity type. This can prevent formation of pn junction in the interface between the first and second conductive layers. Thereby, it is possible to reduce a resistance at a junction portion of the first conductive layer and the second conductive layer of which conductivity type is different from that of the first conductive layer.

In accordance with another aspect, the semiconductor device having the thin film transistor in accordance with the present invention includes a pair of first impurity regions of a first conductivity type formed in a thin semiconductor layer formed on the main surface of the semiconductor substrate with an insulating film posed therebetween to define a first channel region, a first gate electrode formed at a position opposite to the first channel region with a gate insulating film posed therebetween, a conductive layer of a second conductivity type formed on the main surface of the semiconductor substrate and electrically connected to one of the first impurity regions, an impurity diffusion preventing layer formed between one of the first impurity regions and the conductive layer, a pair of second impurity regions of the second conductivity type formed to define a second channel region on the main surface of the semiconductor substrate and one of which is connected to the conductive layer, and a second gate electrode formed on the second channel region with a gate insulating film posed therebetween.

A semiconductor device having a thin film transistor according to still another aspect of the invention includes a first conductive layer formed in a thin semiconductor layer, which is formed on a semiconductor substrate with an insulating film therebetween, containing impurity of a first conductivity type and forming source/drain regions of a thin film transistor, a second conductive layer formed on the semiconductor substrate, being electrically connected to the first conductive layer and containing impurity of a second conductivity type, and a connection conductive layer formed between the first and second conductive layers and containing impurity of the first conductivity type. A concentration of the impurity of the first conductivity type contained in the connection conductive layer is lower than that of the impurity of the first conductivity type contained in the first conductive layer.

According to the semiconductor device having the thin film transistor of the above aspect of the invention, the connection conductive layer containing the impurity of the first conductivity type is formed between the first and second conductive layers. Owing to the provision of the connection conductive layer, it is possible to effectively avoid such a situation that the impurity of the first conductivity type introduced into the source/drain regions penetrates the source/drain regions and reaches the second conductive layer even if the thickness of the source/drain regions of the thin film transistor is reduced.

More specifically, owing to the provision of the connection conductive layer, it is possible to maintain the impurity of the first conductivity type within the connection conductive layer even if the impurity of the first conductivity type penetrates the source/drain regions. As a result, the impurity of the first conductivity type can be effectively prevented from being introduced into the second conductive layer even if the thickness of the source/drain regions is reduced. Thereby, formation of pn junction in the second conductive layer can be effectively prevented.

Further, the concentration of the impurity of the first conductivity type contained in the connection conductive layer is adjusted to be lower than the concentration of the impurity of the first conductivity type contained in the first conductive layer. Thereby, degree of diffusion of the impurity can be suppressed at the interface between the connection conductive layer and the second conductive layer, compared with the prior art.

In accordance with a still another aspect, the semiconductor device having the thin film transistor in accordance with the present invention includes a pair of first impurity regions of a first conductivity type formed in a thin semiconductor layer formed on the main surface of a semiconductor substrate with an insulating film posed therebetween to define a first channel region, a first gate electrode formed at a position opposite to the first channel region with a gate insulating film posed therebetween, and conductive layer of a second conductivity type formed on the main surface of the semiconductor substrate and electrically connected to one of the first impurity regions, a connection conductive layer formed between one of the first impurity regions and the conductive layer and including an impurity of the first conductivity type, a pair of second impurity regions of the second conductivity type formed on the main surface of the semiconductor substrate to define a second channel region and one of which is connected to the connection conductive layer, and a second gate electrode formed on the second channel region with a gate insulating film posed therebetween. The impurity concentration of the first conductivity type included in the connection conductive layer is lower than the concentration of the first conductivity type included in the first impurity regions.

In a method of manufacturing a thin film transistor according to an aspect of the invention, a first semiconductor layer, which contains impurity of a first conductivity type and forms source/drain regions defining a channel region of the thin film transistor, is first formed on an insulating film formed on a semiconductor substrate. Then, a portion of the first semiconductor layer corresponding to the channel region is removed to form first and second end surfaces in the first semiconductor layer. Impurity diffusion preventing layers for preventing diffusion of impurity are formed on the first and second end surfaces. A second semiconductor layer which contains impurity of a second conductivity type and forms the channel region of the thin film transistor is formed between the impurity diffusion preventing layers formed on the first and second end surfaces. A gate electrode is formed at a position opposed to the channel region of the thin film transistor with a gate insulating film therebetween.

In the method of manufacturing the thin film transistor according to the above aspect, the portion of the first semiconductor layer corresponding to the channel region is removed, and the impurity diffusion preventing layers are formed on the first and second end surfaces which are formed in the first semiconductor layer by the above removal. The channel region of the thin film transistor is formed between the impurity diffusion preventing layers formed on the first and second end surfaces. Thereby, it is possible to form the impurity diffusion preventing layers at the interfaces between the channel region and the source/drain regions of the thin film transistor.

In a method of manufacturing a thin film transistor according to another aspect of the invention, a gate electrode of the thin film transistor is formed on an insulating film formed on a semiconductor substrate. A first semiconductor layer of a second conductivity type which forms a channel region of the thin film transistor is formed at a position opposed to the gate electrode with a gate insulating film therebetween. An impurity diffusion preventing layer for preventing diffusion of impurity is formed on a surface of the first semiconductor layer. A second semiconductor layer of a first conductivity type is formed on a surface of the impurity diffusion preventing layer. The second semiconductor layer is divided at a position above the surface of the impurity diffusion preventing layer to form source/drain regions of the thin film transistor.

According to the method of manufacturing the thin film transistor of the above aspect, the channel region of the thin film transistor is covered with the impurity diffusion preventing layer, which is covered with the second semiconductor layer. The second semiconductor layer is divided in a channel length direction at the predetermined position above the impurity diffusion preventing layer to form the source/drain regions of the thin film transistor. Thereby, impurity diffusion preventing layers can be formed at interfaces between the source/drain regions and the channel region of the thin film transistor.

According to a still further aspect, in the method of manufacturing a thin film transistor in accordance with the present invention, a semiconductor layer of a first conductivity type in which the channel region and the source/drain regions of the thin film transistor are to be formed, is formed on the semiconductor substrate with an insulating film posed therebetween. In the semiconductor layer, interface regions between the channel region and the source/drain regions are exposed. An impurity diffusion preventing layer is formed at this interface region. By introducing impurity of the second conductivity type to a predetermined region of the semiconductor layer, the source/drain regions of the thin film transistor are formed. A gate electrode is formed at a position opposite to the channel region of the thin film transistor, with a gate insulating film posed therebetween.

In accordance with a still another aspect, in the method of manufacturing a thin film transistor in accordance with the present invention, the impurity diffusion preventing layer can be formed at the interface between the channel region and the source/drain regions in the semiconductor layer, without patterning the semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments according to the invention will be described below with reference to FIGS. 1–58.

(First Embodiment)

Figure 2:
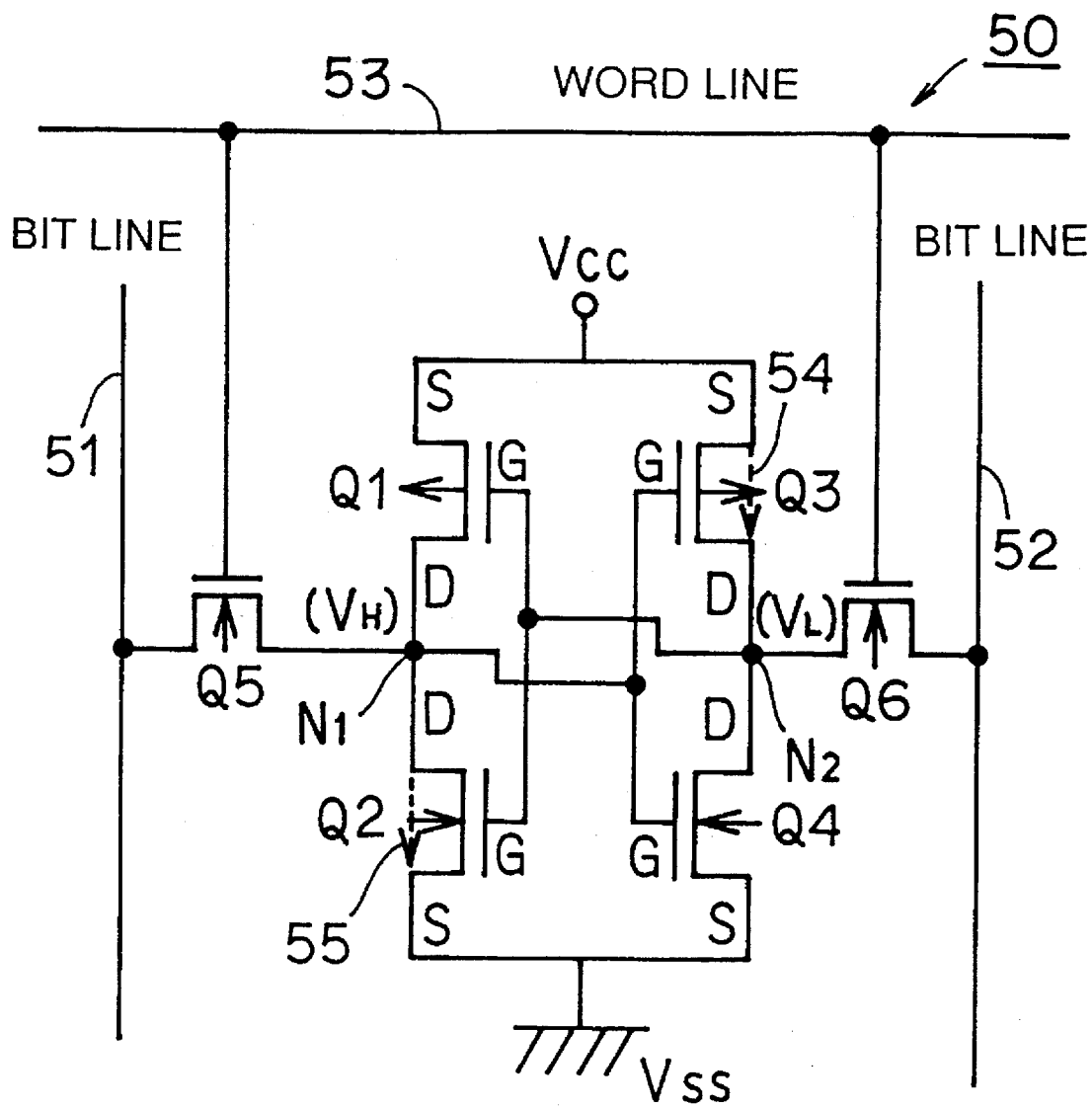
FIG. 2 is an equivalent circuit diagram showing a semicondcutor device having a TFT of a first embodiment of the invention.
Figure 3:
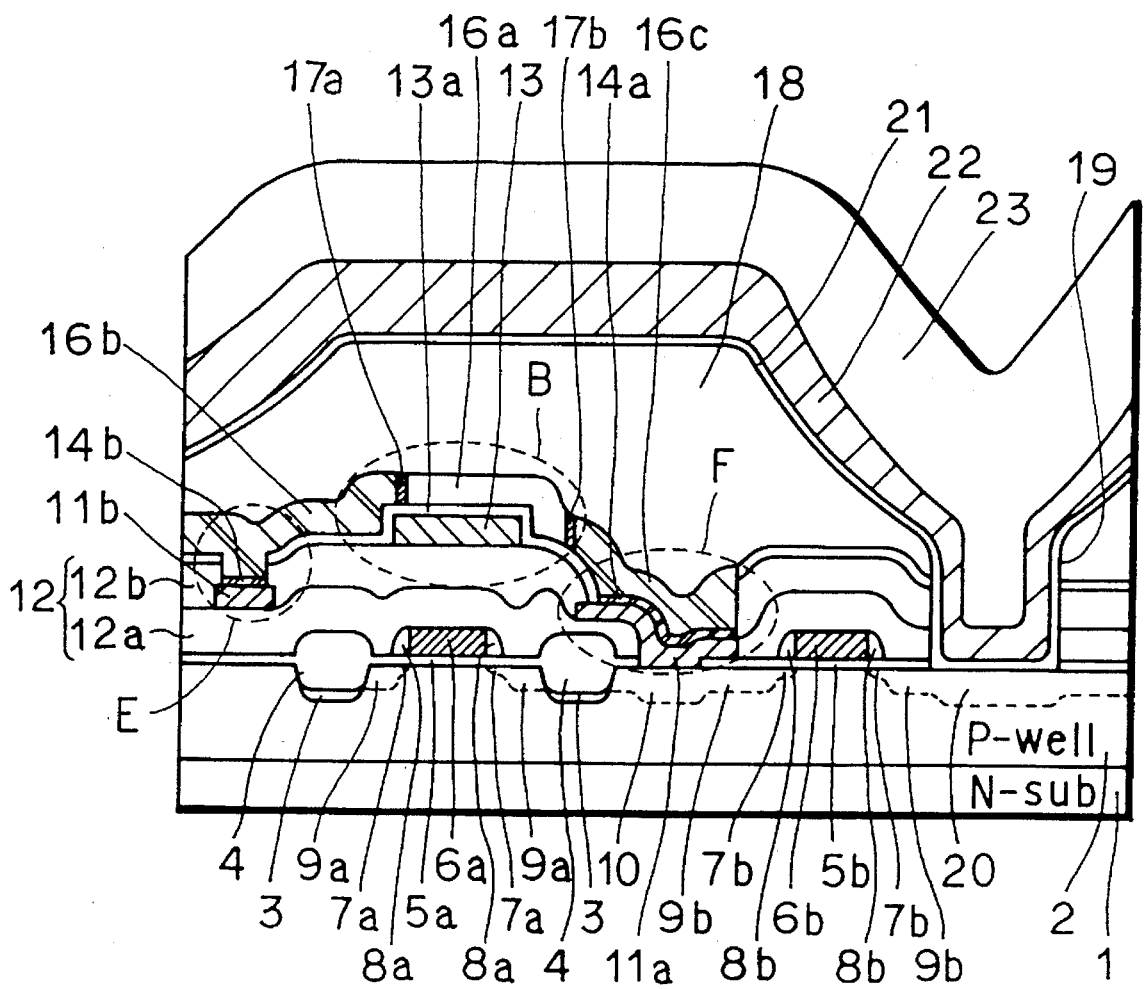
FIG. 3 is a cross section taken along line III—III in FIG. 1.
Figure 8:
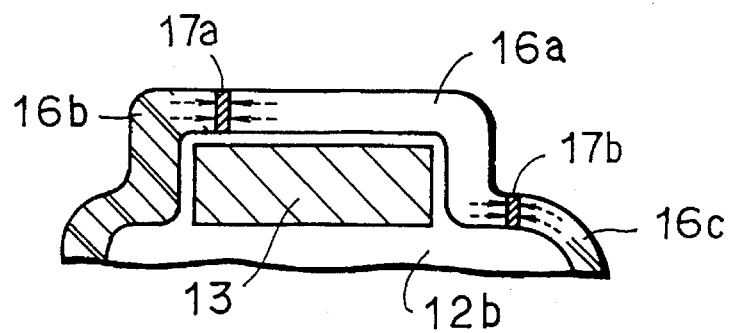
FIG. 8 is a schematic cross section showing a distinctive operation according to the invention.
Figure 9A:
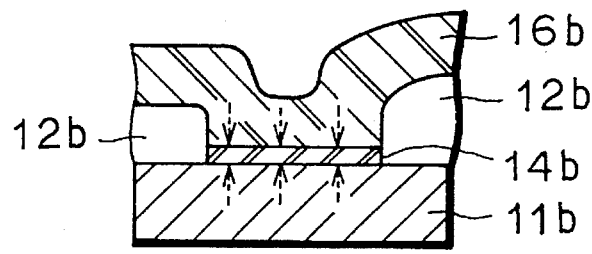
FIG. 9A is a schematic cross section showing an operation when an impurity diffusion preventing layer is formed in an interface between an interconnection layer and a source region of a TFT.
Figure 9B:
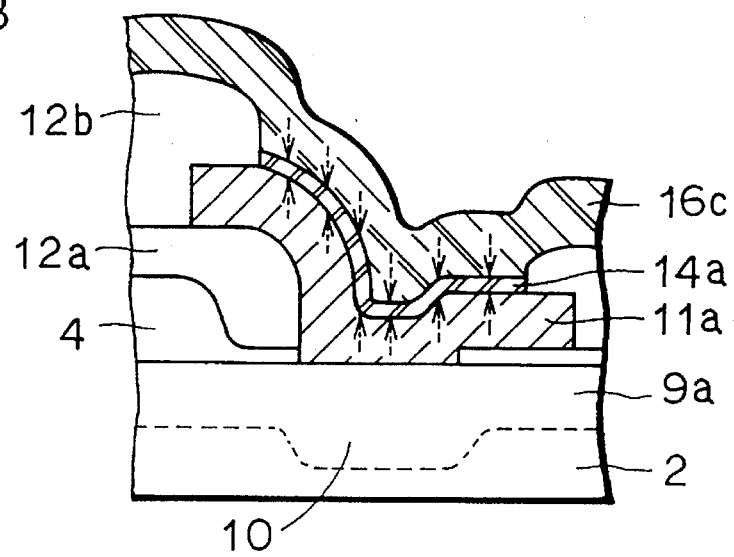
FIG. 9B is a schematic cross section showing an operation when an impurity diffusion preventing layer is formed in an interface between a contact electrode and a drain region of a TFT.

A semiconductor device having a TFT of a first embodiment of the invention will be described below with reference to FIGS. 1, 2, 7 and 8. FIG. 1 is a plan showing the semiconductor device having the TFT of the first embodiment of the invention. FIG. 3 is a cross section taken along line II—II in FIG. 1. FIGS. 8, 9A and 9B are schematic cross sections showing distinctive operations of the semiconductor device having the TFT according to the invention. Particularly, FIG. 8 shows a portion corresponding to a region B in FIG. 3. FIG. 9A shows a portion corresponding to a region E in FIG. 3, and FIG. 9B shows a portion corresponding to a region F in FIG. 3.

Figure 1:
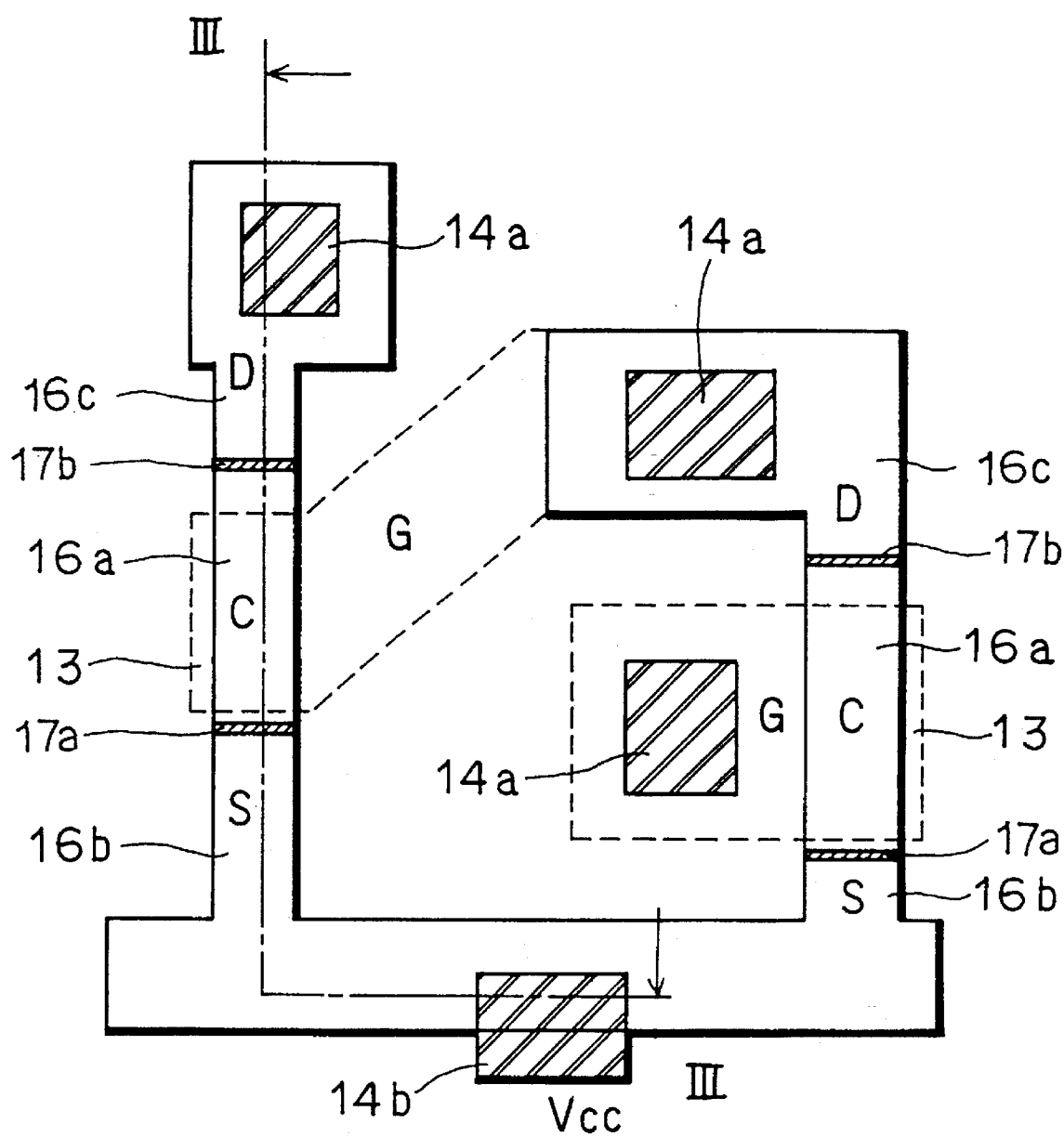
FIG. 1 is a plan showing a semiconductor device having a TFT of a first embodiment of the invention.

Referring to FIGS. 1 and 3, a structure of the semiconductor device having the TFT of the first embodiment of the invention will now be described below.

In FIG. 1, each TFT is provided with source/drain regions 16b and 16c defining a channel region 16a of the TFT. An impurity diffusion preventing layer 17a for preventing diffusion of impurity is formed in an interface between the channel region 16a and the source region 16b. An impurity diffusion preventing layer 17b is formed in an interface between the channel region 16a and the drain region 16c.

The two impurity diffusion preventing layers 17a and 17b thus formed prevent impurity contained in the source/drain regions 16b and 16c from diffusing into the channel region 16a. Thereby, it is possible to effectively prevent reduction of a channel length of the TFT.

The drain region 16c of the TFT is electrically connected to a contact electrode 11a through an impurity diffusion preventing layer 14a. Thereby, it is also possible to prevent diffusion of impurity contained in the drain region 16c of the TFT and the contact electrode 11a. As a result, it is possible to achieve a relatively low value of a resistance of a junction portion between the drain region 16c of the TFT and the contact electrode 11a.

The source region 16b of the TFT is connected through an impurity diffusion preventing layer 14b to an interconnection layer 11b. Thereby, it is possible to prevent diffusion of impurity between the source region 16b of the TFT and the interconnection layer 11b. As a result, it is possible to achieve a relatively small value of a resistance of a junction portion between the source region of the TFT and the interconnection layer 11b.

Preferably, the impurity diffusion preventing layers 14a, 14b, 17a and 17b mentioned above are dielectric films. More preferably, these impurity diffusion preventing layers 14a, 14b, 17a and 17b are silicon nitride films or titanium nitride films. Preferably, the impurity diffusion preventing layers 14a, 14b, 17a and 17b have the thickness of about several to several 10 Å. More preferably, the thickness of impurity diffusion preventing layers 14a, 14b, 17a and 17b is about 30 Å or less.

The feature in operation of the SRAM in accordance with the present embodiment will be described with reference to FIG. 2. FIG. 2 is an equivalent circuit diagram of the SRAM of the present embodiment.

Referring to FIG. 2, a memory cell 50 of the SRAM has bit lines 51 and 52, NMOS transistors Q5 and Q6 for accessing, and a CMOS flipflop. NMOS transistors Q5 and Q6 have their gate electrodes connected to a word line 53. The CMOS flipflop includes PMOS transistors Q1 and Q3 as well as NMOS transistors Q2 and Q4.

In the following, an example in which a high potential $V_H$ is applied to a node N1 and a low potential $V_L$ is applied to a node N2 at the standby state of the memory cell 50 of the SRAM will be described. Referring to FIG. 2, since high potential VH is applied to node N1, NMOS transistor Q4 turns on, while PMOS transistor (TFT) Q3 turns off. Though PMOS transistor Q3 is off, a small amount of leak current 54 flows therein.

In the prior art example, since impurity diffusion preventing layers 17a and 17b are not provided, the channel length of PMOS transistor Q3 may possible be shortened or the channel itself may possibly be lost. As a result, even if it is off, the value of leak current flowing in PMOS transistor Q3 turns to be larger than desired.

By contrast, in accordance with the present embodiment, desired channel length of the PMOS transistor Q3 is ensured by the existence of impurity diffusion preventing layers 17a and 17b. Therefore, the current value when the PMOS transistor Q3 is on surely becomes larger than the leak current when the PMOS transistor Q3 is off. As a result, node N2 is surely kept at the low potential $V_L$ at the standby state.

Meanwhile, since a low potential $V_L$ is applied to the node N2, PMOS transistor (TFT) Q1 is turned on, and NMOS transistor Q2 is turned off. At this time, though it is off, a small amount of leak current 55 flows in NMOS transistor Q2. More specifically, a leak current of about 10 fÅ flows. At this time, the amount of current flowing in PMOS transistor Q1 when it is on is about 100fÅ, which is higher than the value of leak current when the NMOS transistor Q2 is off. Consequently, node N1 is surely kept at the high potential $V_H$ at the standby state. From the foregoing, by the present embodiment, the data holding characteristic of the SRAM can be improved.

Referring now to FIG. 3, a sectional structure of the semiconductor device having the TFT of the first embodiment will be described below in more detail. In FIG. 3, a p-well region 2 is formed in a main surface of an n-type semiconductor substrate 1. n-type low concentration impurity regions 7a and 7b are formed in the surface of the p-well region 2 with spaces between each other. The n-type low concentration impurity regions 7a and 7a as well as 7b and 7b define channel regions of the two NMOS field effect transistors.

The p-well region 2 is also provided at its surface with n-type high concentration impurity regions 9a and 9b partially overlapping the n-type low concentration impurity regions 7a and 7b. The n-type high concentration impurity regions 9a and 9b are provided with contact portions which are in contact with interconnection layers located above the same and have n-type impurity regions 10 and 20 formed therein.

The semiconductor substrate 1 is also provided at predetermined portions in its main surface with element isolating oxide films 4 spaced from each other. A p-type impurity region 3 is formed at the vicinity of a lower surface of each element isolating oxide film 4. Gate electrodes 6a and 6b are formed on the two channel regions defined by the n-type low concentration impurity regions 7a and 7a as well as 7b and 7b with gate insulating films 5a and 5b therebetween, respectively.

Side wall insulating films 8a and 8b are formed on side walls of the gate electrodes 6a and 6b, respectively. The gate electrodes 6a and 6b as the side wall insulating films 8a and 8b are covered with interlayer insulating films 12 (12a and 12b).

A contact electrode 11a is formed on and electrically connected to the n-type impurity region 10. The contact electrode 11a contains n-type impurity introduced thereinto.

An impurity diffusion preventing layer 14a for preventing diffusion of impurity is formed on the contact electrode 11a. The drain region 16c of the TFT is formed on the impurity diffusion preventing layer 14a. An interconnection layer 11b is formed at a predetermined position on the interlayer insulating film 12a. The interconnection layer 11b contains n-type impurity introduced thereinto, and is electrically connected to the power supply Vcc, as described before.

An impurity diffusion preventing layer 14b is formed on the interconnection layer 11b. The source region 16b of the TFT is formed on the impurity diffusion preventing layer 14b and is electrically connected to the interconnection layer 11b through the impurity diffusion preventing layer 14b.

A gate electrode 13 of the TFT is formed at a predetermined region on the interlayer insulating film 12b. The channel region 16a is located at a position which is opposed to the gate electrode 13 of the TFT with a gate insulating film 13a therebetween.

The channel region 16a of the TFT contains n-type impurity introduced thereinto. The source/drain regions 16b and 16c of the TFT contain p-type impurity introduced thereinto. The impurity diffusion preventing layers 17a and 17b are formed at the interfaces between the source/drain regions 16b and 16 of the TFT and the channel region 16a of the TFT, respectively.

In this embodiment, the impurity diffusion preventing layers 17a and 17b are formed at the two interfaces between the source/drain regions 16b and 16c of the TFT and the channel region 16a of the TFT, respectively. However, it is required to form at least one of the impurity diffusion preventing layers 17a and 17b at the corresponding one or both of the interfaces. It is more preferable to provide at least the impurity diffusion preventing layer 17b at the interface between the channel region 16a of the TFT and the drain region 16c of the TFT.

Further, as shown in FIG. 3, the impurity diffusion preventing layer 17b formed at the interface between the channel region 16a and the drain region 16c of the TFT is spaced in the channel length direction from the gate electrode 13 by a distance longer than that between the gate electrode 13 and the impurity diffusion preventing layer 17a formed at the interface between the source region 16b and the channel region 16a of the TFT. This can relieve the concentration of electric field generated at the channel region 16a.

The TFT is covered with an interlayer insulating film 18, which is provided at a portion located above the n-type impurity region 20 with a contact hole 19. A barrier metal layer 21 is formed on the inner surface of the contact hole 19 and the interlayer insulating film 18. An aluminum interconnection layer 22 is formed on the barrier metal layer 21. The aluminum interconnection layer 22 is covered with a passivation film 23.

Distinctive operations of the semiconductor device having the TFT according to the invention will be described below with reference to FIGS. 8, 9A and 9B. Referring first to FIG. 8, the impurity diffusion preventing layers 17a and 17b are formed at the interfaces between the source/drain regions 16b and 16c and the channel region 16a of the TFT. The channel region 16a contains the n-type impurity introduced thereinto. The source/drain regions 16b and 16c contain the p-type impurity introduced thereinto. In spite of this, the impurity diffusion preventing layers 17a and 17b described above prevent diffusion of the impurity between the source/drain regions 16b and 16c and the channel region 16a.

As a result, it is possible to prevent the movement of the interfaces between the source/drain regions 16b and 16c and the channel region 16a toward the channel region 16a, which may be caused in the prior art. Thereby, it is possible to effectively prevent reduction of the channel length of the TFT.

FIG. 9A is an enlarged cross section schematically showing a junction portion between the interconnection layer 11b and the source region 16b of the TFT. FIG. 9B is an enlarged cross section schematically showing a junction portion between the contact electrode 11a and the drain region 16c of the TFT.

Referring first to FIG. 9A, the source region 16b of the TFT contains the p-type impurity introduced thereinto. The interconnection layer 11b contains the n-type impurity introduced thereinto. In spite of this, it is possible to prevent the impurity contained in the respective layers from diffusing into other layers owing to the provision of the impurity diffusion preventing layer 14b at the interface between the source region 16b of the TFT and the interconnection layer 11b.

Particularly, it is possible to prevent the p-type impurity contained in the source region 16b from moving into the n-type interconnection layer 11b. Thereby, the resistance of the junction portion between the source region 16b of the TFT and the interconnection layer 11b can be maintained at a small value.

Further, owing to the existence of the impurity diffusion preventing layer 14b, it is possible to prevent formation of a pn junction at the interface between the source region 16b of the TFT and the interconnection layer 11b. As a result, the resistance of the junction portion between the source region 16b and the interconnection layer 11b can be smaller than that in the case where the pn junction is formed at the interface between the interconnection layer 11b and the source region 16b.

Referring to FIG. 9B, the impurity diffusion preventing layer 14a similar to the above impurity diffusion preventing layer 14b is formed at the interface between the contact gate electrode 11a and the drain region 16c of the TFT. Owing to the provision of the impurity diffusion preventing layer 14a, it is possible to effectively prevent formation of a pn junction at the interface between the drain region 16c of the TFT and the contact electrode 11a, similarly to the above case.

Consequently, the resistance of the junction portion between the drain region 16c and the contact electrode 11a can be lower than that in the prior art. Thereby, it is possible to improve the performance of the TFT.

(Second Embodiment)

A second embodiment of the invention will be described below with reference to FIG. 4, which is a fragmentary cross section showing a semiconductor device having a TFT of the second embodiment of the invention.

Figure 4:
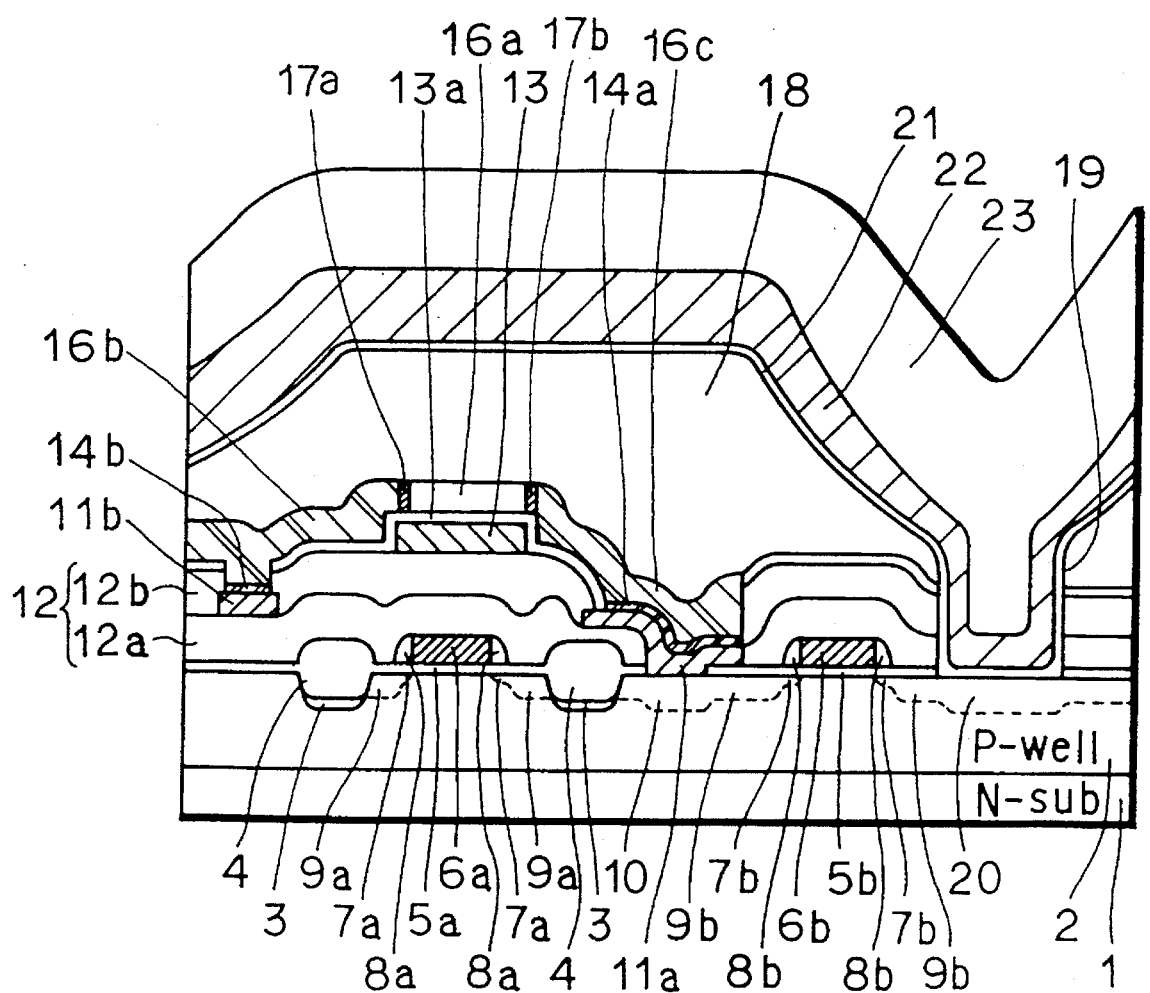
FIGS. 4–6 are fragmentary cross sections showing semiconductor devices having TFTs of second to fourth embodiments of the invention, respectively.

In the semiconductor device having the TFT of the embodiment shown in FIG. 4, the impurity diffusion preventing layer 17b adjacent to the drain region 16c of the TFT is located at a position shifted toward the channel region 16a from the position of the same in the first embodiment. The impurity diffusion preventing layer 17b adjacent to the drain region 16c can be located near the channel region, as is done in this embodiment. In view of concentration of the electric field at and around the drain region 16c, the location in the first embodiment is preferable. However, even the location of the second embodiment can prevent reduction of the channel length of the TFT. Structures of the second embodiment other than those described above are similar to those of the first embodiment. Therefore, an effect similar to that of the first embodiment can be achieved.

(Third Embodiment)

Figure 5:
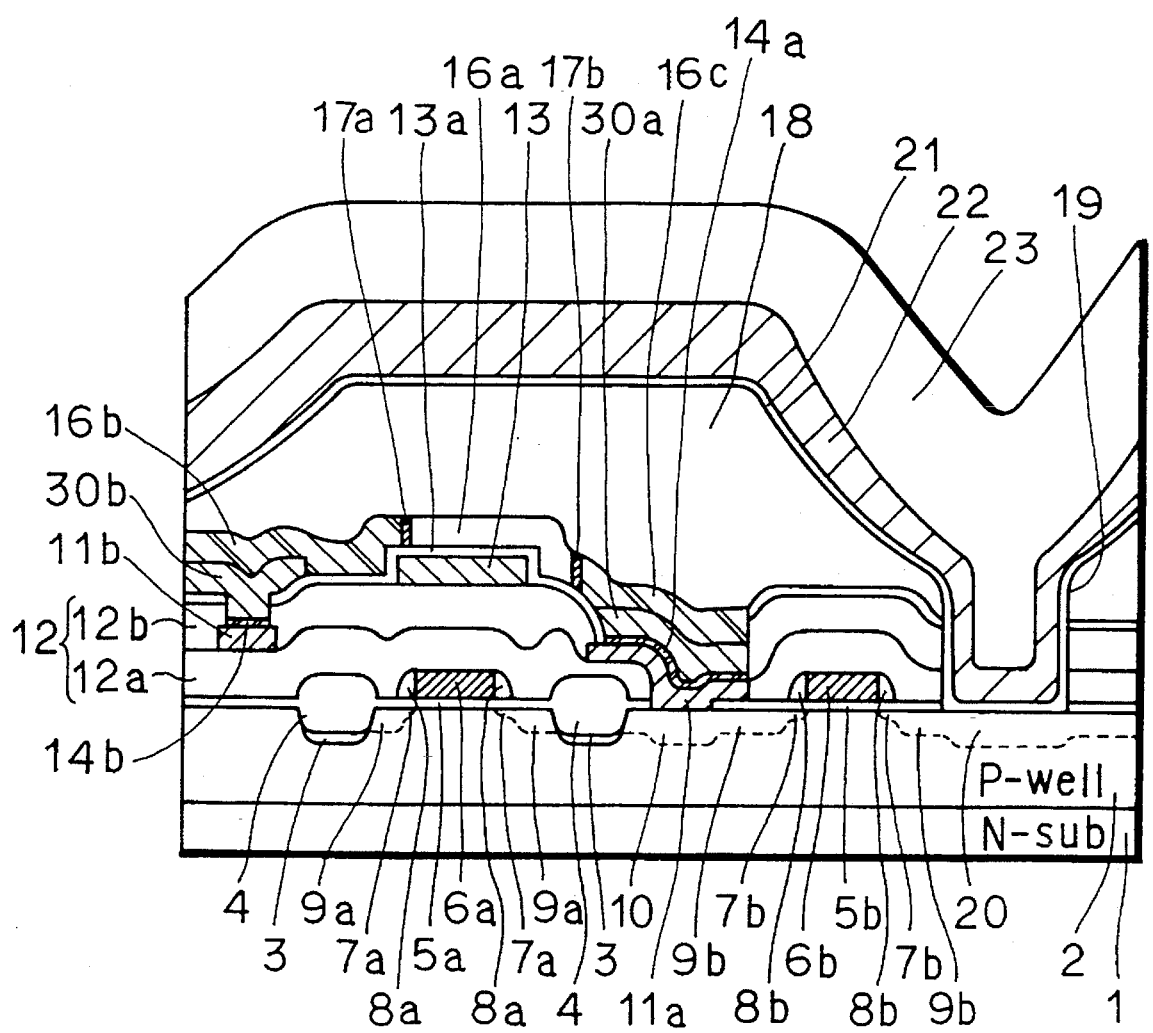

Referring now to FIG. 5, a semiconductor device having a TFT of a third embodiment of the invention will be described below. FIG. 5 is a fragmentary cross section showing the semiconductor device having the TFT of the third embodiment of the invention.

In FIG. 5, the semiconductor device having the TFT of this embodiment includes the structures similar to those of the first embodiment, and additionally includes polysilicon layers 30a and 30b.

The polysilicon layer 30a is formed between the drain region 16c of the TFT and the impurity diffusion preventing layer 14a. The polysilicon layer 30b is formed between the source region 16b of the TFT and the impurity diffusion preventing layer 14b. Structures other than that described above are similar to those of the semiconductor device having the TFT of the first embodiment.

The polysilicon layers 30a and 30b contain p-type impurity introduced thereinto. A concentration of the p-type impurity contained in the polysilicon layers 30a and 30b is preferably lower than that of the p-type impurity contained in the source/drain regions 16b and 16c of the TFT.

Owing to the provision of the polysilicon layers 30a and 30b, it is possible to attain a small thickness of the semiconductor layer in which the source/drain regions 16b and 16c of the TFT are formed. More specifically, even if the p-type impurity penetrates the source/drain regions 16b and 16c of the TFT when the p-type impurity is introduced into the source/drain regions 16b and 16c, the polysilicon layers 30a and 30b can retain the p-type impurity. Therefore, the above small thickness is allowed.

Consequently, even if the semiconductor layer provided with the source/drain regions 16b and 16c of the TFT has the small thickness, the p-type impurity can be prevented from being introduced into the contact electrode 11a and interconnection layer 11b.

Further, owing to the fact that the concentration of p-type impurity contained in the polysilicon layers 30a and 30b is lower than that of the p-type impurity contained in the source/drain regions 16b and 16c of the TFT, the impurity can be diffused at the interfaces defined by the contact electrode 11a and interconnection layers 11b to an extent lower than that in the prior art. Thereby, it is possible to reduce possibility of formation of the pn junctions in the contact electrode 11a and interconnection layer 11b. As a result, the resistances of the junction portions can be smaller than those in the prior art.

Further, in this embodiment, the impurity diffusion preventing layer 14a is formed between the polysilicon layer 30a and the contact electrode 11a, and the impurity diffusion preventing layer 30b is formed between the polysilicon layer 30b and the interconnection layer 11b. Therefore, the resistances of the junctions between them can be smaller than those in the embodiments described before, because it is possible to reduce the possibility that the p-type impurity is introduced into the contact electrode 11a and interconnection layer 11b when the p-type impurity is introduced into the source/drain regions 16b and 6c of the TFT.

(Fourth Embodiment)

A fourth embodiment of the invention will be described below with reference to FIG. 6, which is a fragmentary cross section showing a semiconductor device having a TFT of the fourth embodiment of the invention.

Figure 6:
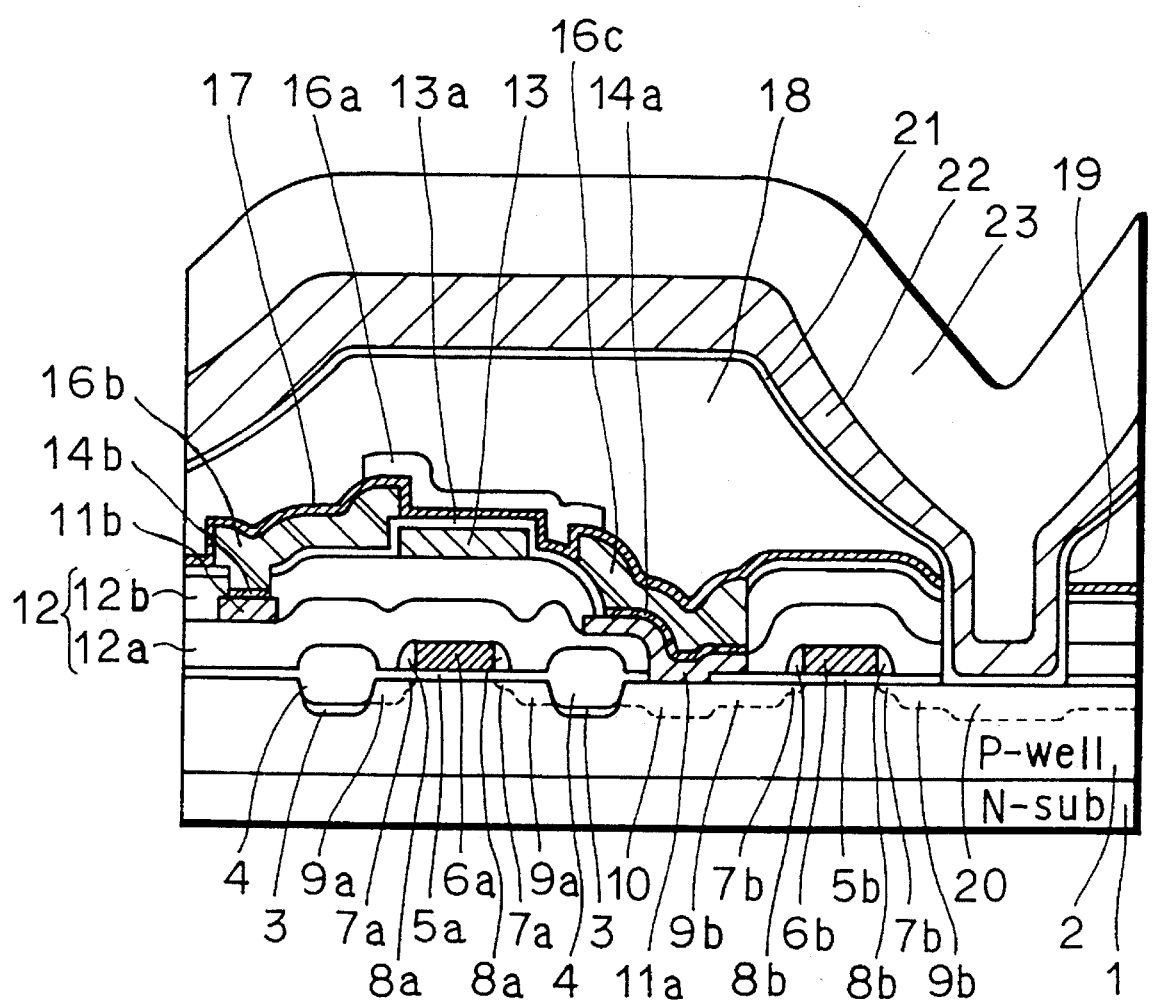

In the embodiment shown in FIG. 6, the channel region 16a of the TFT has ends overlapping with the source/drain regions 16b and 16c of the TFT.

In this embodiment, the impurity diffusion preventing layer 17 extends between the channel region 16a of the TFT and the gate electrode 13 and over the surfaces of the source/drain regions 16a and 16b of the TFT and the interlayer insulating film 12. This achieves a following effect.

It is preferable to introduce hydrogen radicals into the polysilicon layer forming the TFT. In particular, it is preferable to introduce the hydrogen radicals into the interfaces between the source/drain regions and the channel region of the TFT. The hydrogen radicals thus introduced into the polysilicon layer fill up dangling bonds.

In other words, the hydrogen radical is coupled with the silicon in the polysilicon layer. Thereby, the leak current flowing through the grain boundaries can be reduced. By this reason, it is preferable to introduce the hydrogen radicals into the polysilicon layer forming the TFT, and particularly into the interface portions between the channel region and the source/drain regions. In this embodiment, therefore, it is preferable to introduce the hydrogen radicals into the semiconductor layer, which forms the channel region 16a of the TFT, during the formation of the semiconductor layer.

The hydrogen radicals, however, may cause such a problem that the hydrogen radicals deteriorate the life of the gate insulating film of the NMOS transistor provided under the TFT. The hydrogen radicals, therefore, may be harmful to the NMOS transistor formed under the TFT.

In this embodiment, however, the impurity diffusion preventing layer 17 extends under the channel region 16a of the TFT and over the source/drain regions 16b and 16c, as shown in FIG. 6, so that it is possible to prevent the hydrogen radicals from moving into the portion forming the NMOS transistor under the TFT. As a result, the reliability of the semiconductor device having the TFT can be improved.

(Fifth Embodiment)

A semiconductor device having a TFT of a fifth embodiment of the invention will now be described below with reference to FIG. 7, which is a plan showing a TFT part in the fifth embodiment of the invention.

Figure 7:
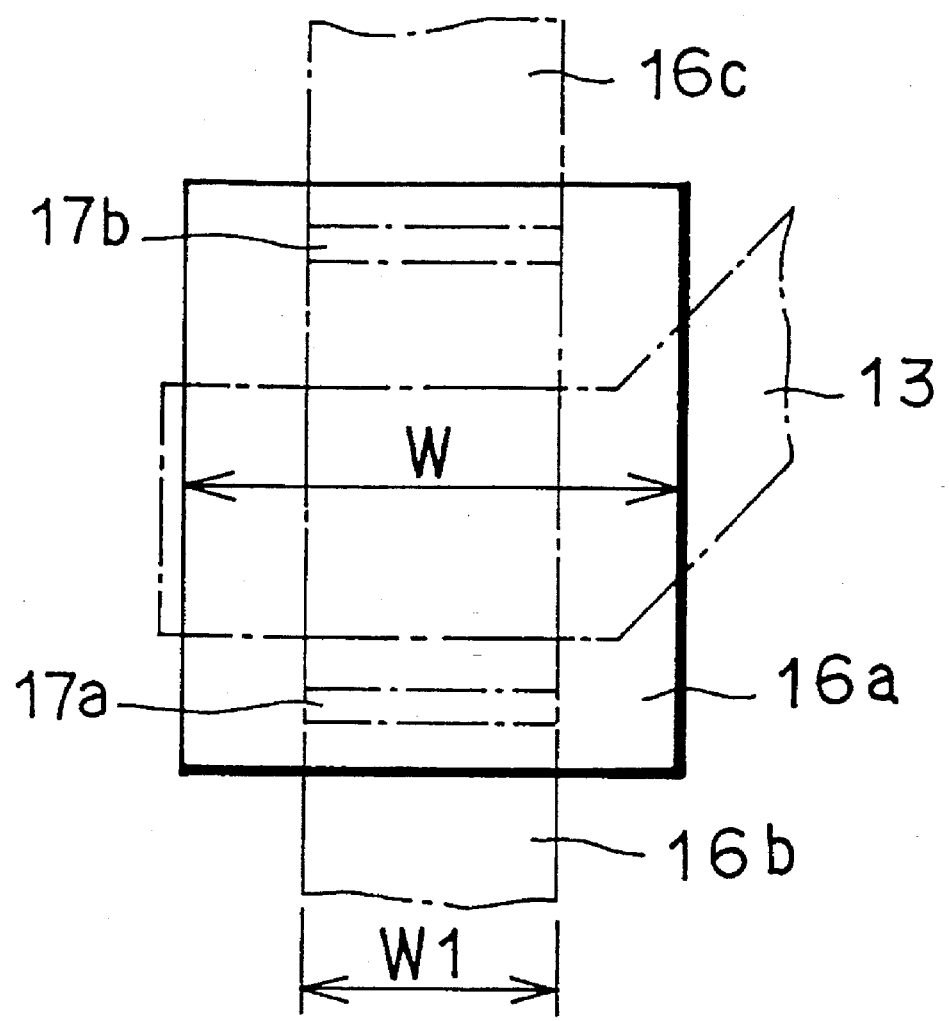
FIG. 7 is a fragmentary enlarged plan showing a TFT of a fifth embodiment of the invention.

Referring to FIG. 7, a length W in a channel width direction of the channel region 16a of the TFT is longer than a length W1 in the channel width direction of the source/drain regions 16b and 16c of the TFT. Thus, a region in which the channel can be form is enlarged. This results in such an advantage in the TFT itself that an intended amount of current can be easily obtained. As a result, the performance of the TFT itself can be improved.

(Sixth Embodiment)

A sixth embodiment of the invention will be described below with reference to FIGS. 10–23. This embodiment will be described below in connection with a method of manufacturing the semiconductor device having the TFT of the fourth embodiment shown in FIG. 6. FIGS. 10–23 are fragmentary cross sections showing 1st to 14th steps of a process of manufacturing the semiconductor device having the TFT of the sixth embodiment.

Figure 10:
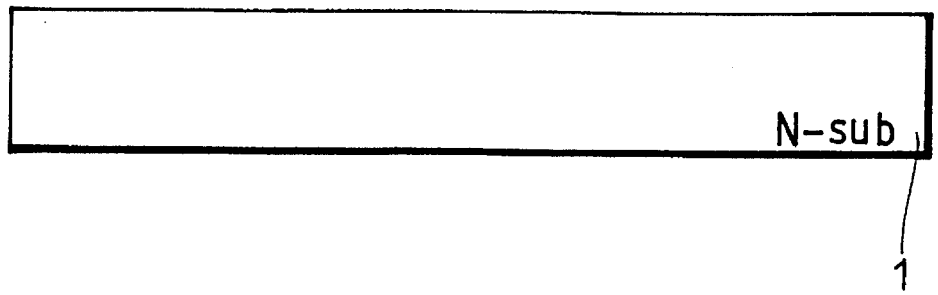
FIGS. 10–23 are fragmentary cross sections showing 1st to 14th steps in a process of manufacturing a semiconductor device having a TFT of a sixth embodiment of the invention, respectively.
Figure 11:
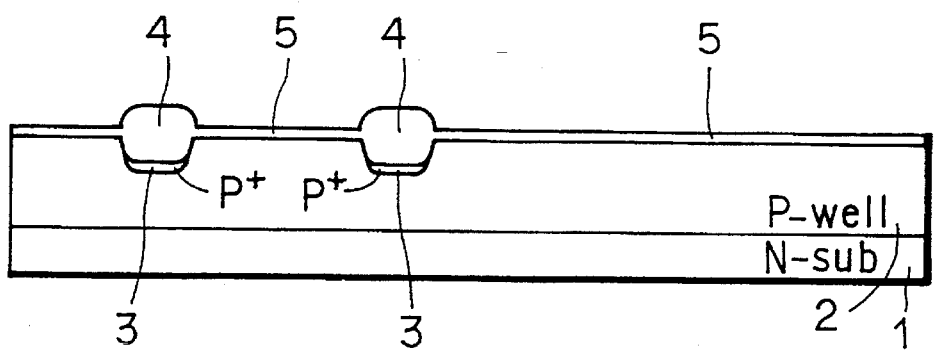

Referring first to FIG. 10, the n-type substrate 1 is prepared. Referring to FIG. 11, the p-well 2 is formed in the main surface of the semiconductor substrate 1. The element isolating oxide films 4 are formed in the surface of the p-well region 2 with a space between each other. Prior to the formation of the element isolating oxide films 4, p-type impurity is implanted into portions in which the element isolating oxide films 4 are to be formed. Thereby, the p-type impurity regions 3 are formed near the lower surfaces of the element isolating oxide films 4 simultaneously with the formation of the element isolating oxide films 4. Then, the gate insulating film 5 is formed on the main surface of the semiconductor substrate 1.

Figure 12:
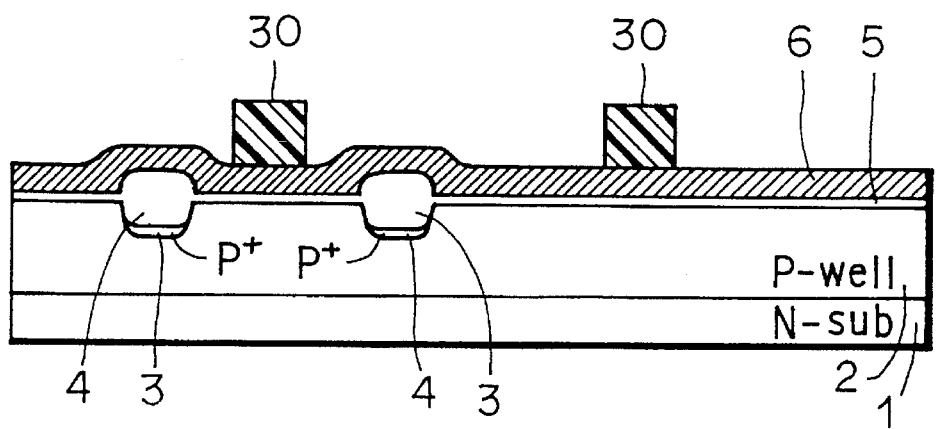

Referring to FIG. 12, the polysilicon layer 6 containing impurity is formed on the gate insulating film 5 by the CVD method or the like. A patterned resist 30 is formed at predetermined positions of the polysilicon layer 6 at which the gate electrodes of the NMOS transistors are to be formed.

Figure 13:
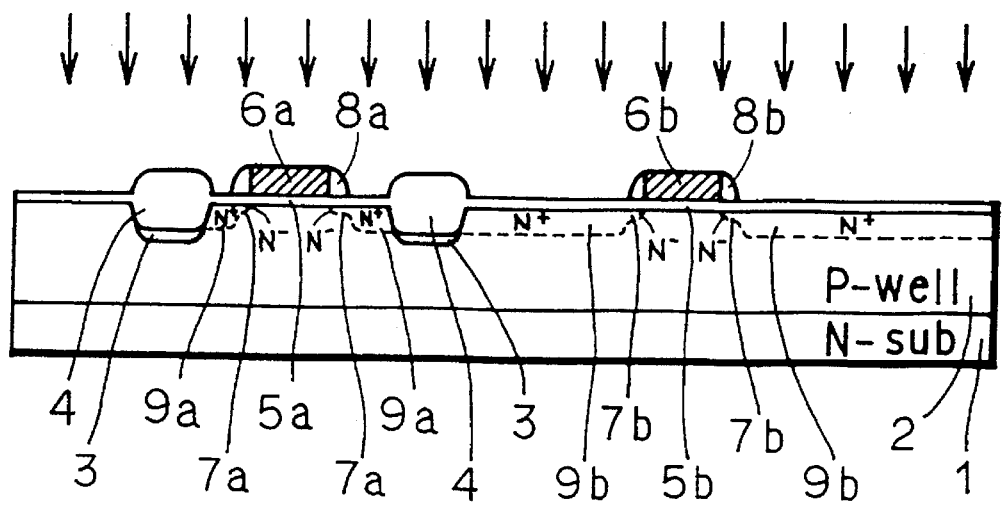

Referring to FIG. 13, etching is effected to form the gate electrodes 6a and 6b of the NMOS field effect transistors using the resist 30 as a mask. Then, using the gate electrodes 6a and 6b as a mask, a predetermined amount of n-type impurity is implanted into the main surface of the semiconductor substrate 1. Thereby, the n-type low concentration impurity regions 7a and 7b are formed.

The side wall insulating films 8a and 8b are formed on the side walls of the gate electrodes 6a and 6b. n-type impurity is introduced into the main surface of the semiconductor substrate 1 using the side wall insulating films 8a and 8b as well as the gate electrodes 6a and 6b as a mask. Thereby, the n-type high concentration impurity regions 9a and 9b are formed.

Figure 14:
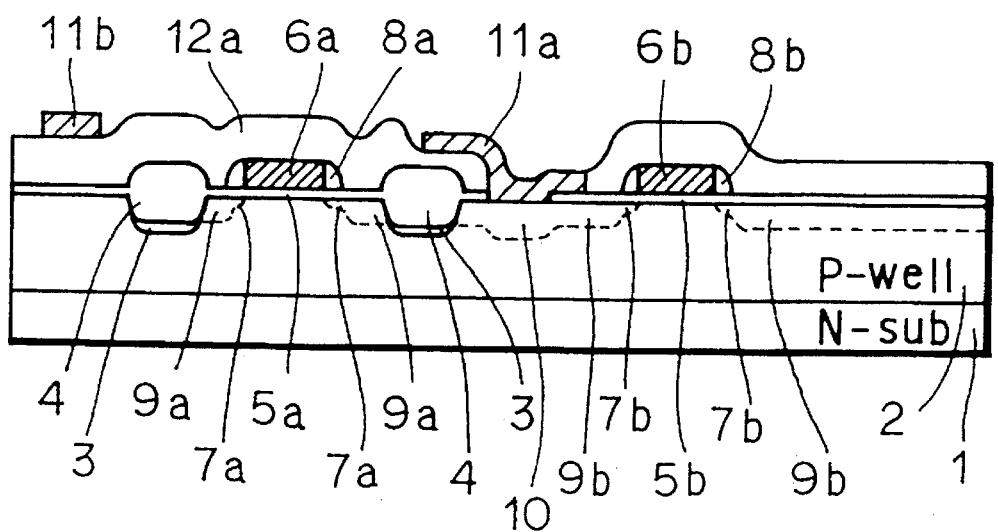

Referring to FIG. 14, the interlayer insulating film 12a is formed on the main surface of the semiconductor substrate 1 by the CVD method or the like. The contact hole is formed at the predetermined position in the interlayer insulating film 12a to expose a predetermined portion of the surface of the n-type high concentration impurity region 9b. n-type impurity is introduced into the main surface of the semiconductor substrate 1 through the contact hole to form the n-type impurity region 10.

A polysilicon layer is deposited on the interlayer insulating film 12a and n-type impurity region 10 by the CVD method or the like. In this depositing step, n-type impurity is introduced into the polysilicon layer. The polysilicon layer thus formed is patterned to form the contact electrode 11a electrically connected to the n-type impurity region 10. Simultaneously with this, the interconnection layer 11b is formed at the predetermined position on the interlayer insulating film 12a.

Figure 15:
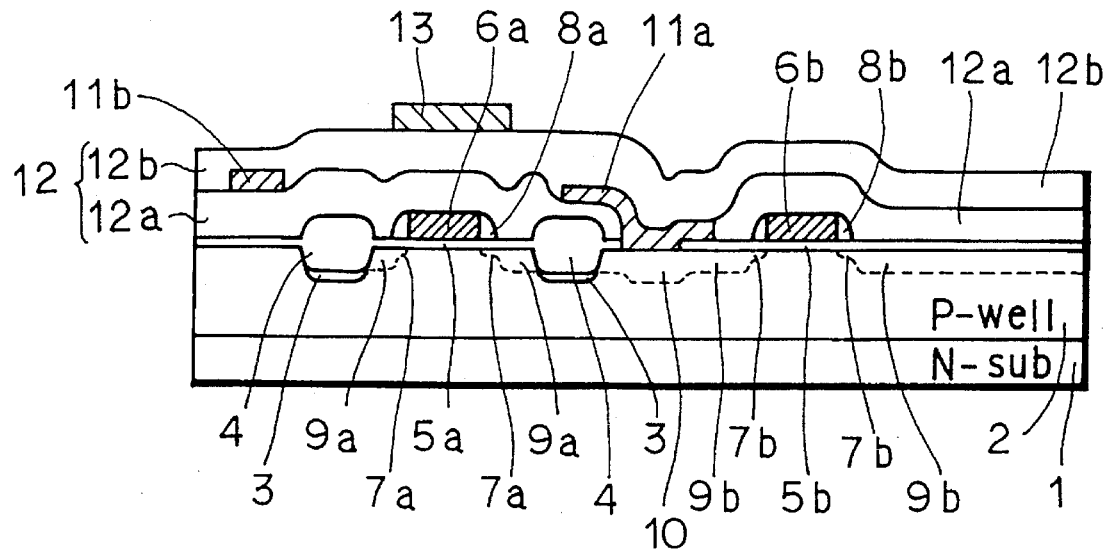

Referring to FIG. 15, the interlayer insulating film 12b covering the interconnection layer 11b and contact electrode 11a are formed by the CVD method or the like. A polysilicon layer containing p-type or n-type impurity is deposited on the interlayer insulating film 12b. The polysilicon layer is patterned into a predetermined configuration to form the gate electrode 13 of the TFT on the interlayer insulating film 12b.

Figure 16:
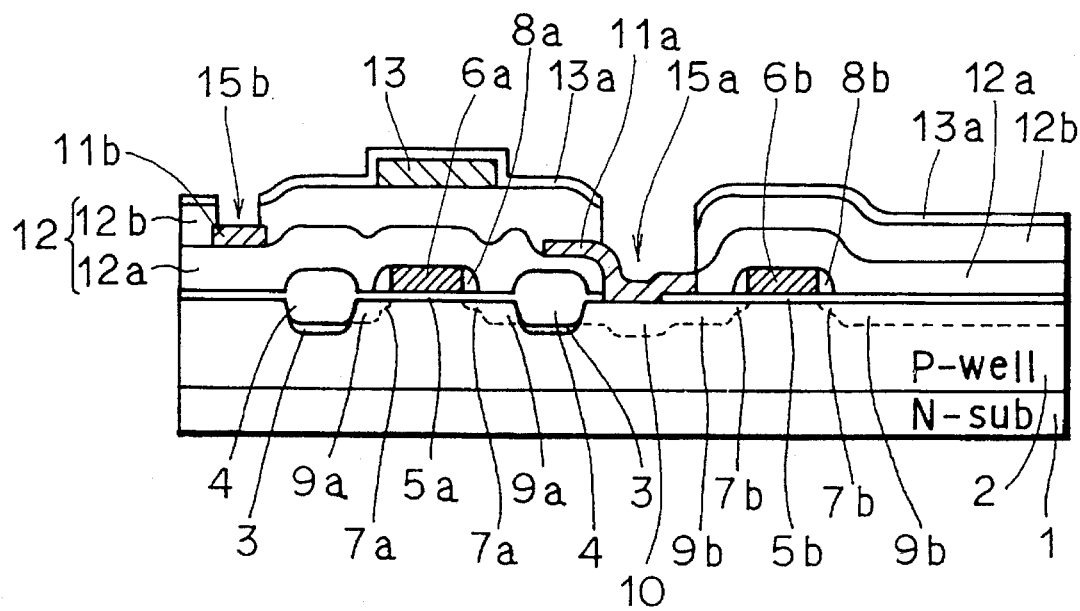

Then, referring to FIG. 16, the gate insulating film 13a of the TFT covering the gate electrode 13 of the TFT is formed by the CVD method or the like. The gate insulating film 13a and interlayer insulating film 12b are etched to remove predetermined portions thereof, whereby the surfaces of the contact electrode 11a and interconnection layers 11b are partially exposed. Thus, the contact holes 15a and 15b are formed.

Figure 17:
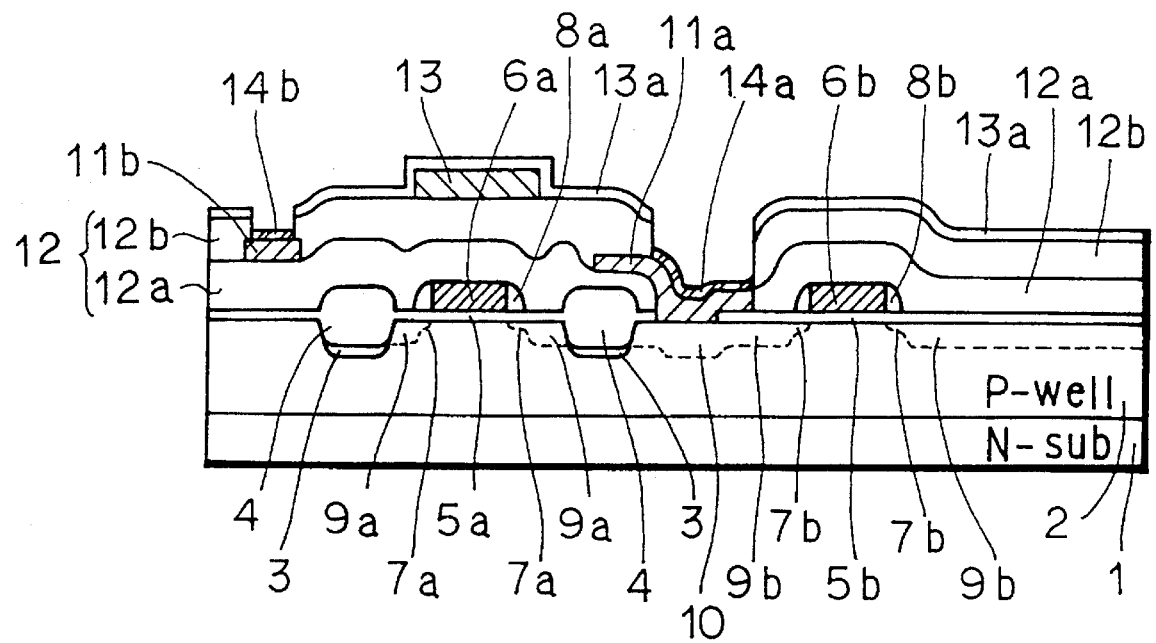
Figure 18:
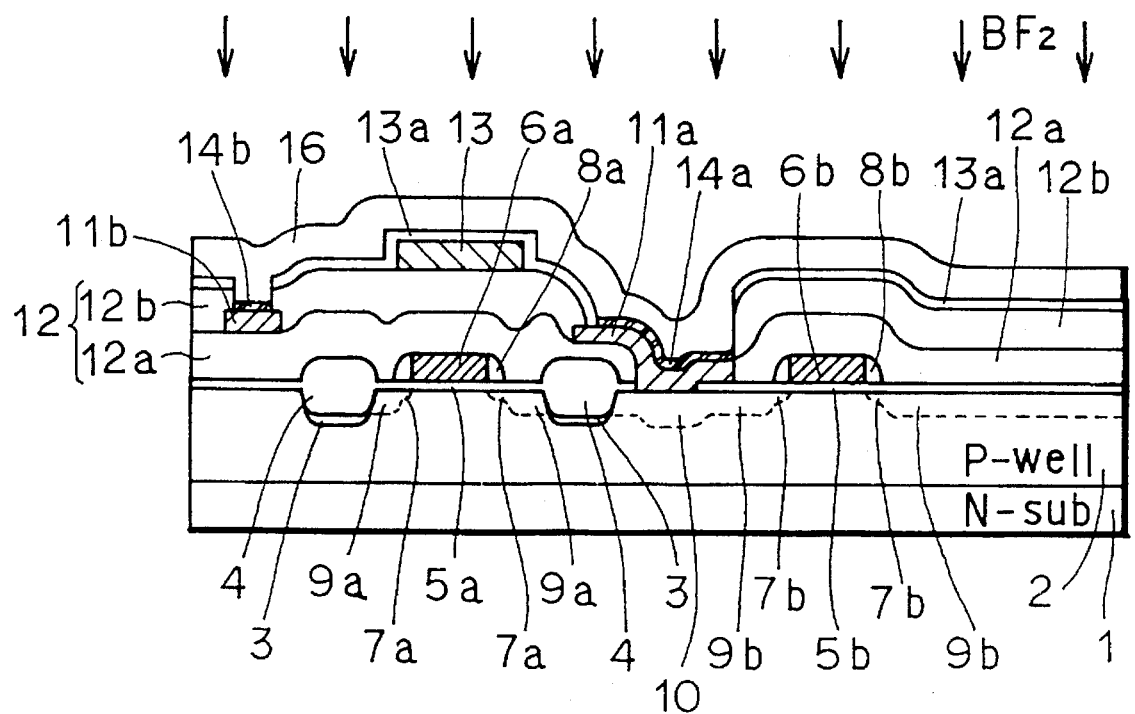

Referring to FIG. 17, a lamp anneal method using ammonia (NH3) gas is executed to form the silicon nitride film having a thickness of several to several ten angstroms. The silicon nitride film will function as the impurity diffusion preventing layers. The silicon nitride film is patterned to form the silicon nitride films (i.e., impurity diffusion preventing layers) 14a and 14b on the contact electrode 11a and interconnection layer 11b.

The impurity diffusion preventing layers 14a and 14b may be formed of titanium nitride films. In this case, a titanium film of about several ten angstroms in thickness is formed on the contact electrode 11a and interconnection layer 11b by the spattering method or the like. The lamp anneal method is effected thereon in nitrogen gas atmosphere to form the titanium nitrogen film on the contact electrode 11a and interconnection layer 11b.

After the formation of the impurity diffusion preventing layers 14a and 14b described above, as shown in FIG. 18, the first polysilicon layer 16 is formed on the impurity diffusion preventing layers 14a and 14b as well as the gate insulating film 13a by the CVD method or the like. A thickness of the first polysilicon layer is preferably in a range from 100 to 400 Å. Then, p-type impurity (e.g., $BF_2$) is implanted into the first polysilicon layer 16.

Figure 19:
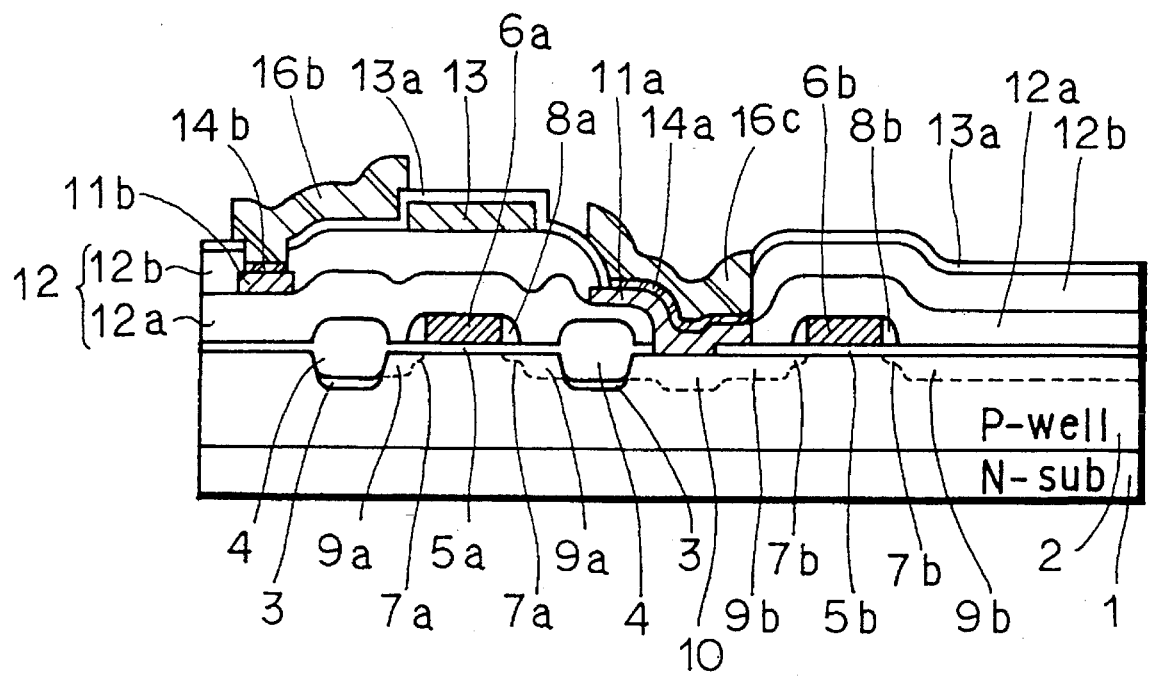

Referring to FIG. 19, the first polysilicon layer 16 into which the p-type impurity was introduced is patterned to remove the portion thereof opposed to the channel region of the TFT which will be formed later. Thereby, the source/drain regions 16b and 16c of the TFT are formed.

Figure 20:
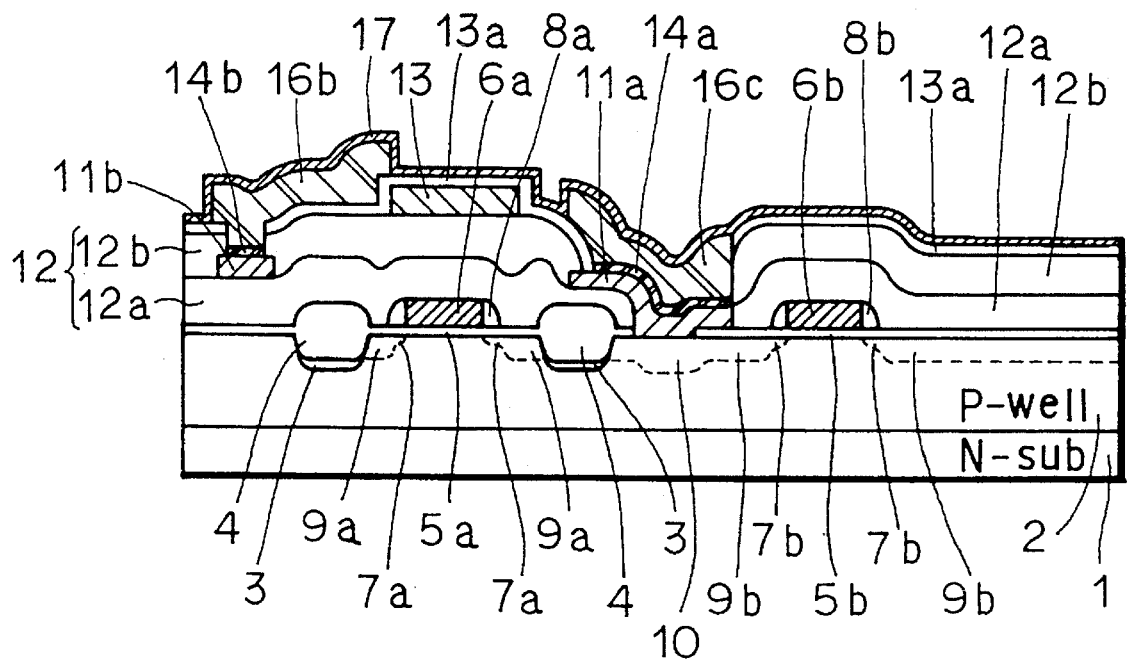

Referring to FIG. 20, the lamp anneal method using $NH_3$ gas is executed to form a silicon nitride film or titanium nitride film on the surfaces of the source/drain regions 16b and 16c of the TFT and the exposed gate insulating film 13 in a manner similar to that described above. Thereby, the impurity diffusion preventing layer 17 is formed.

Figure 21:
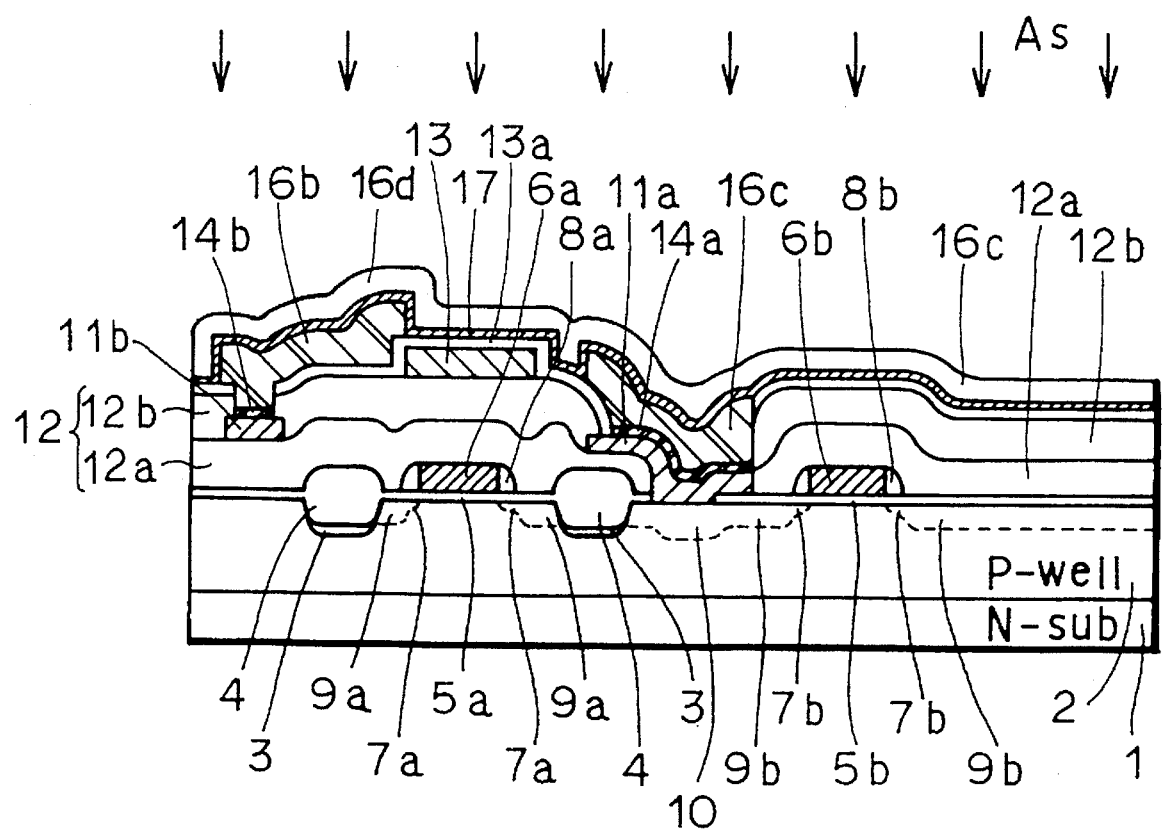

Referring to FIG. 21, the second polysilicon layer 16d is formed on the impurity diffusion preventing layer 17. Hydrogen radicals are introduced into the second polysilicon layer 16. The second polysilicon layer 16d may be an amorphous silicon layer. n-type impurity is introduced into the second polysilicon layer 16d. The implantation dose of the n-type impurity is preferably in a range from about $10^{11}$ to $10^{12}/cm^2$. In this case, arsenic 12, 2 (As) is used as the n-type impurity for implantation.

Figure 22:
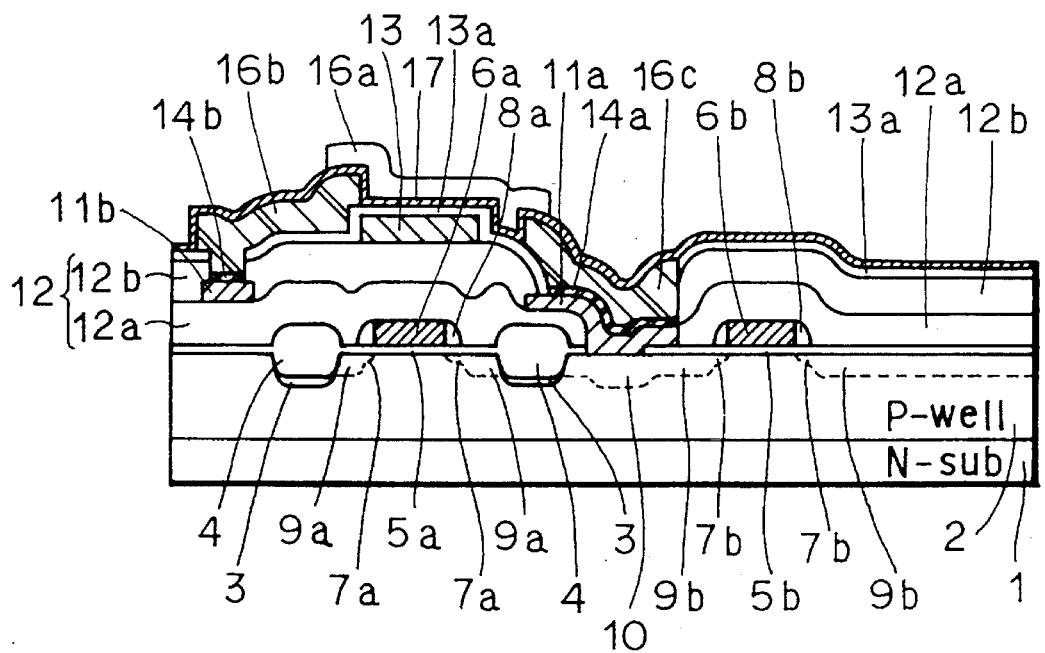

Referring to FIG. 22, the second polysilicon layer 16d is patterned to form the channel region 16a of the TFT, which has ends overlapping with the source/drain regions 16b and 16c of the TFT.

The channel region 16a may be formed without overlapping with the source/drain regions 16b and 16c.

Figure 23:
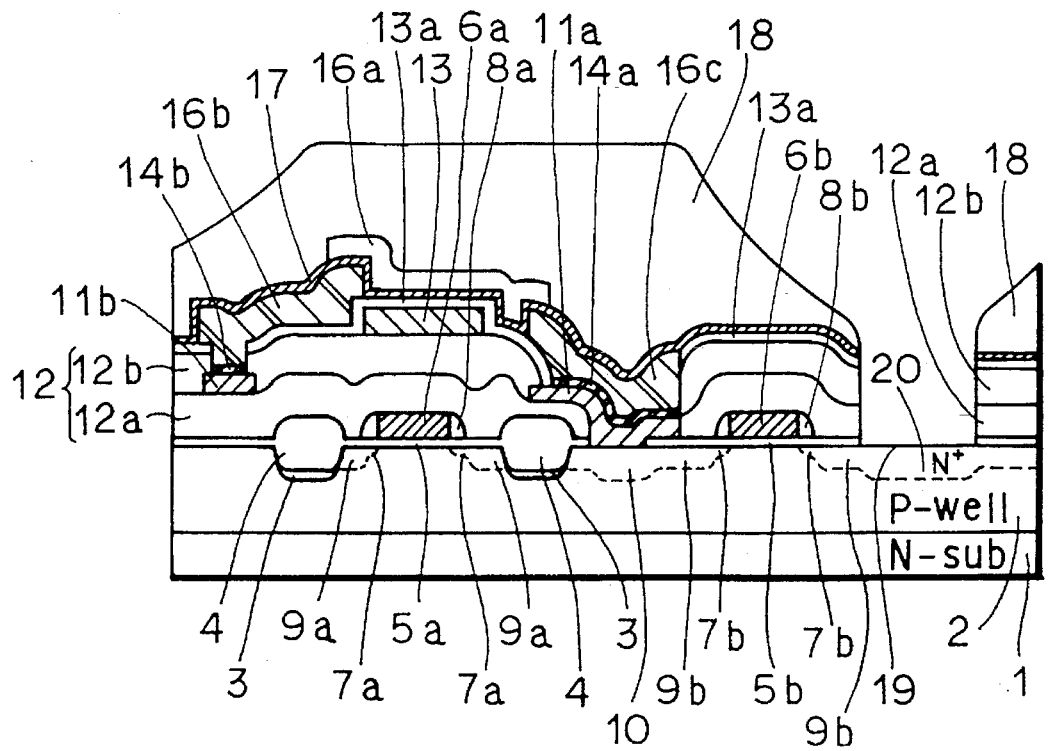

Referring to FIG. 23, the interlayer insulating film 18 is formed to cover the TFT by the CVD method or the like. The interlayer insulating film 18 is reflowed to flatten the same.

During this, the impurity scarcely diffuse between the source/drain regions 16b and 16c of the TFT and the channel region 16a of the TFT, because the impurity diffusion preventing layer 17 is formed at the interface between the source/drain regions 16b and 16c of the TFT and the channel region 16a of the TFT. Thereby, it is possible to prevent reduction of the channel length of the TFT.

Then, the contact hole 19 is formed at the predetermined position in the interlayer insulating film 18. n-type impurity is introduced into the main surface of the semiconductor substrate 1 through the contact hole 19 to form the n-type impurity region 20.

Referring to FIG. 6, the barrier metal layer 21 is formed on the inner surface of the contact hole 19 and the interlayer insulating film 18. The aluminum interconnection layer 22 is formed on the barrier metal layer 21 by the sputtering method or the like. The passivation film 23 is formed on the aluminum interconnection layer 22 by the plasma CVD method or the like. Through the steps described above, the semiconductor device having the TFT shown in FIG. 5 is completed.

(Seventh Embodiment)

A seventh embodiment of the invention will be described below with reference to FIGS. 24–28. This embodiment will be described in connection with a method of manufacturing the semiconductor device having the TFT shown in FIG. 5. FIGS. 24–28 are fragmentary cross sections showing 6th to 10th steps in a process of manufacturing the semiconductor device having the TFT of the seventh embodiment of the invention. The 6th to 10th steps will be described below in connection with the process of manufacturing the semiconductor device having the TFT shown in FIG. 5.

Figure 24:
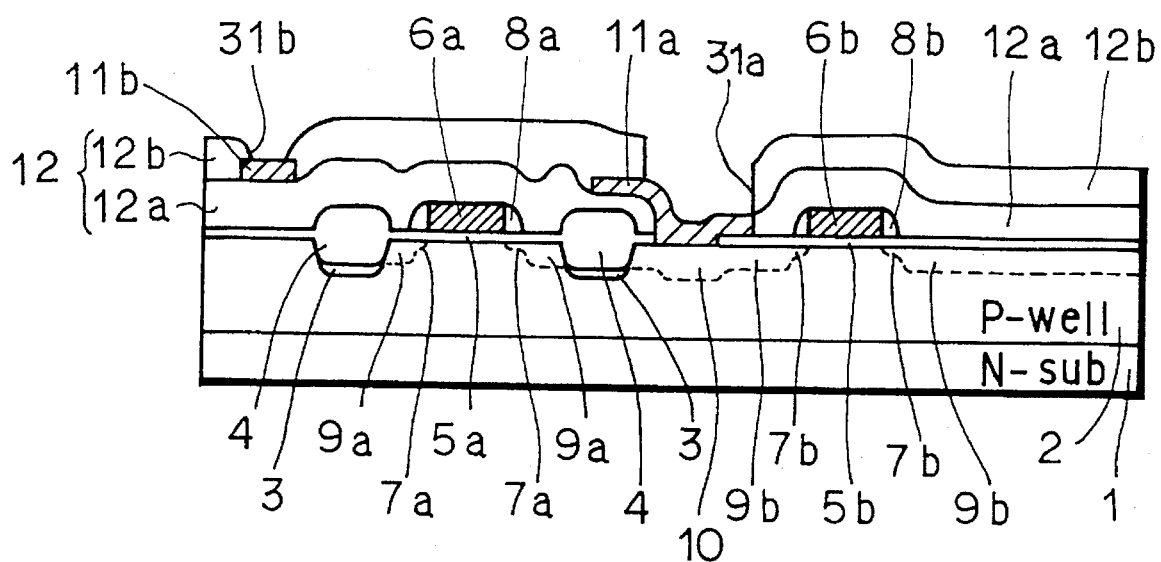
FIGS. 24–28 are fragmentary cross sections showing 6th to 10th steps in a process of manufacturing a semiconductor device having a TFT of a seventh embodiment of the invention, respectively.

Referring to FIG. 24, the contact electrode 11a and interconnection layer 11b are formed through the steps similar to those of the sixth embodiment described before. The interlayer insulating film 12b is formed to cover the interconnection layer 11b and contact electrode 11a. Contact holes 31a and 31b are formed in the interlayer insulating film 12b to expose partially the surfaces of the interconnection layer 11b and contact electrode 11a.

Figure 25:
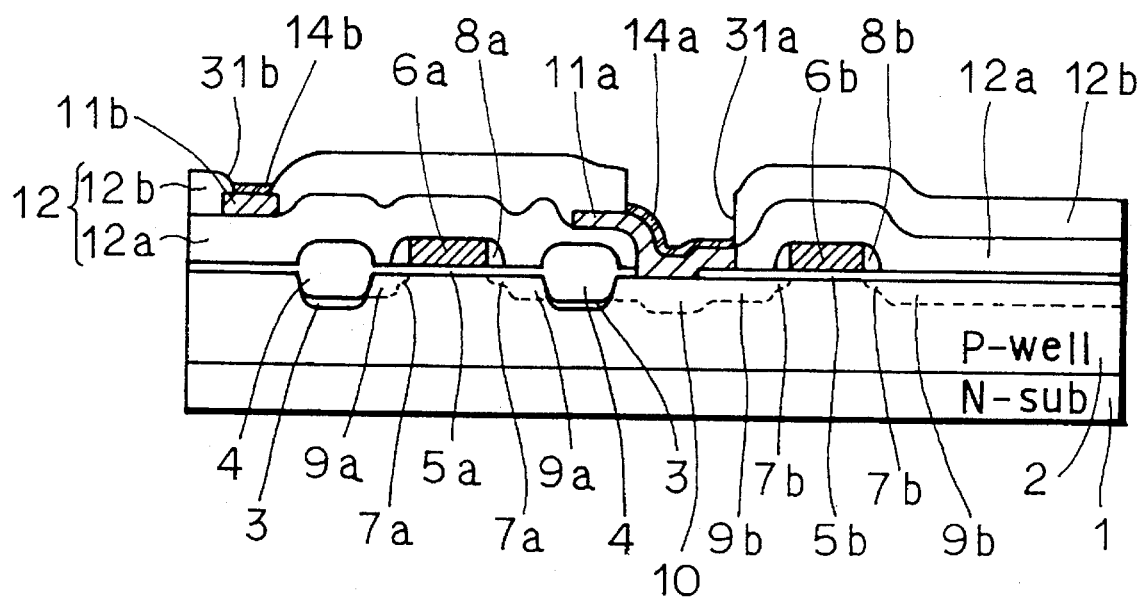

Referring to FIG. 25, the impurity diffusion preventing layers 14a and 14b are formed on the surfaces of the interconnection layer 11b and contact electrode 11a in a manner similar to that in the sixth embodiment.

Figure 26:
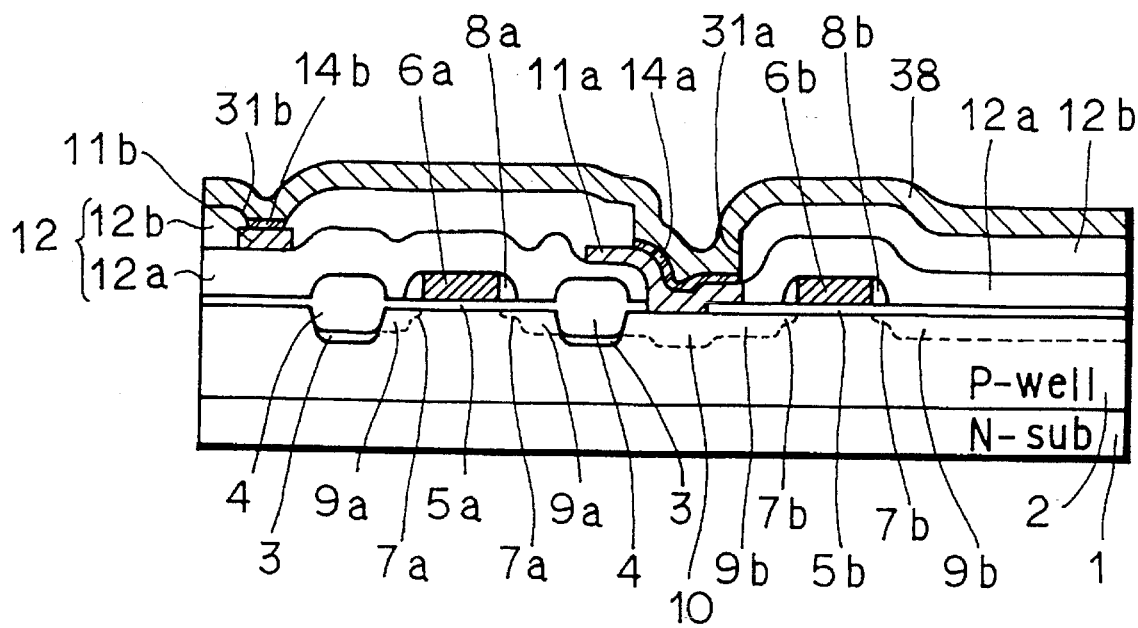

Referring to FIG. 26, a polysilicon layer 38 containing p-type impurity is formed on the impurity diffusion preventing layers 14a and 14b and interlayer insulating film 12b by the CVD method or the like. During this, the concentration of p-type impurity contained in the polysilicon layer 38 is preferably adjusted to be lower than the concentration of p-type impurity introduced into the source/drain regions 16b and 16c of the TFT.

Figure 27:
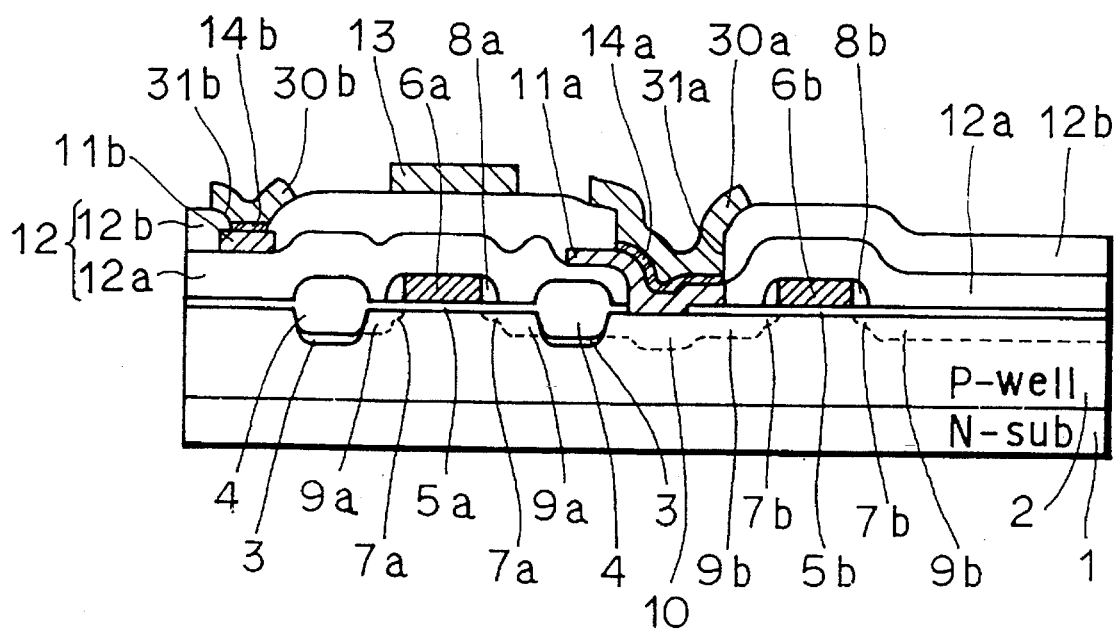

Referring to FIG. 27, the polysilicon layer 38 is patterned to form the polysilicon layers 30a and 30b on the impurity diffusion preventing layers 14a and 14b. Simultaneously, the gate electrode 13 of the TFT is formed. This reduces the number of manufacturing steps.

Figure 28:
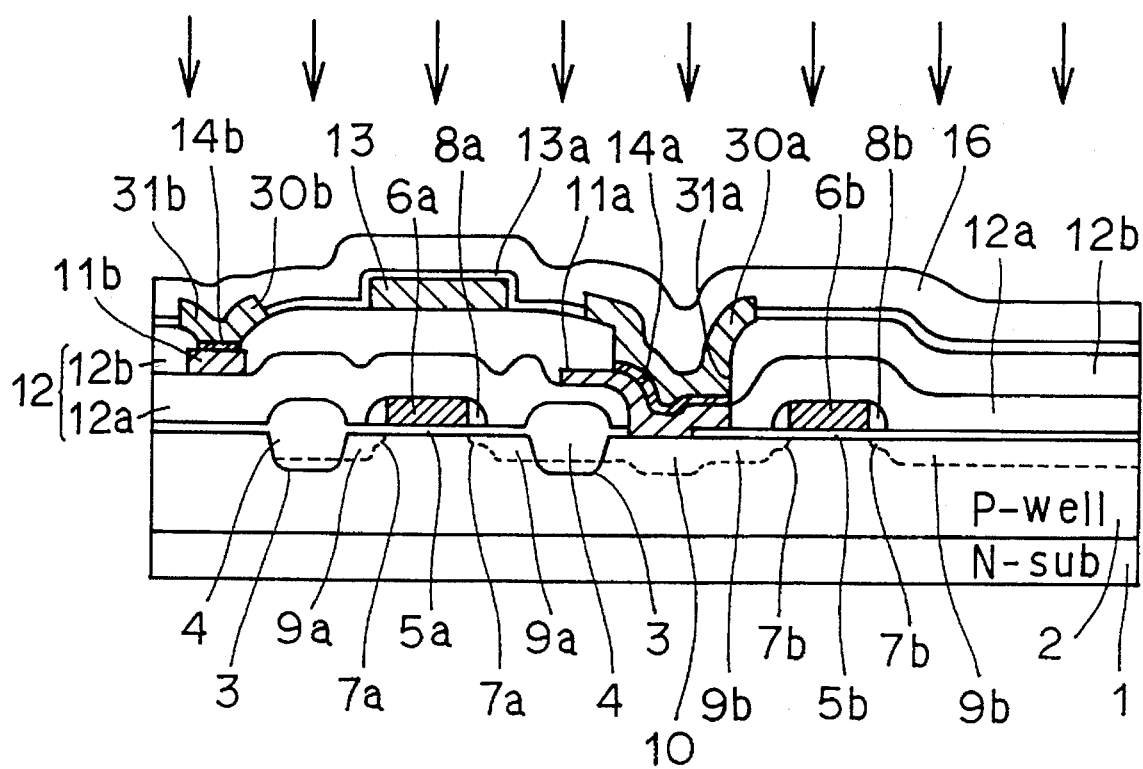

Referring to FIG. 28, the gate insulating film 13a covering the gate electrode 13 is formed by the CVD method or the like. Portions of the gate insulating film 13a located above the polysilicon layers 30a and 30b are removed.

Then, by using CVD method or the like, a polycrystalline silicon layer 16 on which source/drain regions of the TFT are to be formed, is formed on polycrystalline silicon layers 30a, 30b and on gate insulating film 13a. p type impurity such as B, $BF_2$ or the like is introduced to polycrystalline silicon layer 16. The relation between the sum of thicknesses of polycrystalline silicon layer 16 and polycrystalline silicon layer 30a or 30b and implantation energy of B and $BF_2$ are as shown in Table 1 below.

TABLE 1

| Implantation Energy (KeV) | Total Film Thickness of Polycrystalline Silicon Layer 16 and polycrystalline silicon layer 30a or 30b(Å) |
|---|---|
| 10 | not lower than 300 |
| 20 | not lower than 500 |
| 30 | not lower than 700 |
| 40 | not lower than 900 |
| 50 | not lower than 1100 |
| 60 | not lower than 1300 |
| 10 | not lower than 1200 |
| 20 | not lower than 1900 |
| 30 | not lower than 2500 |
| 40 | not lower than 3200 |
| 50 | not lower than 3600 |

By introducing B or $BF_2$ to polycrystalline silicon layer 16 under the conditions listed in Table 1 above, p type impurities such as B or $BF_2$ can be prevented from being implanted in contact electrode 11a or interconnection layer 11b piercing through polycrystalline silicon layer 16 and polycrystalline silicon layer 30a or through polycrystalline silicon layer 16 and polycrystalline silicon layer 30b. Therefore, contact resistance between source/drain regions of the TFT and the contact electrode 11a or the interconnection layer 11b can be suppressed.

Thereafter, by patterning polycrystalline silicon layer 16, source/drain regions of the TFT are formed respectively. Thereafter, the similar processes as in the sixth embodiment above are carried out, providing a semiconductor device having the TFT shown in FIG. 5.

Then, the semiconductor device having the TFT shown in FIG. 5 is completed through the steps similar to those of the sixth embodiment.

(Eighth Embodiment)

Figure 29:
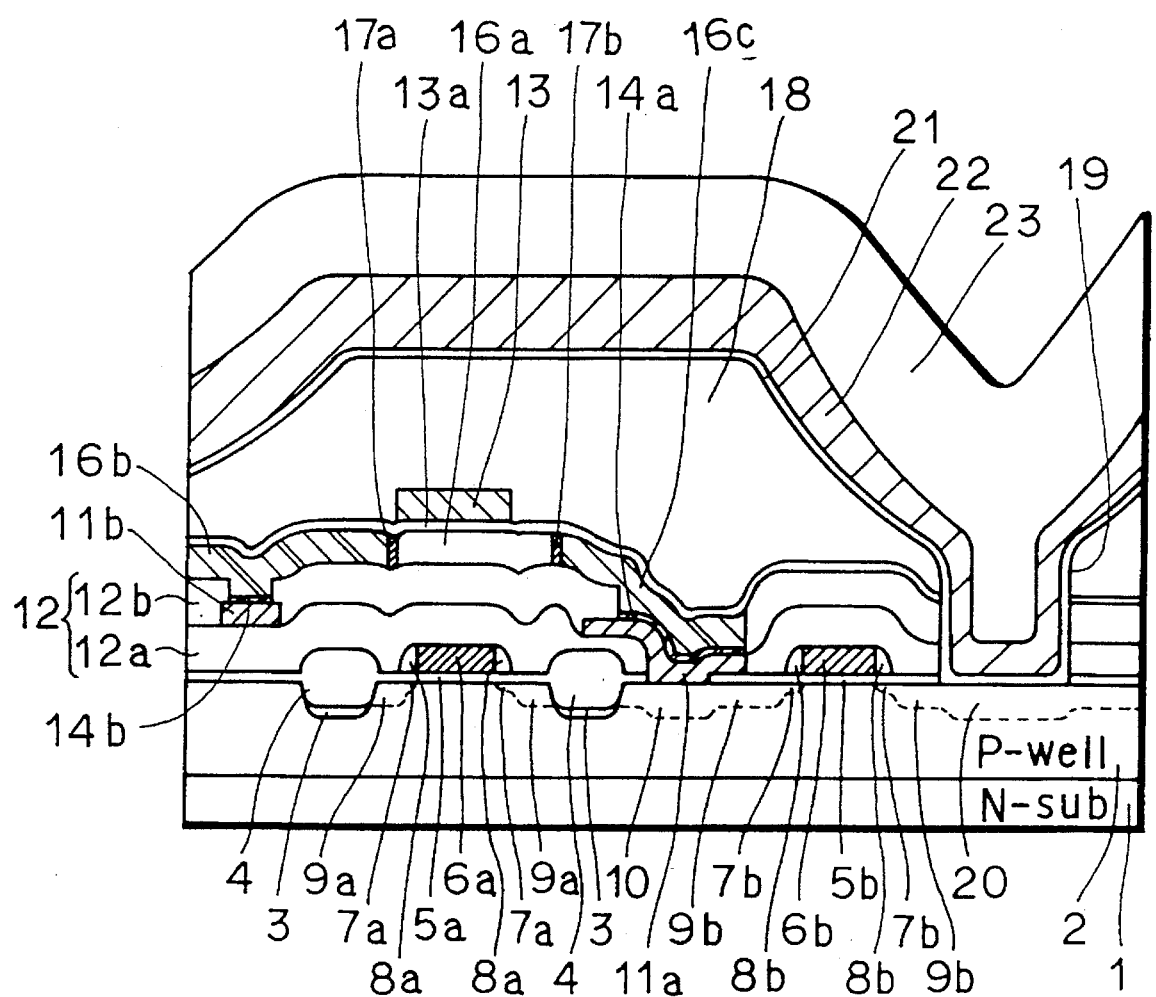
FIGS. 29–31 are fragmentary cross sections showing semiconductor devices having TFTs of eighth to tenth embodiments of the invention, respectively.

A semiconductor device having a TFT of an eighth embodiment of the invention will be described below with reference to FIG. 29. FIG. 29 is a fragmentary cross section showing the semiconductor device of the TFT of the eighth embodiment of the invention.

In the embodiment shown in FIG. 29, the gate electrode 13 of the TFT is formed on the channel region 16a of the TFT. Structures other than the above are similar to those of the semiconductor device having the TFT shown in FIG. 2. Therefore, the semiconductor device having the TFT in this embodiment achieves an effect similar to that of the first embodiment.

(Ninth Embodiment)

A ninth embodiment of the invention will be described below with reference to FIG. 30, which is a fragmentary cross section showing a semiconductor device having a TFT of the ninth embodiment of the invention.

Figure 30:
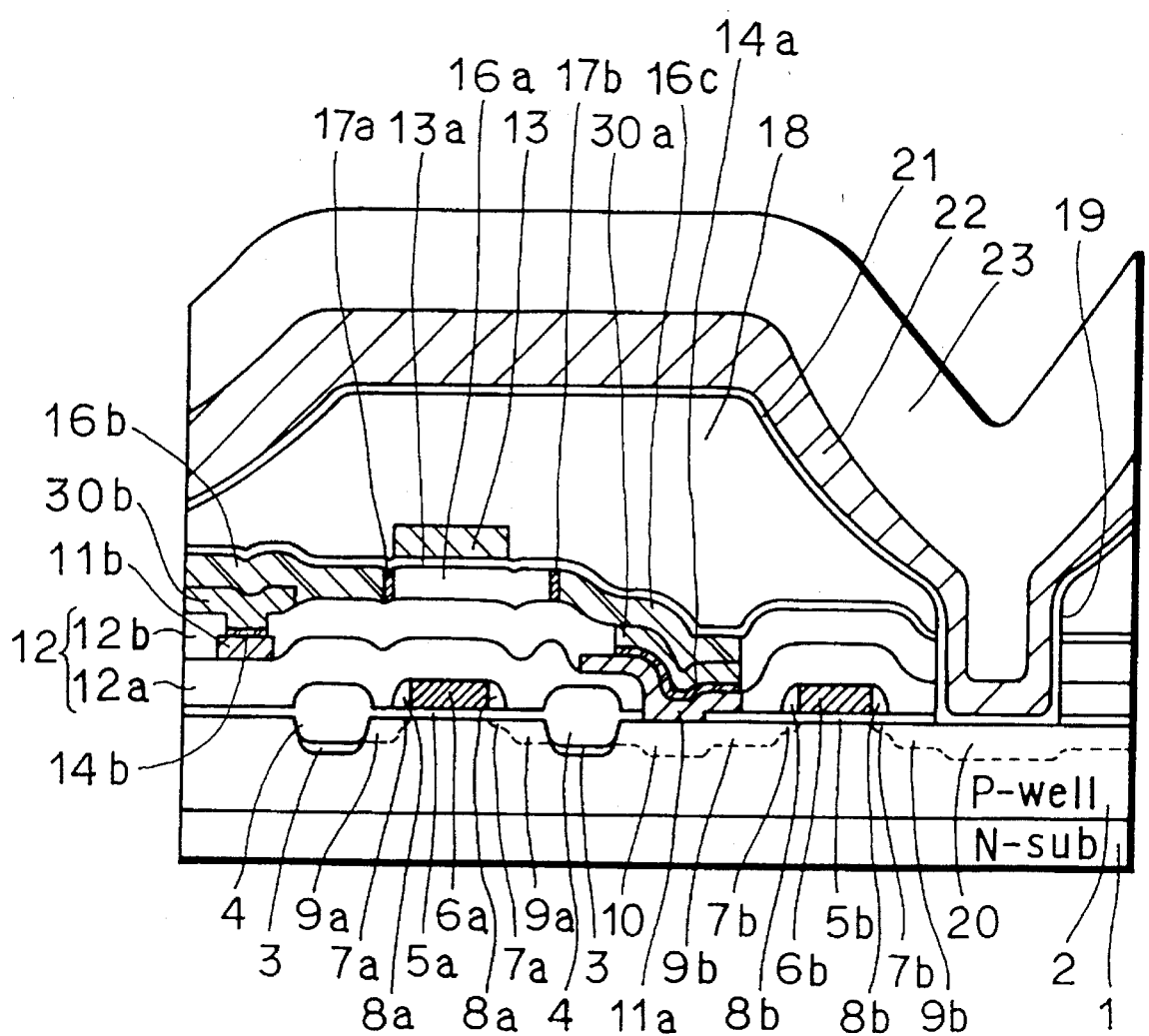

Also in this embodiment shown in FIG. 30, the gate electrode 13 of the TFT is formed on the channel region 16a of the TFT. Other structures are similar to those of the semiconductor device having the TFT shown in FIG. 4. Therefore, an effect similar to that of the third embodiment can be achieved owing to the structures shown in FIG. 30.

(Tenth Embodiment)

A tenth embodiment of the invention will be described below with reference to FIG. 31, which is a fragmentary cross section showing a semiconductor device including a TFT of the tenth embodiment of the invention.

Figure 31:
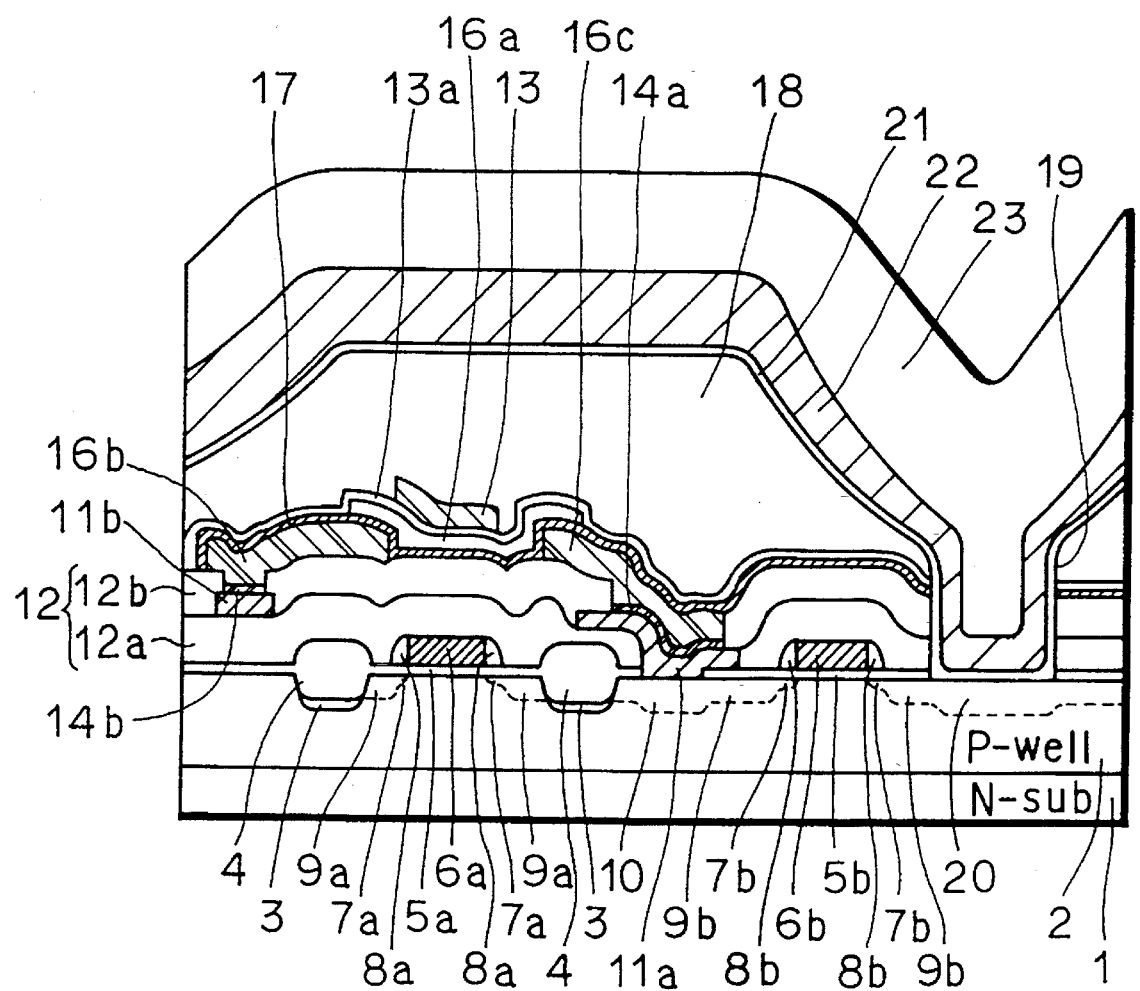

Also in the embodiment shown in FIG. 31, the gate electrode 13 of the TFT is formed on the channel region 16a. Other structures are similar to those of the semiconductor device having the TFT shown in FIG. 6. Owing to these structures, the gate insulating film 13a of the TFT can be formed of one kind of film, and the interface level density is reduced. An effect similar to that of the fourth embodiment is also achieved.

(Eleventh Embodiment)

In the eighth to tenth embodiments described above, the gate electrode 13 of the TFT is located above the channel region 16a of the TFT. This eleventh embodiment relates to a method of manufacturing a semiconductor device having a TFT in which the gate electrode 13 of the TFT is located above the channel region 16a of the TFT.

FIGS. 32–37 are fragmentary cross sections showing 4th to 9th steps in a process of manufacturing the semiconductor device having the TFT of the eleventh embodiment of the invention, respectively. The eleventh embodiment of the invention will be described below with reference to these figures.

Figure 32:
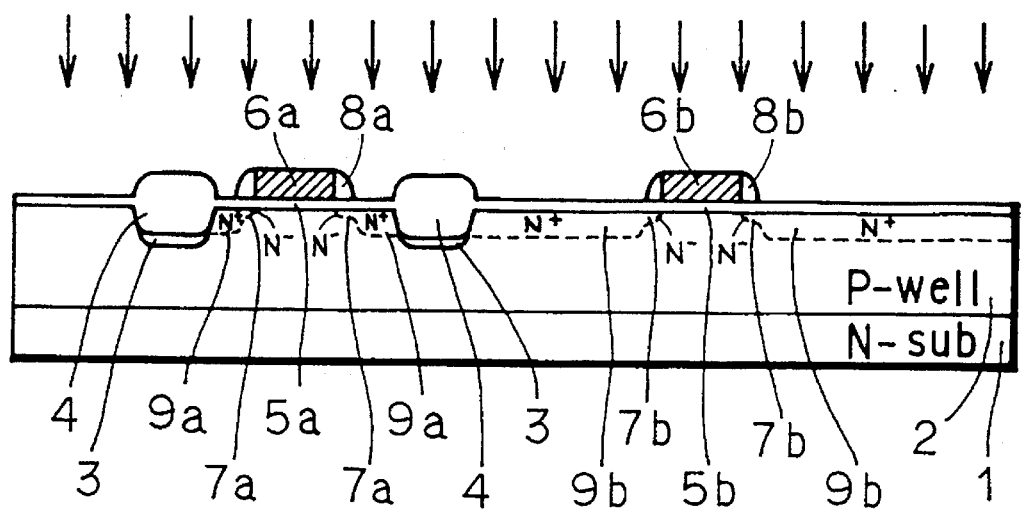
FIGS. 32–37 are fragmentary cross sections showing 4th to 9th steps in a process of manufacturing a semiconductor device having a TFT of an eleventh embodiment of the invention, respectively.
Figure 33:
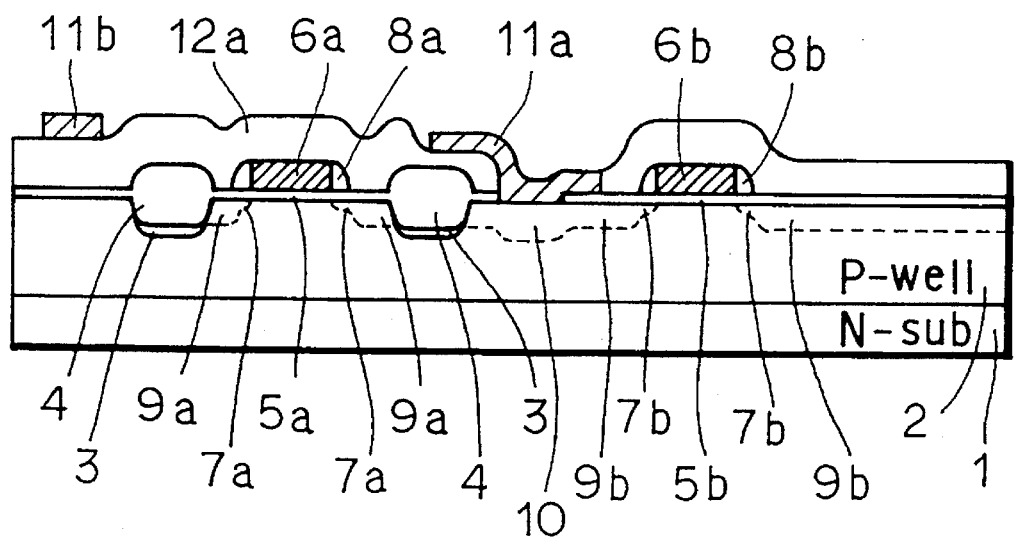

Referring first to FIG. 32, the NMOS field effect transistors are formed in the main surface of the semiconductor substrate 1 through the steps similar to those of the sixth embodiment. Referring to FIG. 33, the interlayer insulating film 12a is formed on the main surface of the semiconductor substrate 1 by the CVD method or the like. The n-type impurity region 10 is formed at the predetermined position in the main surface of the semiconductor substrate 1, and the contact electrode 11a electrically connected to the n-type impurity region 10 is formed thereon. Simultaneously, the interconnection layer 11b is formed at the predetermined position on the interlayer insulating film 12a.

Figure 34:
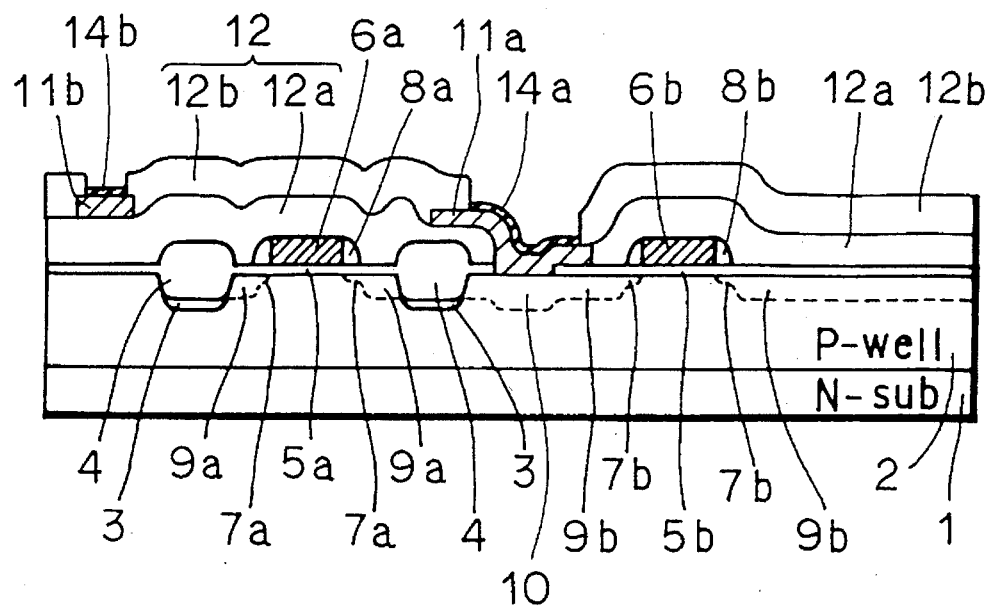

Referring to FIG. 34, the interlayer insulating film 12b covering the interconnection layer 11b and contact electrode 11a are formed. The contact holes are formed to expose partially the surfaces of the contact electrode 11a and interconnection layer 11b. The impurity diffusion preventing layers 14a and 14b are formed on the exposed surfaces of the contact electrode 11a and interconnection layer 11b in a manner similar to that of the sixth embodiment, respectively.

Figure 35:
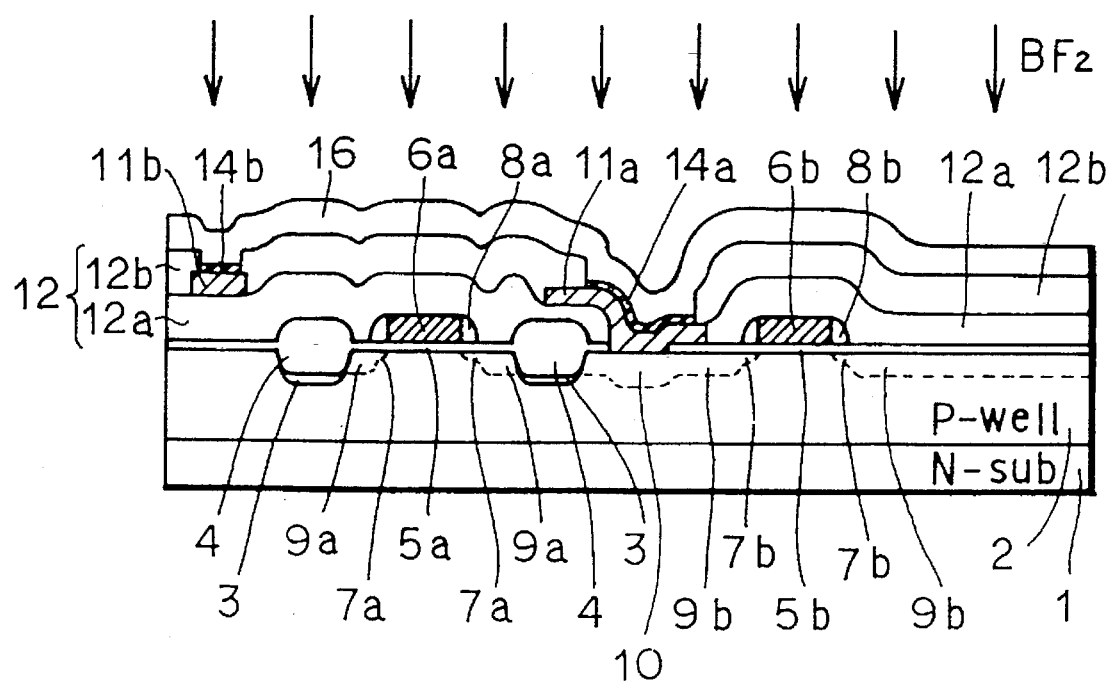

Referring to FIG. 35, the polysilicon layer (or amorphous silicon layer) of about 100 to 400 Å in thickness is formed on the impurity diffusion preventing layers 14a and 14b and the interlayer insulating film 12b by the CVD method or the like. Ion of p-type impurity (BF2) is implanted into the polysilicon layer.

Figure 36:
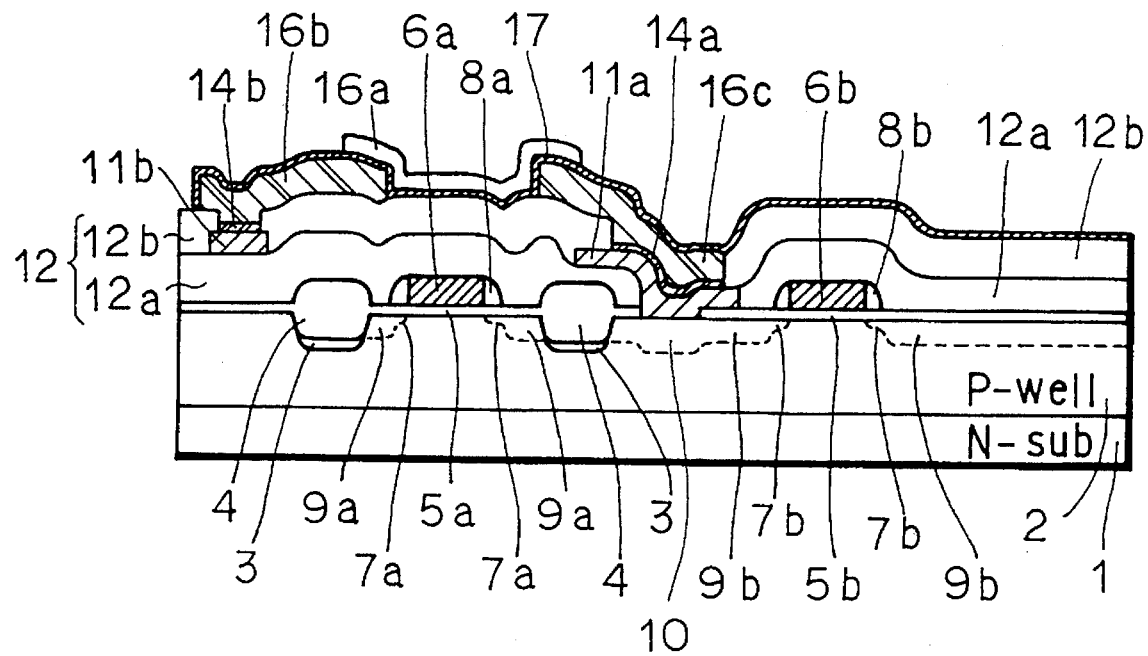

Referring to FIG. 36, the first polysilicon layer 16 is patterned to form the source/drain regions 16b and 16c of the TFT. The impurity diffusion preventing layer 17 is formed on the source/drain regions 16b and 16c and the interlayer insulating film 12b in a manner similar to that of the sixth embodiment.

The second polysilicon layer is deposited on the impurity diffusion preventing layer 17. n-type impurity is implanted at a dose of about $10^{11}$ to $10^{12}/cm^2$ into the 12, 2 second polysilicon layer. The second polysilicon layer is patterned to form the channel region 16a of the TFT.

Figure 37:
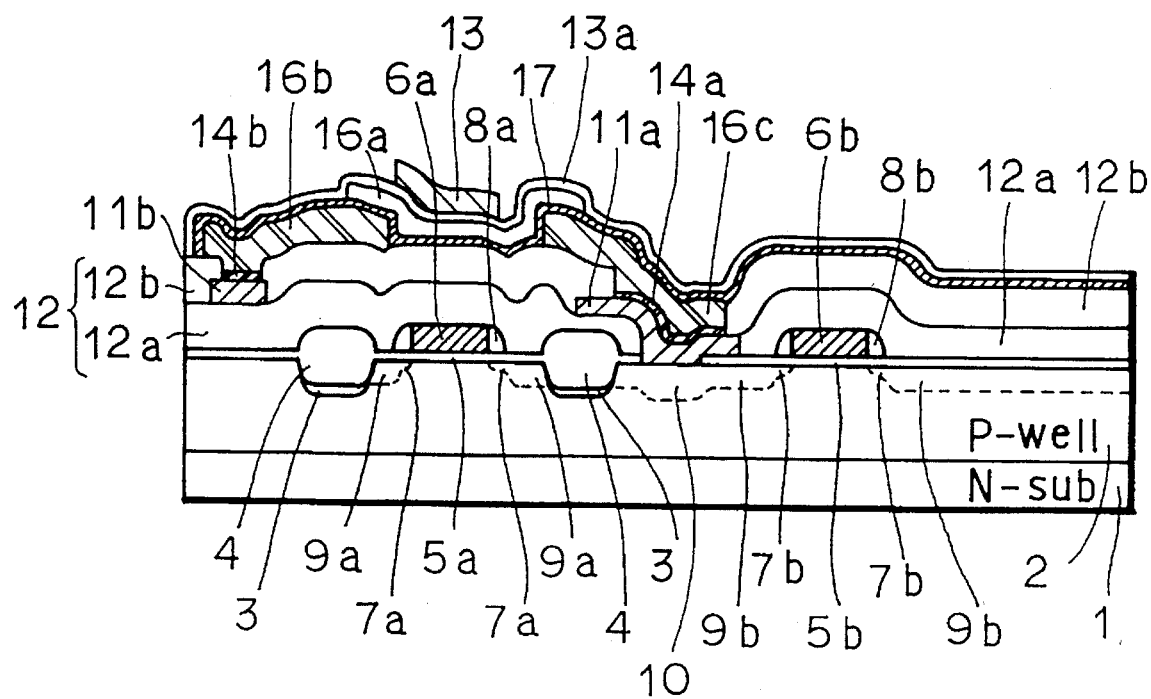

Referring to FIG. 37, the gate insulating film 13a of the TFT is formed on the channel region 16a and source/drain regions 16b and 16c of the TFT by the CVD method or the like. The polysilicon layer containing p-type or n-type impurity is formed on the gate insulating film 13a by the CVD method or the like.

The polysilicon layer is patterned to form the gate electrode 13 of the TFT at a position opposed to the channel region 16a of the TFT. Thereafter, the semiconductor device having the TFT shown in FIG. 31 is completed through steps similar to those of the sixth embodiment.

(Twelfth Embodiment)

A semiconductor device having a TFT of a twelfth embodiment of the invention will be described below with reference to FIG. 38, which is a fragmentary cross section showing the semiconductor device of the TFT of the twelfth embodiment of the invention.

Figure 38:
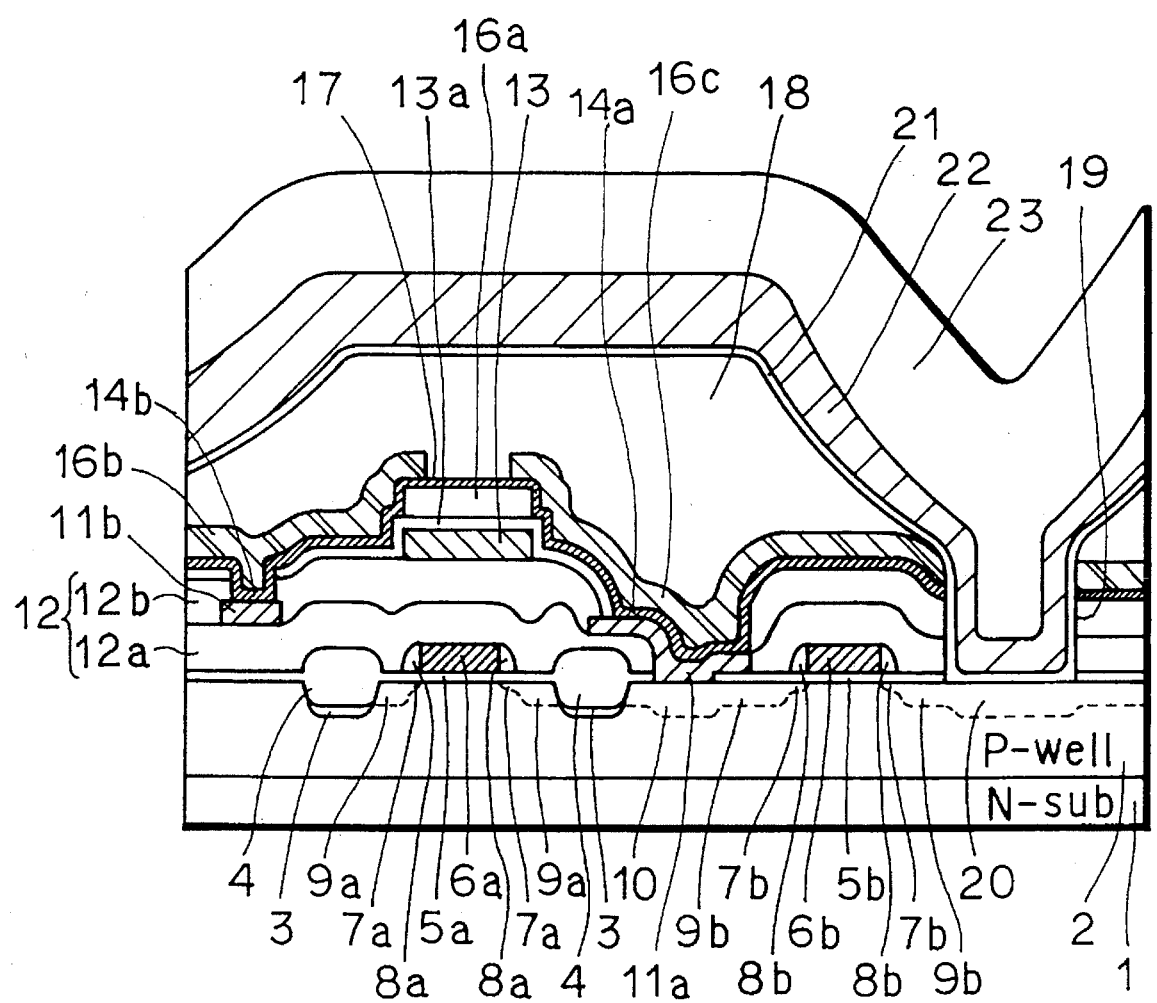
FIGS. 38 and 39 are fragmentary cross sections showing semiconductor devices having TFTs of twelfth and thirteenth embodiments of the invention, respectively.

In the embodiment shown in FIG. 38, the channel region 16a of the TFT is formed on the gate electrode 13 of the TFT with the gate insulating film 13a therebetween. The impurity diffusion preventing layer 17 covering the channel region 16a of the TFT and the gate insulating film 13a is formed. An effect obtained thereby is similar to those of the embodiments described before.

In this embodiment, however, the impurity diffusion preventing layer 17 and the impurity diffusion preventing layers 14a and 14b can be formed by the same layer. Therefore, the impurity diffusion preventing layer 17 and the impurity diffusion preventing layers 14a and 14b can be formed in the same step. This simplifies the manufacturing process.

(Thirteenth Embodiment)

A thirteenth embodiment of the invention will be described below with reference to FIG. 39, which is a fragmentary cross section showing a semiconductor device including a TFT of the thirteenth embodiment of the invention.

Figure 39:
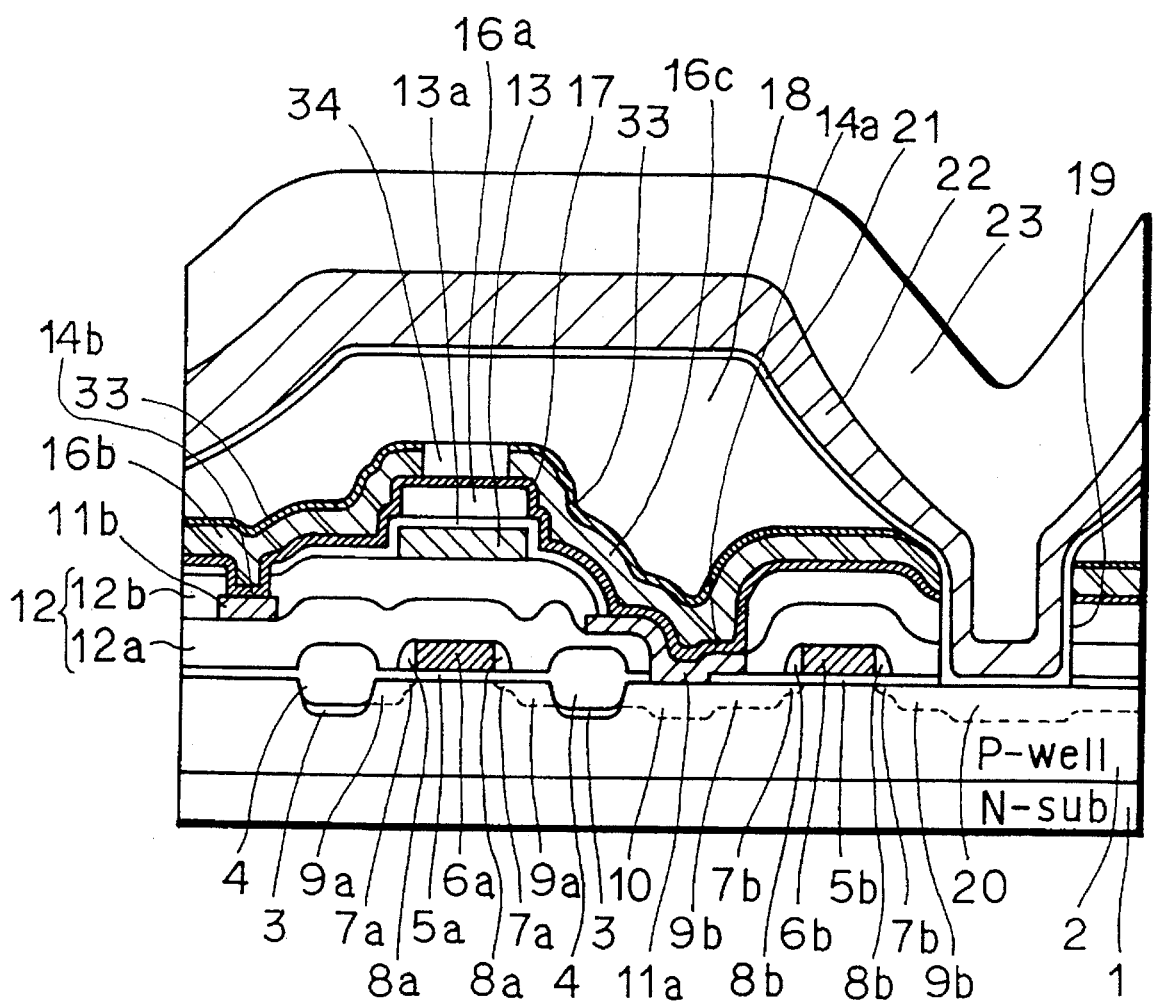

In the embodiment shown in FIG. 39, a silicon nitride film 33 is formed on the source/drain regions 16b and 16c. An oxide film 34 is formed between the source/drain regions 16b and 16c of the TFT for separating the source/drain regions 16b and 16c of the TFT in the channel length direction.

Other structures are similar to those of the twelfth embodiment shown in FIG. 38. Owing to the above structures, the etching damage against the polysilicon layer forming the channel region is relieved. In addition to this, an effect similar to that of the twelfth embodiment can be achieved.

(Fourteenth Embodiment)

A method of manufacturing a semiconductor device having a TFT of a fourteenth embodiment of the invention will be described below with reference to FIGS. 40 to 45. More specifically, this embodiment will be described below in connection with the method of manufacturing the semiconductor device having the TFT shown in FIG. 38. FIGS. 40–44 are fragmentary cross sections showing distinctive steps, i.e., 1st to 5th steps in a process of manufacturing the semiconductor device having the TFT of the fourteenth embodiment of the invention. FIG. 45 is a fragmentary cross section showing another aspect of the fifth step.

Figure 40:
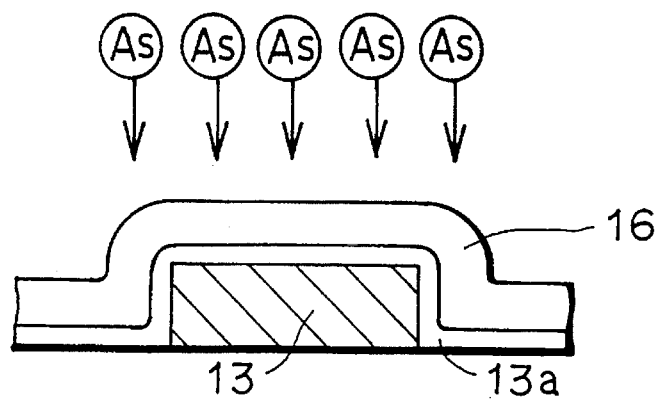
FIGS. 40–44 are fragmentary enlarged cross sections showing 1st to 5th steps in a process of manufacturing a semiconductor device having a TFT of a fourteenth embodiment of the invention.

Referring first to FIG. 40, the gate electrode 13 is formed through steps similar to those of the sixth embodiment. The gate insulating film 13a covering the gate electrode 13 is formed by the CVD method or the like. The first polysilicon layer 16 is formed on the gate insulating film 13a. n-type impurity such as arsenic (As) is implanted into the first polysilicon layer 16. The implantation dose of this n-type impurity is preferable in a range from $10^{11}$ to $10^{12}/cm^2$.

Figure 41:
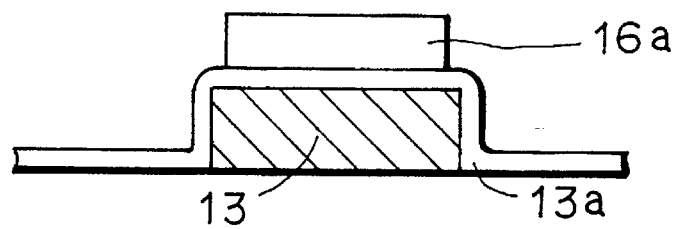

Referring to FIG. 41, the first polysilicon layer 16 is patterned to form the channel region 16a of the TFT at a position opposed to the gate electrode 13 of the TFT.

Figure 42:
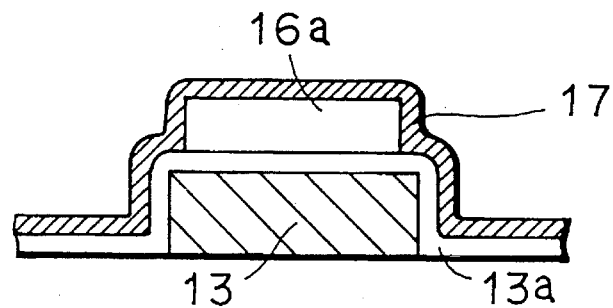

Referring to FIG. 42, the impurity diffusion preventing layer 17 covering the channel region 16a of the TFT and the gate insulating film 13a is formed in a manner similar to that of the sixth embodiment.

Figure 43:
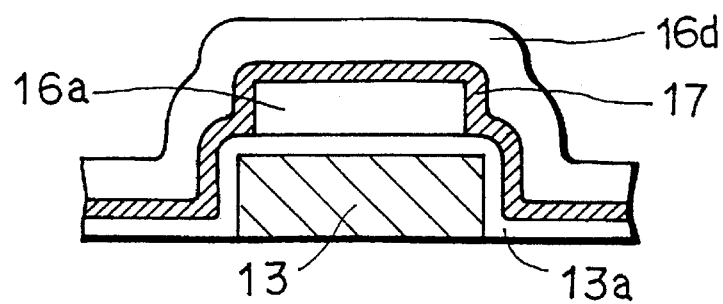

Referring to FIG. 43, a second polysilicon layer 16d is formed on the impurity diffusion preventing layer 17 by the CVD method or the like. p-type impurity (BF2) is implanted at a high concentration into the second polysilicon layer 16d.

Figure 44:
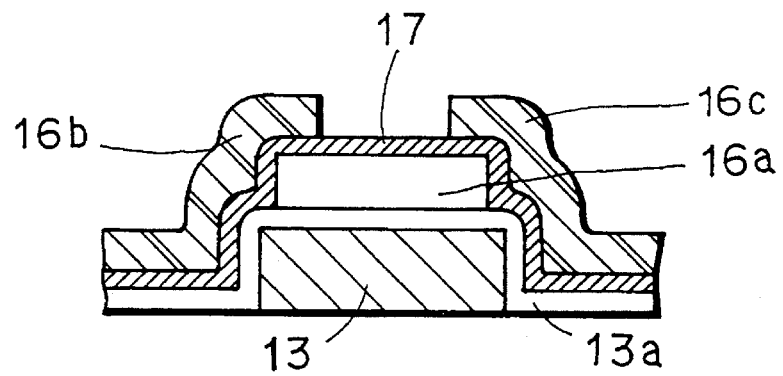
Figure 45:
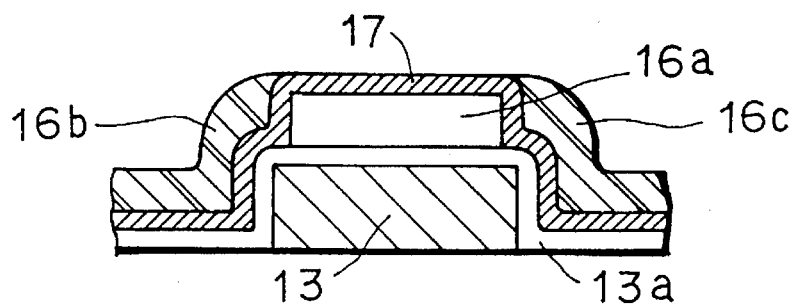
FIG. 45 is a fragmentary enlarged cross section showing modification of the 5th step in the process of manufacturing the semiconductor device having the TFT of the fourteenth embodiment of the invention.

Referring to FIG. 44, the second polysilicon layer 16d is patterned to expose partially the surface of the impurity diffusion preventing layer 17 located above the channel region 16a. Thereby, the second polysilicon layer 16d is divided in the channel length direction at a position above the channel region 16a of the TFT. Thereby, the source/drain regions 16b and 16c of the TFT are formed. In this manner, the TFT of this embodiment is formed.

The semiconductor device having the TFT shown in FIG. 38 is completed through steps similar to those of the sixth embodiment. In FIG. 44 (5th step), the source/drain regions 16b and 16c of the TFT are divided from each other at the position above the channel region 16a. As shown in FIG. 45, however, the source/drain regions 16b and 16c may be formed such that the upper surfaces thereof may be flush with the upper surface of the impurity diffusion preventing layer 17.

(Fifteenth Embodiment)

Figure 46:
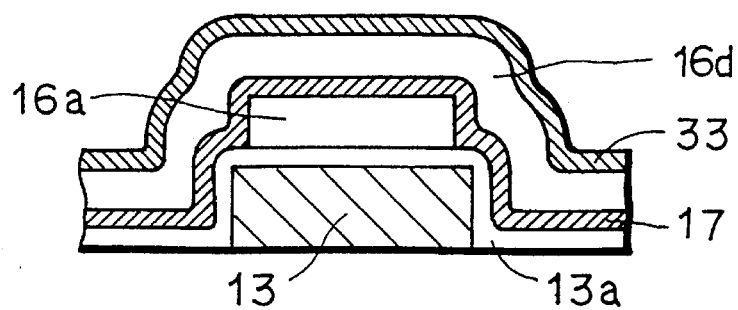
FIGS. 46–48 are fragmentary cross sections showing distinctive steps and specifically 1st to 3rd steps in a process of manufacturing a semiconductor device having a TFT of a fifteenth embodiment of the invention, respectively.
Figure 47:
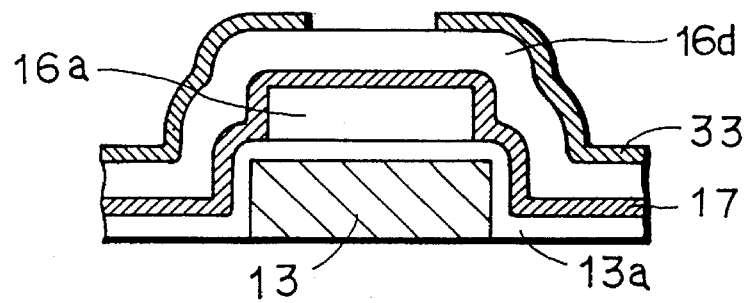
Figure 48:
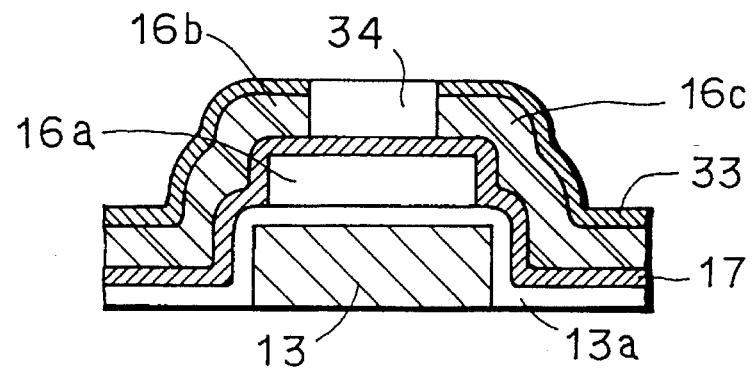

A fifteenth embodiment of the invention will be described below with reference to FIGS. 46–48. More specifically, a method of manufacturing the semiconductor device of the TFT shown in FIG. 39 will be described below. FIGS. 46 to 48 are fragmentary cross sections showing distinctive steps, i.e., 1st to 3rd steps in a process of manufacturing the semiconductor device having the TFT of the fifteenth embodiment of the invention, respectively.

Referring to FIG. 46, the second polysilicon layer 16d is formed through steps similar to those of the fourteenth embodiment. The silicon nitride film 33 functioning as an anti-oxidation film is formed on the second polysilicon layer 16d. This silicon nitride film 33 may be replaced with another anti-oxidation film.

Referring to FIG. 47, the silicon nitride film 33 is patterned to expose a portion of the surface of the second silicon layer 16d located above the channel region 16a of the TFT.

Referring to FIG. 48, thermal oxidation is effected on the second polysilicon layer 16d to form the oxide film 34 in the second polysilicon layer 16d. The oxide film 34 separates the second polysilicon layer 16d in the channel length direction. Thereby, the source/drain regions 16b and 16c of the TFT are formed.

The semiconductor device having the TFT shown in FIG. 39 is completed through the steps described above and steps similar to those of the sixth embodiment.

(Sixteenth Embodiment)

A sixteenth embodiment of the invention will be described below with reference to FIG. 49, which is a fragmentary cross section showing a semiconductor device having a TFT of the sixteenth embodiment of the invention.

In the respective embodiments already described, the channel region 16a of the TFT is formed by the layer which is different from the layer forming the source/drain regions 16b and 16c of the TFT. In this embodiment shown in FIG. 49 and a seventeenth embodiment which will be described later, the source/drain regions 16b and 16c and the channel region 16a of the TFT are formed by the same layer.

Figure 49:
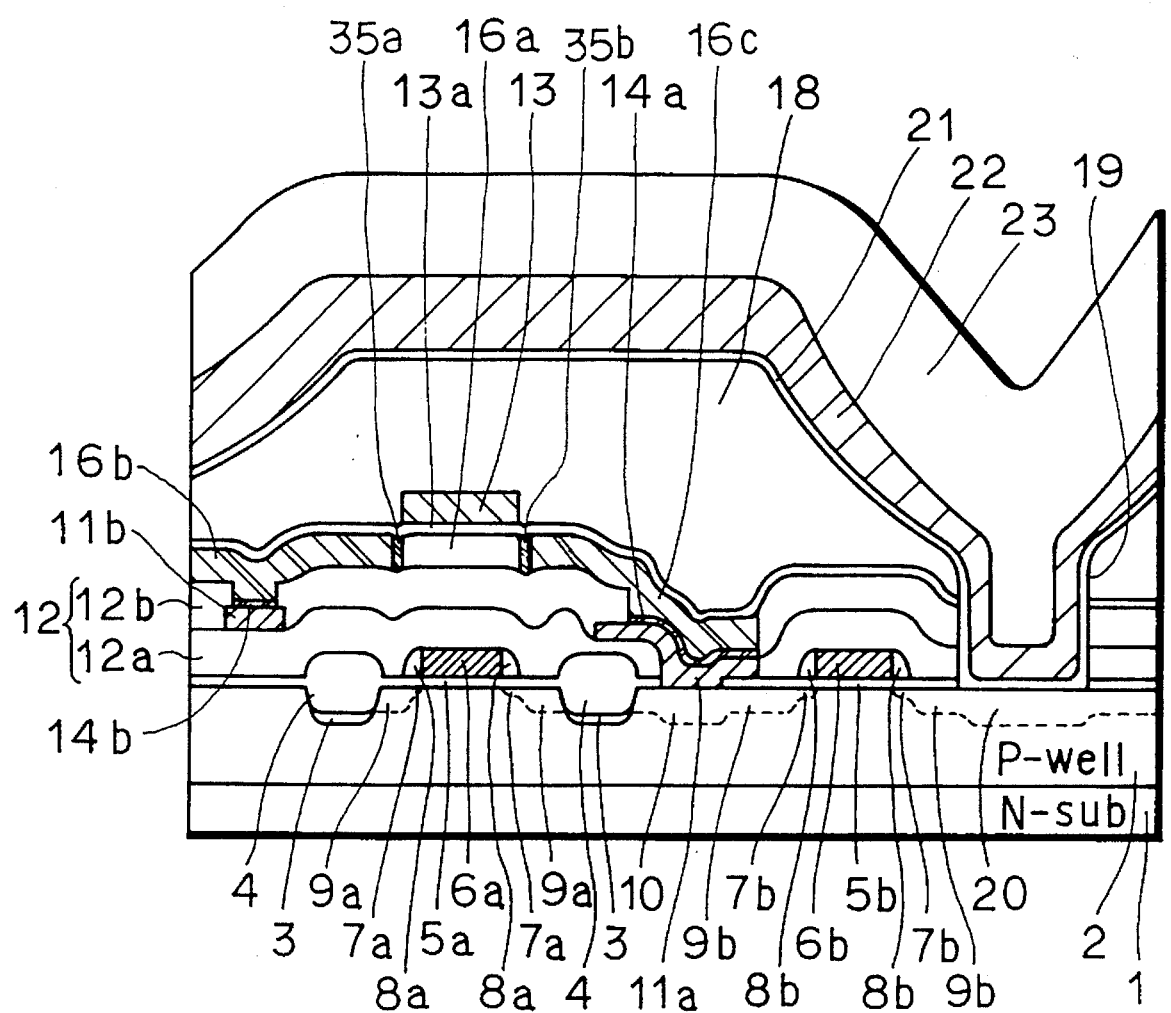
FIGS. 49 and 50 are fragmentary cross sections showing semiconductor devices having TFTs of sixteenth and seventeenth embodiments of the invention, respectively.

Referring to FIG. 49, silicon nitride films 35a and 35b having a predetermined thickness are formed at interfaces between the channel region 16a of the TFT and the source/drain regions 16b and 16c of the TFT. The silicon nitride films 35a and 35b function as impurity diffusion preventing layers. Other structures are similar to those of the semiconductor device having the TFT of the eighth embodiment shown in FIG. 29. Therefore, an effect similar to that of the eighth embodiment is achieved.

(Seventeenth Embodiment)

A semiconductor device having a TFT of a seventeenth embodiment of the invention will be described below with reference to FIG. 50, which is a fragmentary cross section of the semiconductor device having the TFT of the seventeenth embodiment of the invention.

Figure 50:
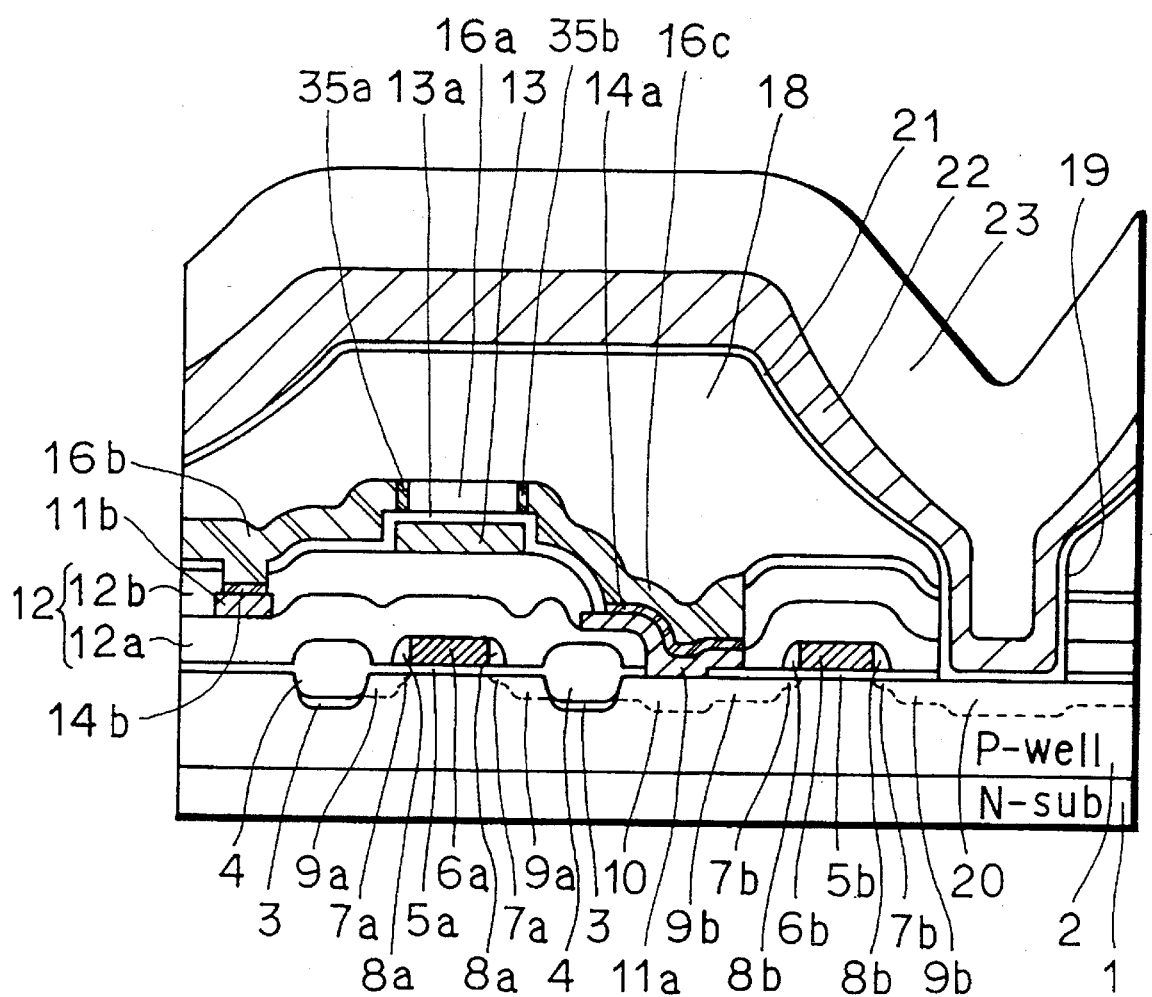

The embodiment in FIG. 50 is a modification of the sixteenth embodiment. More specifically, this embodiment differs from the semiconductor device having the TFT of the sixteenth embodiment in that the gate electrode 13 of the TFT is located under the channel region 16a of the TFT. Thereby, an effect similar to that of the sixteenth embodiment can be achieved.

(Eighteenth Embodiment)

A method of manufacturing a semiconductor device having a TFT of an eighteenth embodiment of the invention will be described below with reference to FIGS. 51 to 56. More specifically, a method of manufacturing the semiconductor device having the TFT shown in FIG. 49 will be described below. FIGS. 51–56 are fragmentary cross sections showing distinctive steps, i.e., 1st to 6th steps in a process of manufacturing the semiconductor device having the TFT of the eighteenth embodiment of the invention.

Figure 51:
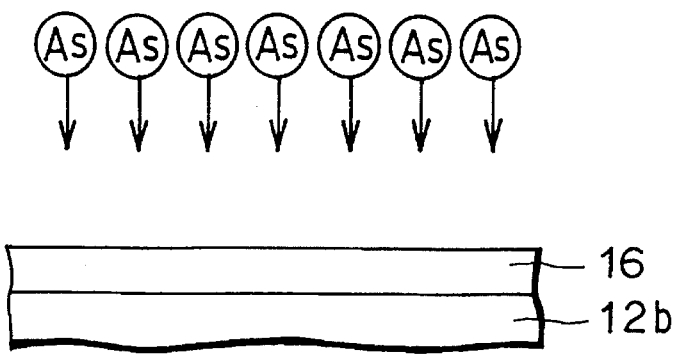
FIGS. 51–55 are fragmentary cross sections showing distinctive steps and specifically 1st to 5th steps in a process of manufacturing a semiconductor device having a TFT of an eighteenth embodiment of the invention, respectively.

Referring to FIG. 51, the first polysilicon layer (or amorphous silicon layer) 16 is formed on the interlayer insulating film 12b through steps similar to those of the eleventh embodiment. n-type impurity such as arsenic (As) is implanted into the first polysilicon layer 16.

Figure 52:
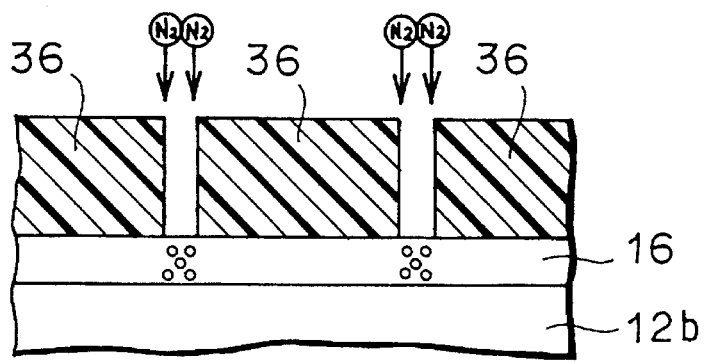

Referring to FIG. 52, a resist pattern 36, which is patterned to expose regions forming boundary portions between the channel region and the source/drain regions of the TFT, on the first polysilicon layer 16.

Using the resist pattern 36 as a mask, nitrogen ($N_2$) is ion-implanted into the first polysilicon layer 16. The implantation dose of the nitrogen is preferably about $1 \times 10^{18}$ /cm$^2$ or more. More preferably, the implantation dose of the nitrogen is about $5 \times 10^{18}$/cm$^2$. The implantation energy is about 20 KeV to about 40 KeV. Thereafter, the resist pattern 36 is removed.

Figure 53:
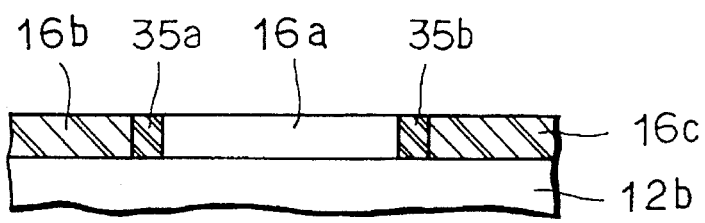

Referring to FIG. 53, lamp anneal treatment is effected on the nitrogen (N2) implanted into the first polysilicon layer 16 in the nitrogen (N2) gas atmosphere or inert gas atmosphere at a temperature of 1050° C. to 1150° C. for 30 seconds. Thereby, the silicon nitride films 35a and 35b are formed in the first polysilicon layer 16. As a result, regions for forming the channel region 16a and source/drain regions 16b and 16c of the TFT are formed in the first polysilicon layer 16.

Figure 54:
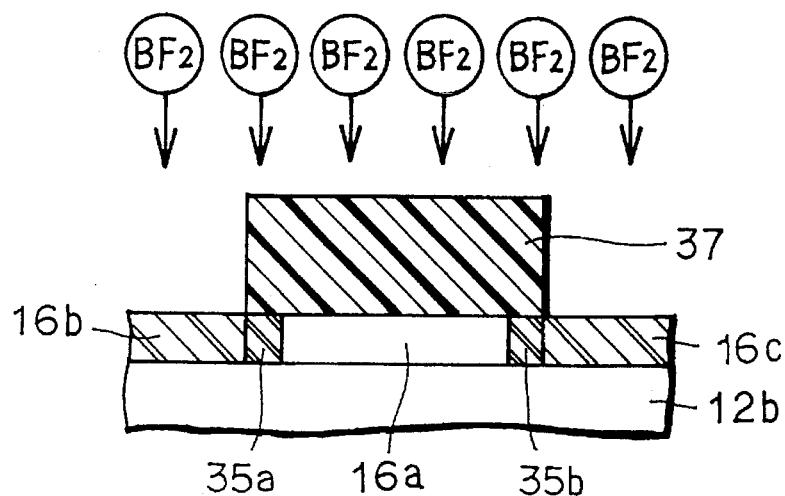

Referring to FIG. 54, a resist pattern 37, which covers the channel region 16a of the TFT and exposes the source/drain regions 16b and 16c of the TFT, is formed. Using the resist pattern 37 as a mask, p-type impurity (e.g., BF2) is implanted into the source/drain regions 16b and 16c of the TFT. Thereafter, the resist pattern 37 is removed.

Figure 55:
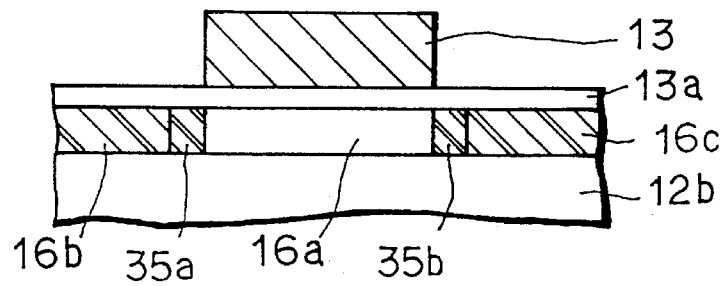

Referring to FIG. 55, the gate insulating film 13a is formed on the channel region 16a and the source/drain regions 16b and 16c of the TFT by the CVD method or the like. A polysilicon layer containing impurity introduced thereinto is formed on the gate insulating film 13a. The polysilicon layer is patterned to form the gate electrode 13 of the TFT on the channel region 16a of the TFT.

Figure 56:
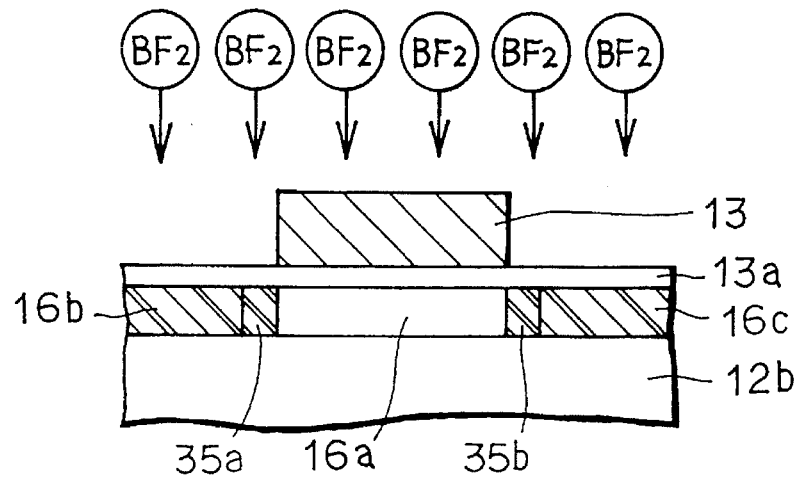
FIG. 56 is a fragmentary cross section showing a situation in which source/drain regions of a TFT is formed after formation of a gate electrode of the TFT of the eighteenth embodiment of the invention.

In this embodiment, as described above, the p-type impurity is introduced into the source/drain regions 16b and 16c of the TFT prior to the formation of the gate electrode 13. As shown in FIG. 56, however, after the formation of the gate electrode 13 of the TFT, the p-type impurity may be implanted into the source/drain regions 16b and 16c of the TFT using the gate electrode 13 of the TFT as a mask.

(Nineteenth Embodiment)

A nineteenth embodiment of the invention will be described below with reference to FIG. 57, which is a fragmentary cross section showing a semiconductor device of a TFT of the nineteenth embodiment of the invention.

Figure 57:
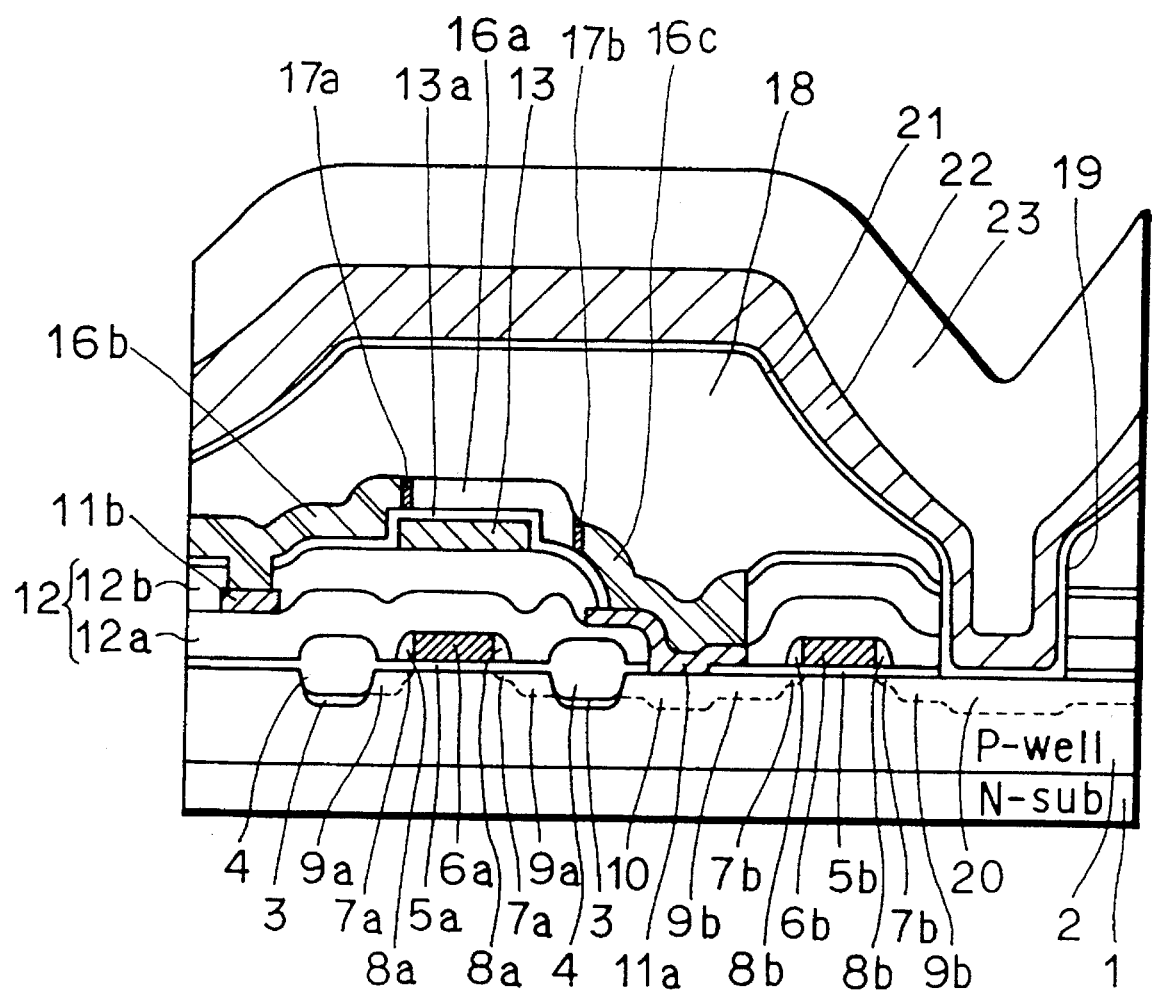
FIG. 57 is a fragmentary cross section showing a semiconductor device having a TFT of a nineteenth embodiment of the invention.

In the embodiment shown in FIG. 57, an impurity diffusion preventing layer is not formed at the interfaces between the source/drain regions 16b and 16c of the TFT, and the interconnection layer 11b and the contact electrode 11a. Other structures are similar to those of the semiconductor device having the TFT of the first embodiment shown in FIG. 3. Owing to the structures of this embodiment, it is possible to prevent reduction of the channel length of the TFT.

(Twentieth Embodiment)

A twentieth embodiment of the invention will be described below with reference to FIG. 58, which is a fragmentary cross section showing a semiconductor device having a TFT of the twentieth embodiment of the invention.

Figure 58:
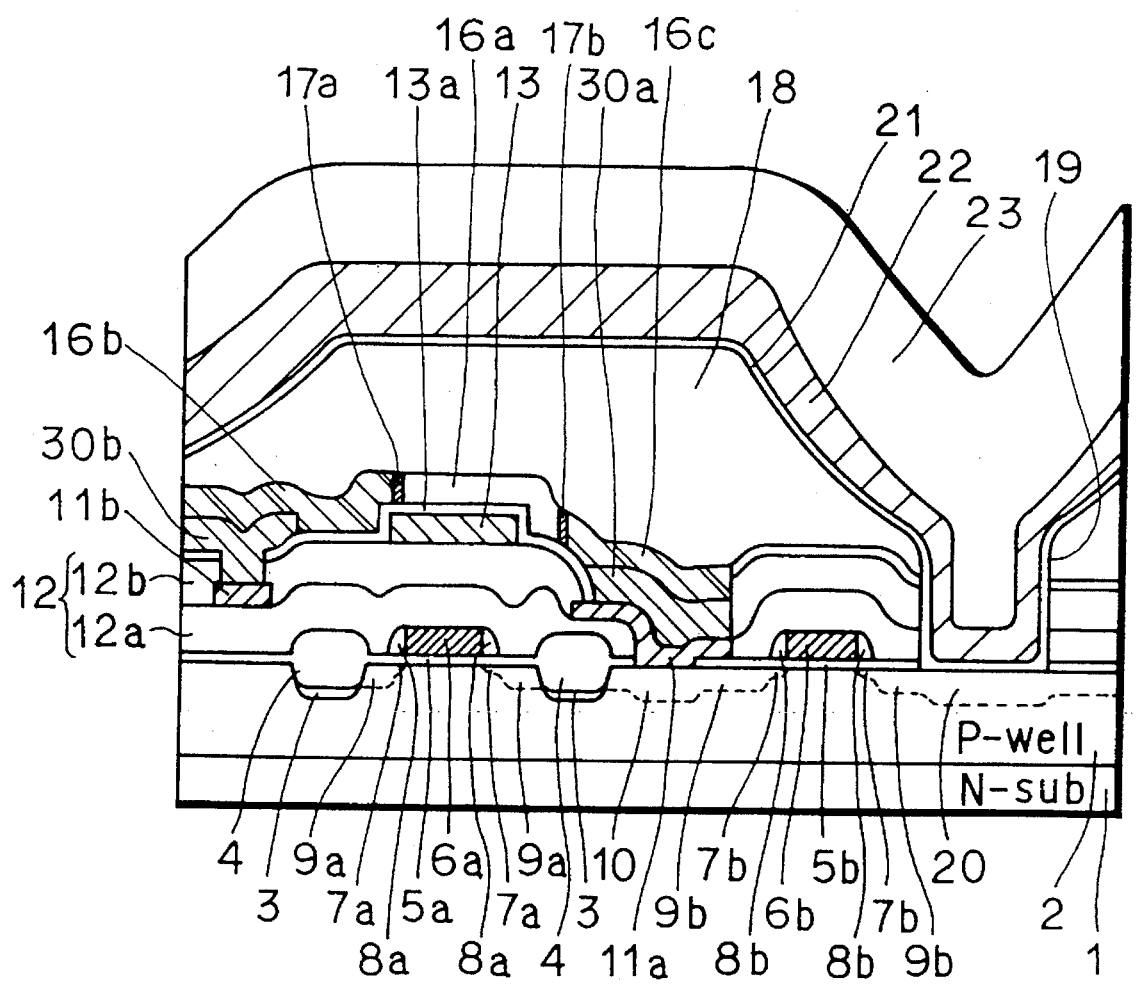
FIGS. 58–60 are fragmentary cross sections showing semiconductor devices having TFTs of twentieth to twenty-second embodiments of the invention, respectively.

In the embodiment shown in FIG. 58, the polysilicon layers 30a and 30b are formed between the source/drain regions 16b and 16c of the TFT, and the interconnection layer 11b and the contact electrode 11a, respectively. Other structures are similar to those of the semiconductor device having the TFT of the nineteenth embodiment.

Owing to the structures described above, it is possible to reduce the thickness of the semiconductor layer forming the source/drain regions 16b and 16c of the TFT. The polysilicon layers 30a and 30b contain p-type impurity introduced thereinto. The concentration of impurity of the polysilicon layers 30a and 30b is preferably lower than the concentration of p-type impurity introduced into the source/drain regions 16b and 16c of the TFT.

Thereby, it is possible to suppress the degree of diffusion of impurity in the interfaces between the polysilicon layers 30a and 30b, and the interconnection layer 11b and the contact electrode 11a, compared with the prior art. Thereby, it is possible to suppress the possibility of formation of pn junction in the interconnection layer 11b and contact electrode 11a, compared with the prior art.

(Twenty-first Embodiment)

A twenty-first embodiment of the invention will be described below with reference to FIG. 59, which is a fragmentary cross section of a semiconductor device of a TFT of the twenty-first embodiment of the invention.

Figure 59:
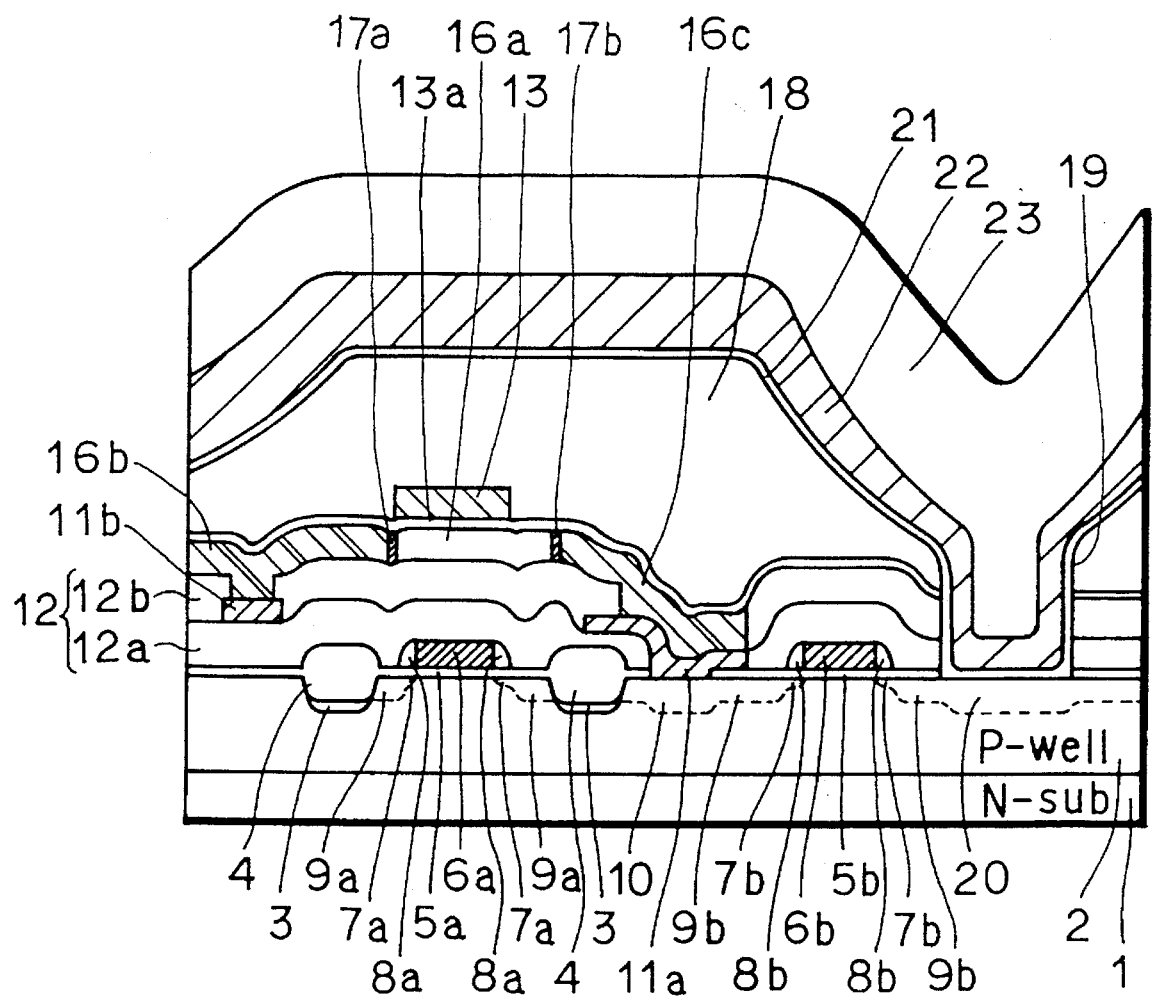

In the embodiment shown in FIG. 59, the gate electrode 13 of the TFT is formed on the channel region 16a of the TFT. Other structures are similar to those of the nineteenth embodiment shown in FIG. 57. Therefore, an effect similar to that of the nineteenth embodiment can be achieved.

(Twenty-second Embodiment)

A twenty-second embodiment of the invention will be described below with reference to FIG. 60, which is a fragmentary cross section of a semiconductor device of a TFT of the twenty-second embodiment of the invention.

Figure 60:
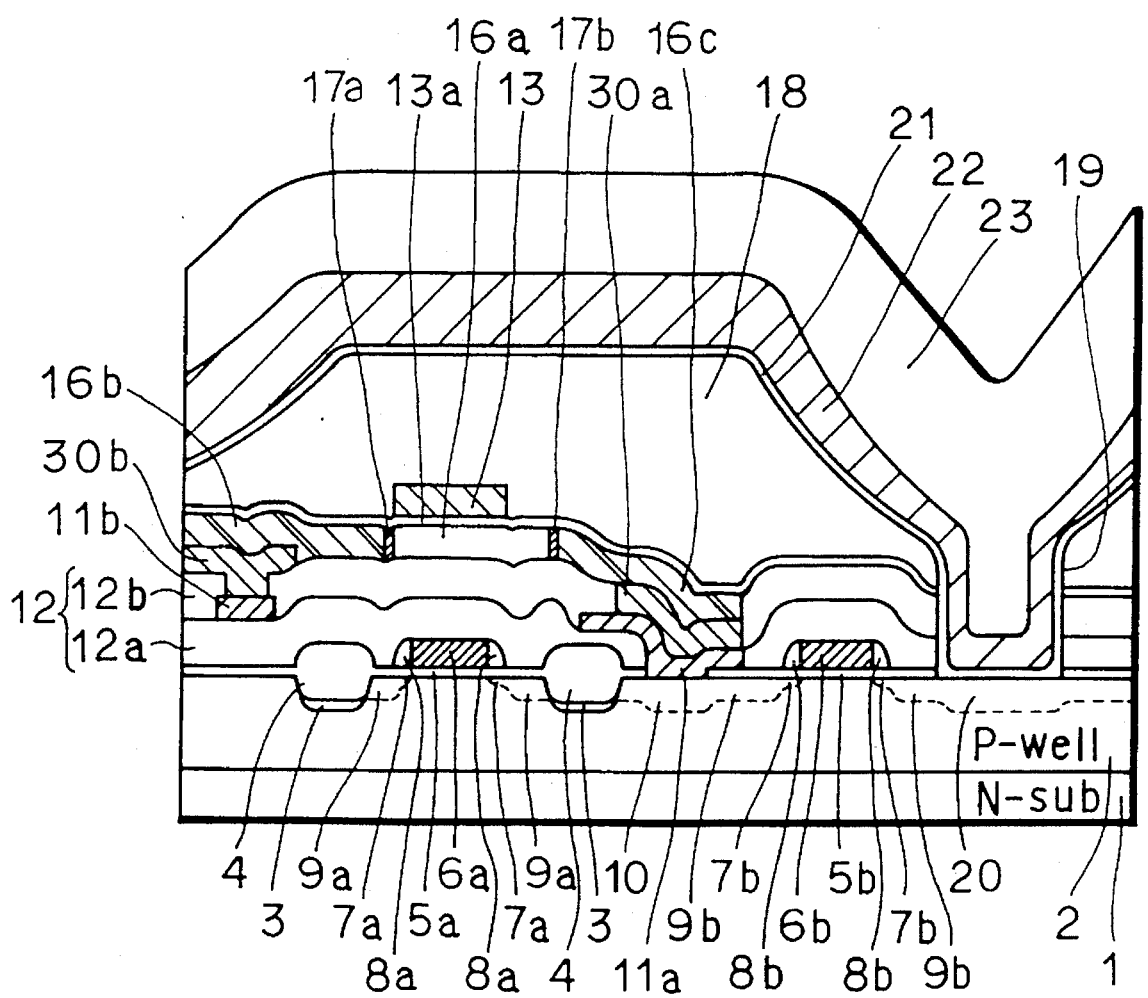
Figure 61:
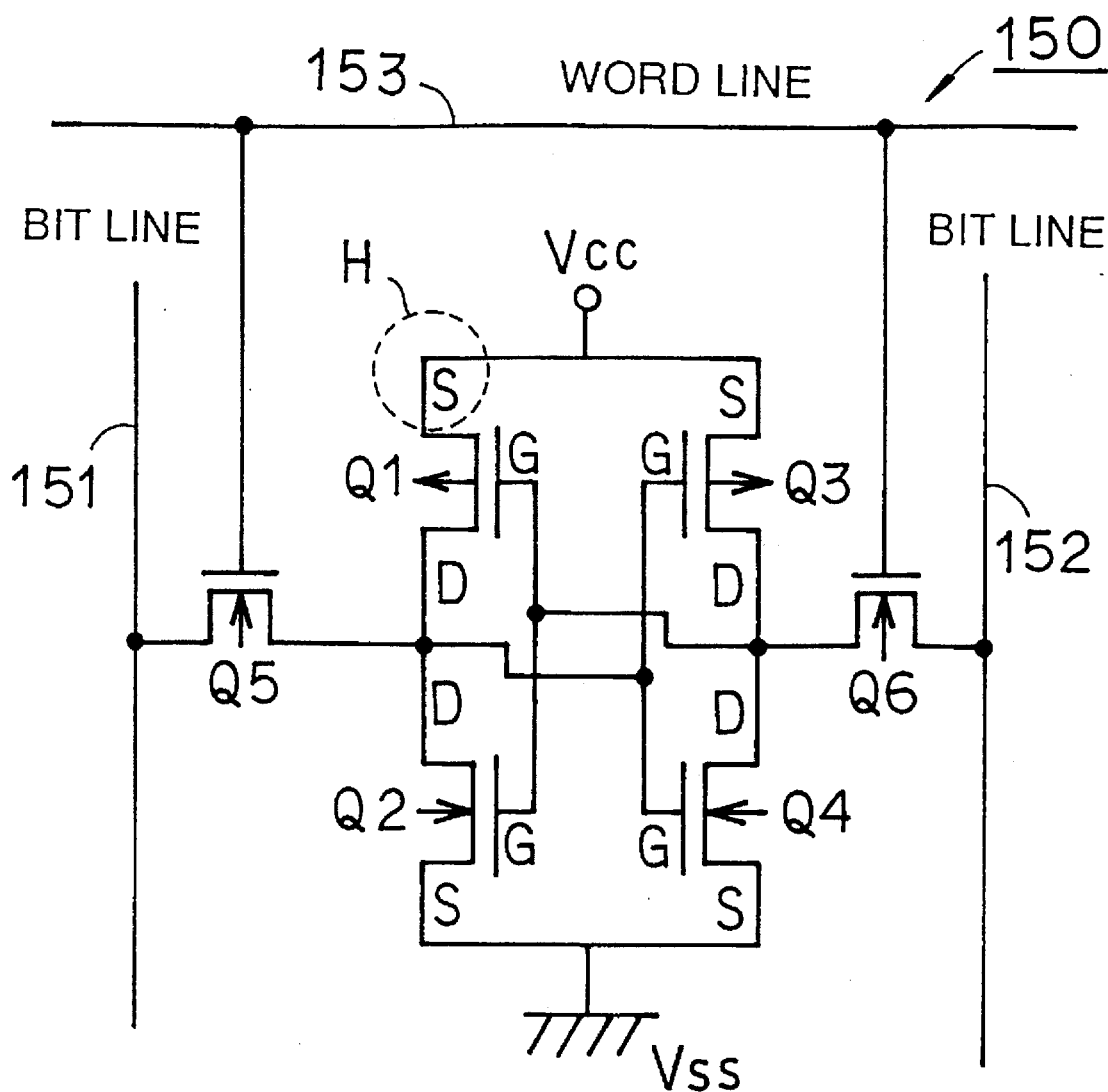
FIG. 61 is an equivalent circuit diagram showing an example of a memory cell of a semiconductor device (SRAM) having a conventional TFT.
Figure 62:
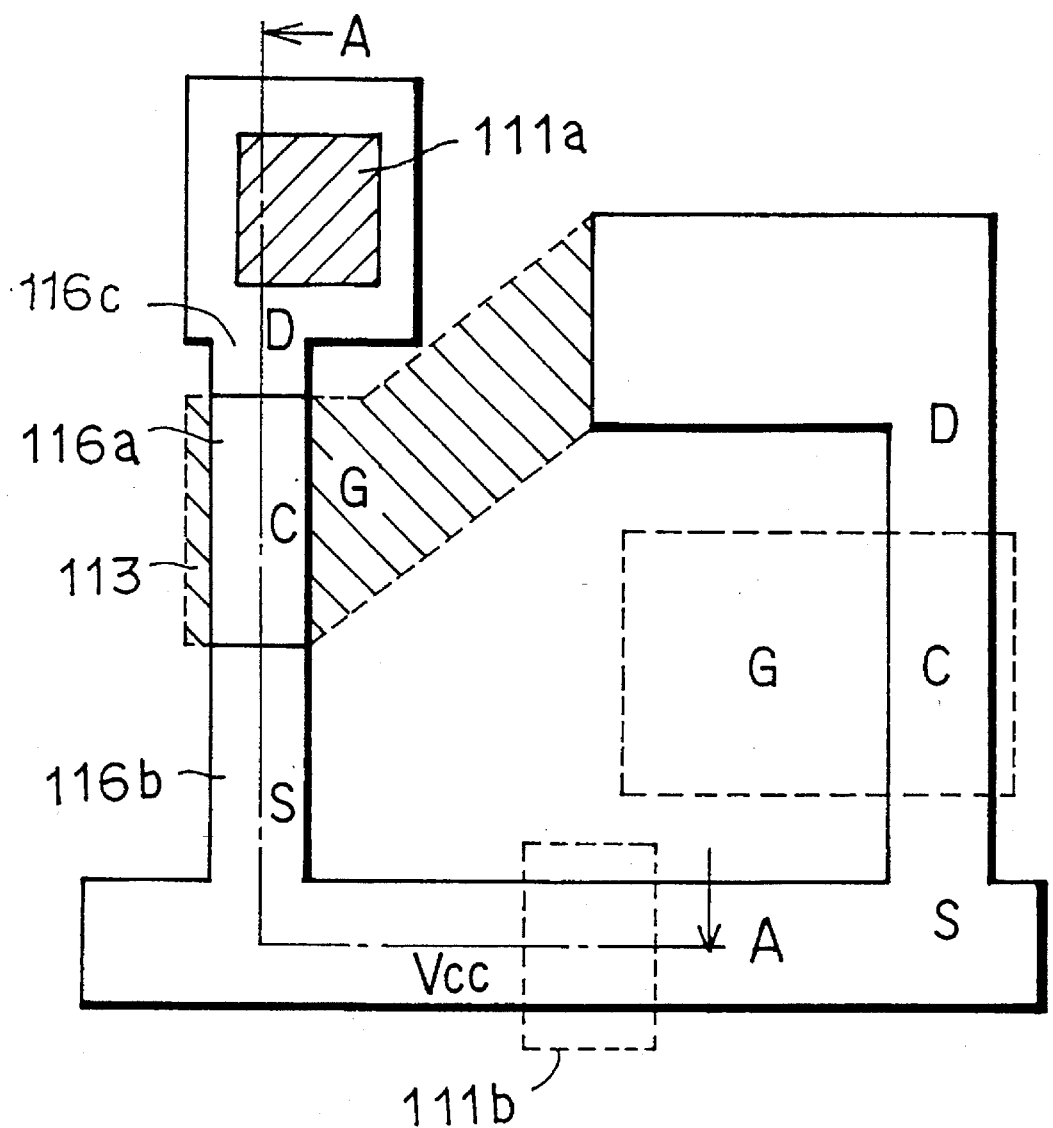
FIG. 62 is a plan showing the semiconductor device (SRAM) having the conventional TFT.
Figure 63:
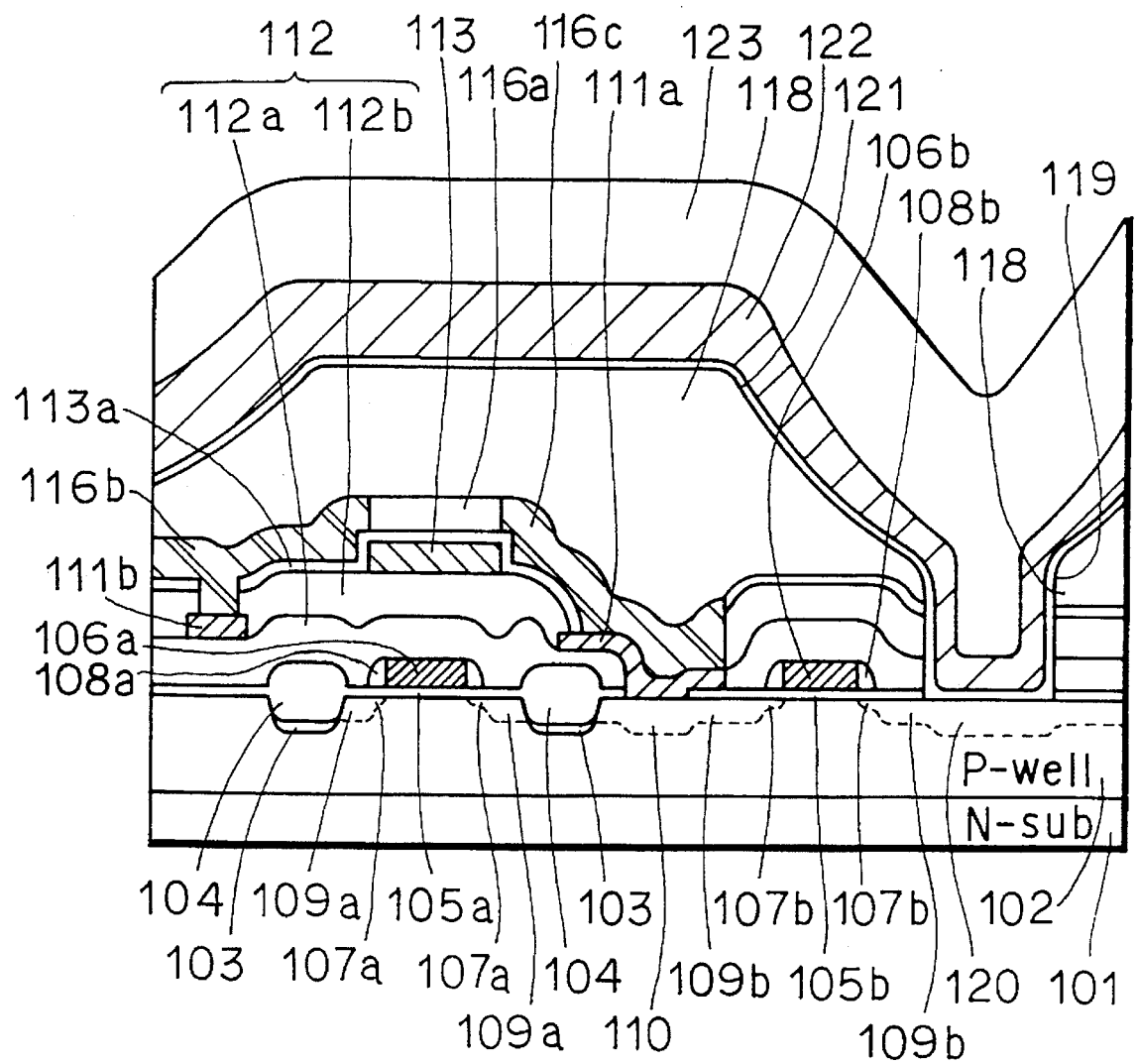
FIG. 63 is a cross section taken along line A-A in FIG. 62.
Figure 64:
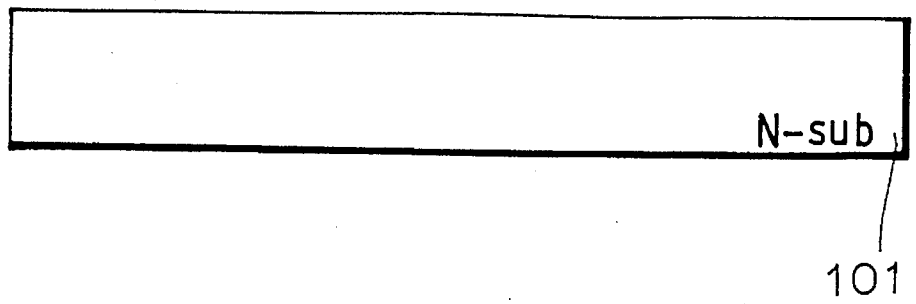
FIGS. 64–74 are fragmentary cross sections showing 1st to 11th steps in a process of manufacturing the semiconductor device having the conventional TFT, respectively.
Figure 65:
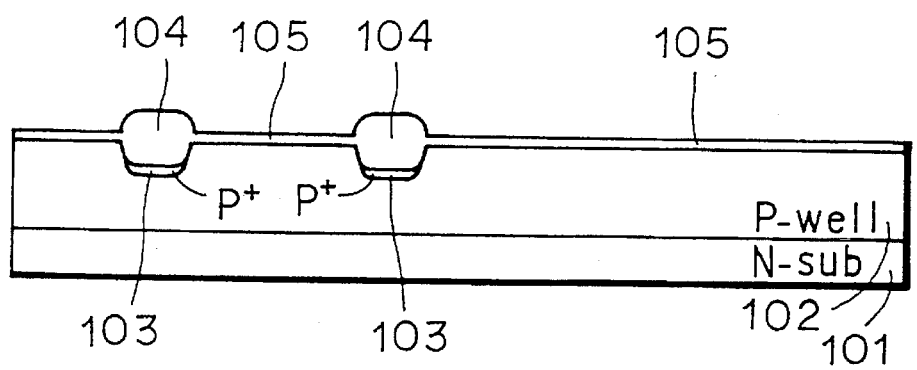
Figure 66:
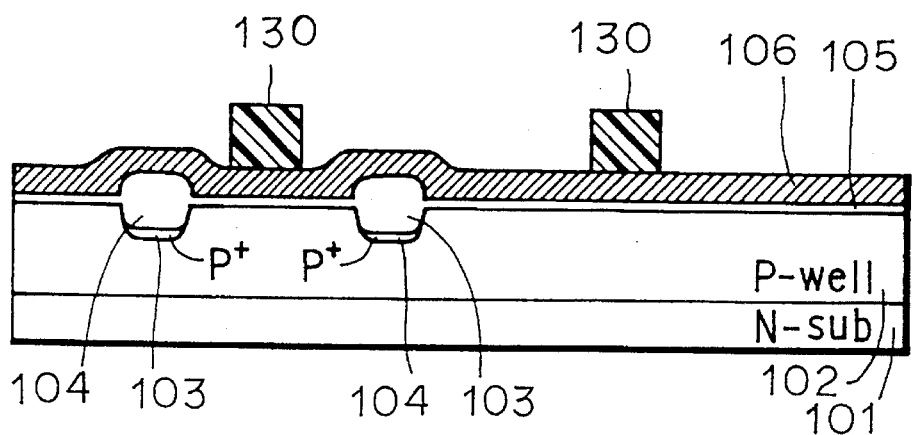
Figure 67:
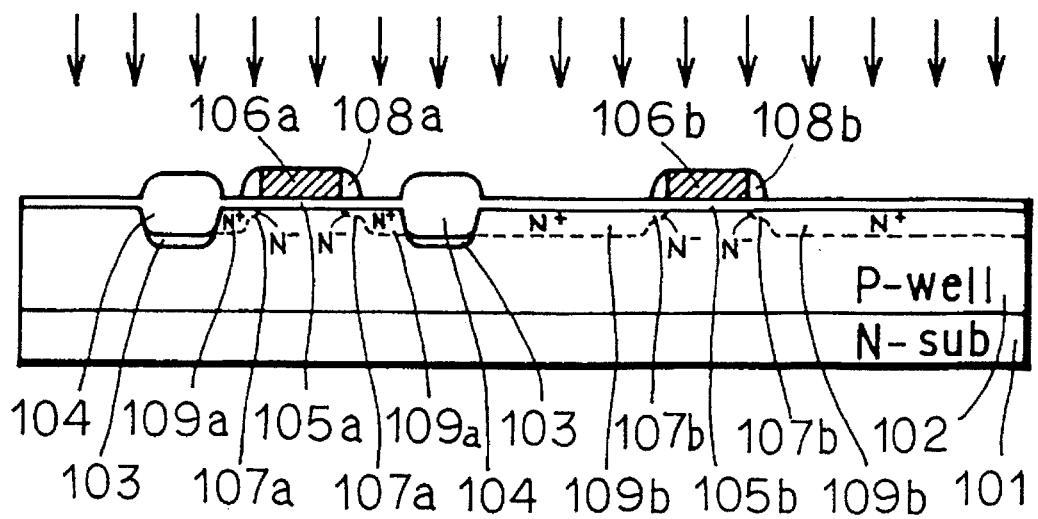
Figure 68:
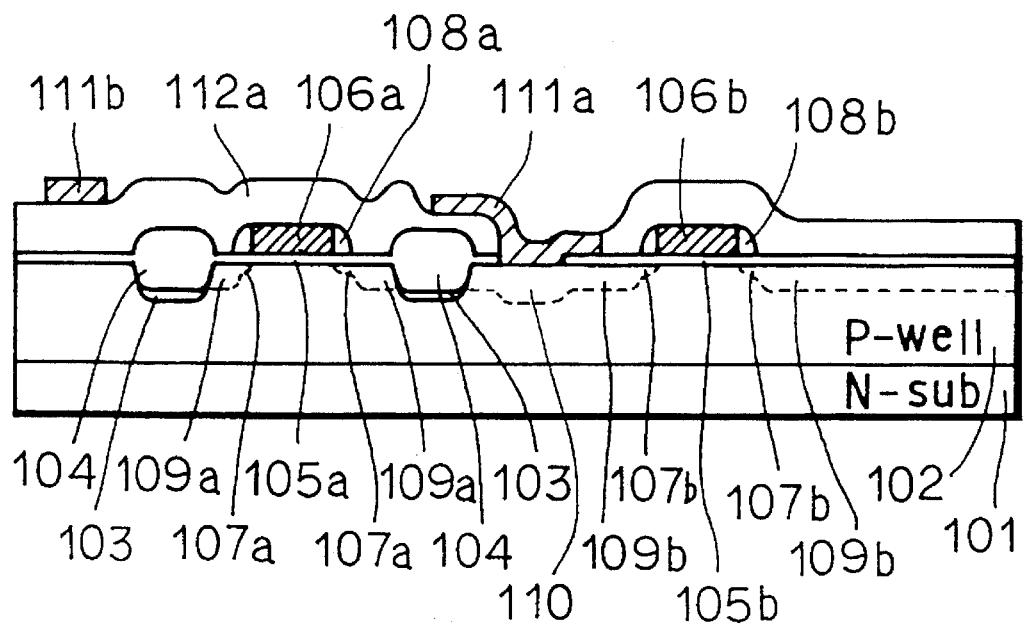
Figure 69:
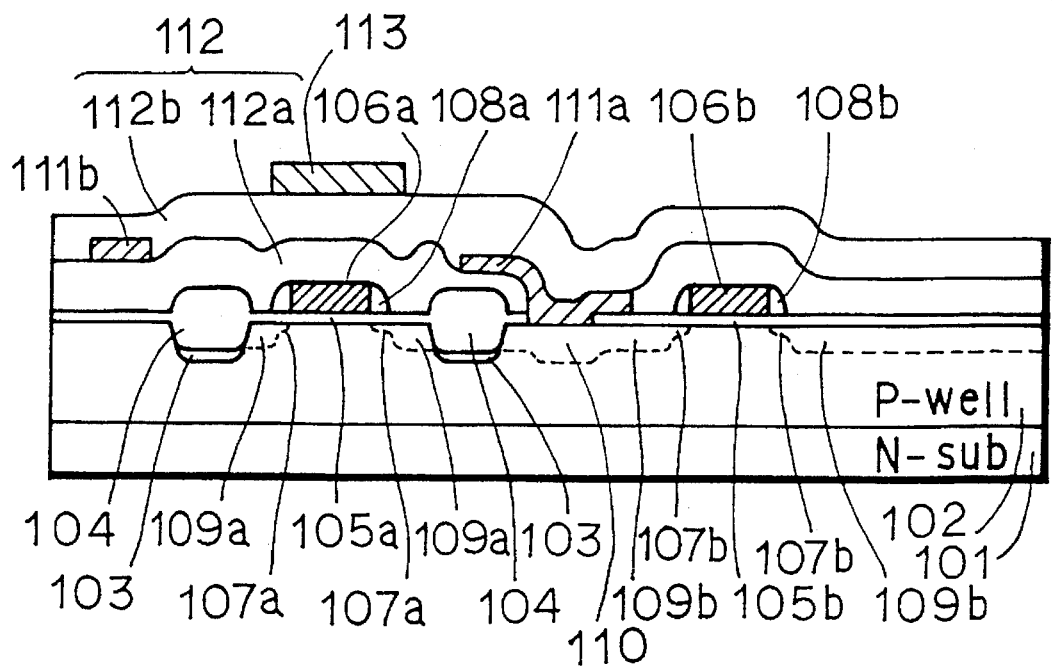
Figure 70:
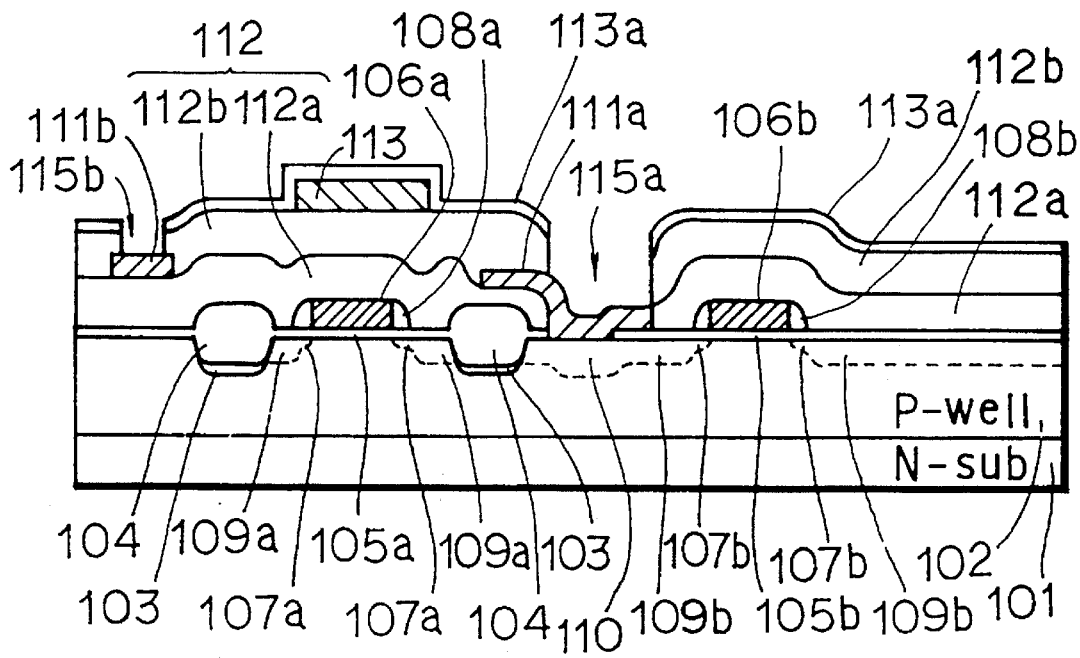
Figure 71:
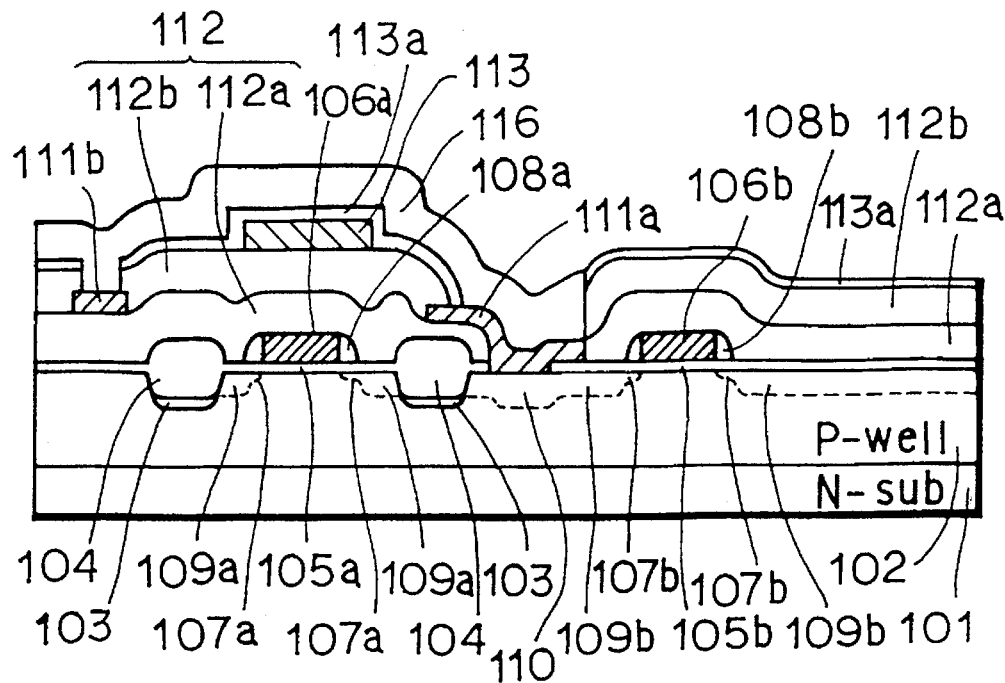
Figure 72:
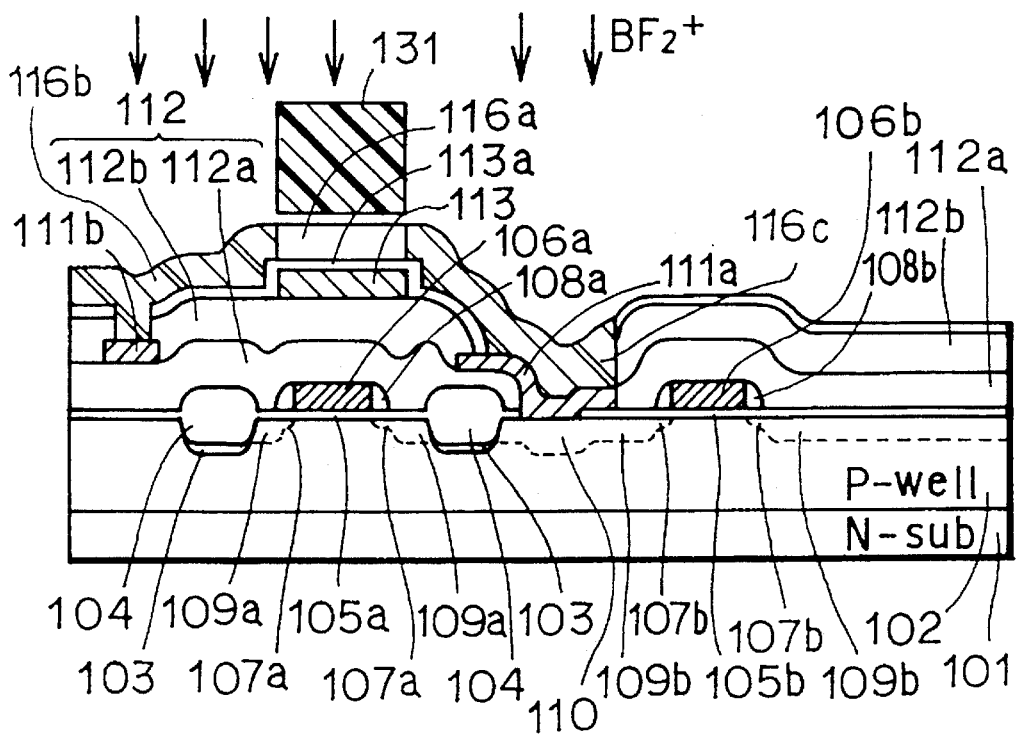
Figure 73:
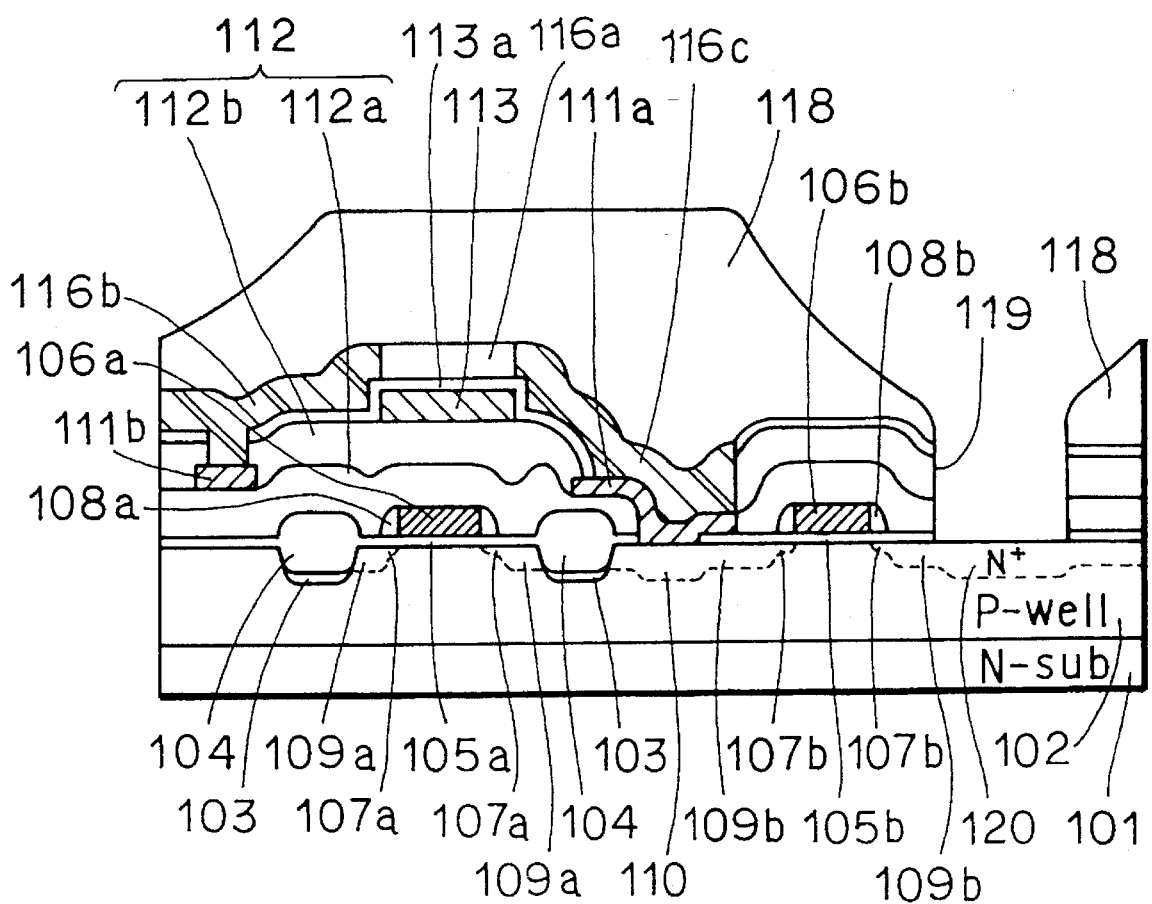
Figure 74:
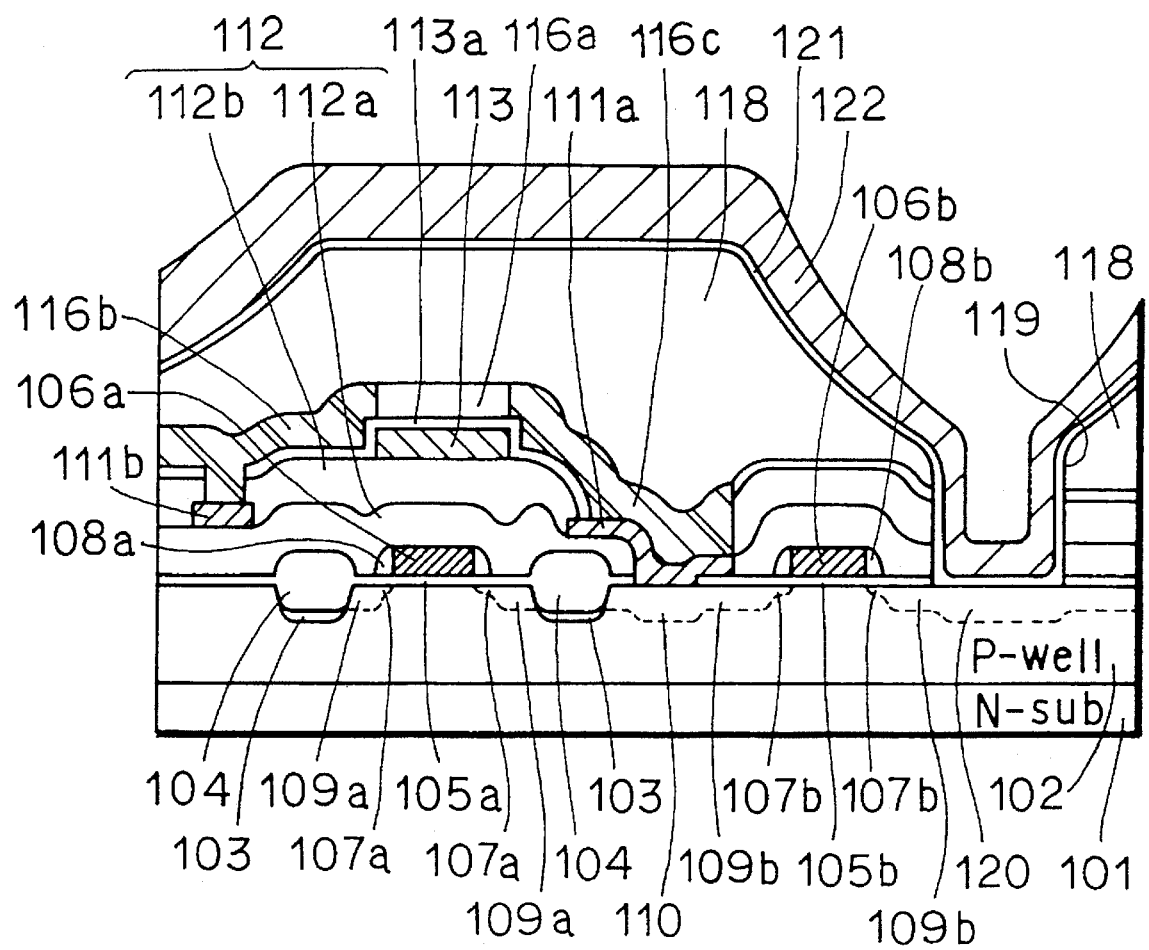
Figure 75:
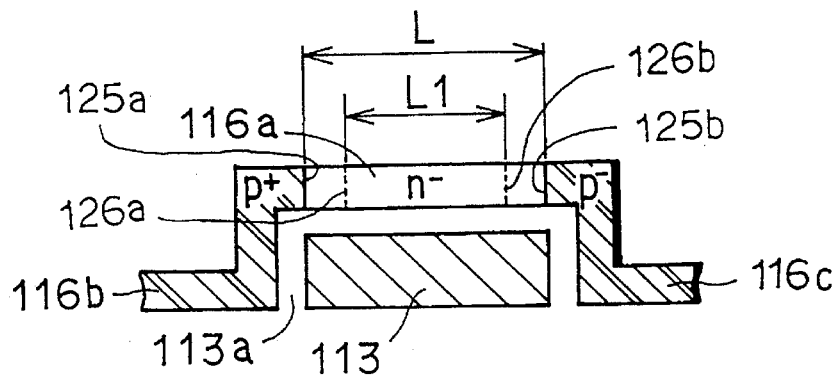
FIGS. 75–77 are schematic cross sections showing first to third problems of the semiconductor device having the conventional TFT, respectively.
Figure 76:
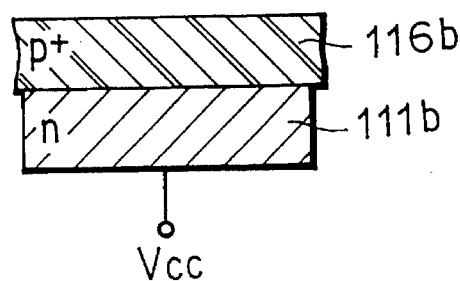
Figure 77:
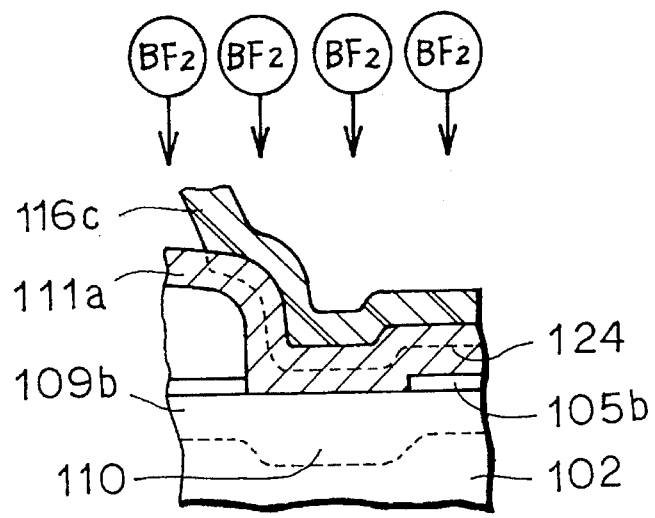

In the embodiment shown in FIG. 60, the gate electrode 13 of the TFT is formed on the channel region 16a of the TFT. Other structures are similar to those of the twentieth embodiment shown in FIG. 58. Therefore, an effect similar to that of the twentieth embodiment can be achieved.

According to an aspect of the invention, as described hereinbefore, the impurity diffusion preventing layer is formed at the interface between the channel region of the thin film transistor and at least one of the source/drain regions of the thin-film transistor. Therefore, it is possible to prevent diffusion of the impurity between the channel region of the thin film transistor and at least one of the source/drain regions of the thin film. Thereby, it is possible to effectively suppress reduction of the channel length of the thin film transistor. Thus, it is possible to provide the semiconductor device having the thin film transistor of which reliability is high.

According to another aspect of the invention, the impurity diffusion preventing layer is formed between the second conductive layer formed on the semiconductor substrate and the first conductive layer forming the source/drain regions of the thin film transistor. Therefore, it is possible to effectively prevent formation of pn junction at a junction portion between the first and second conductive layers. Thereby, it is possible to prevent increase of resistance of the junction portion, which may be caused by a reverse bias generated due to formation of the pn junction at the junction portion between the first and second conductive layers. As a result, it is possible to provide a semiconductor device having a thin film transistor of which performance is high.

According to still another aspect of the invention, there is formed the connection conductive layer, which contains the impurity of the same conductivity type as that of the source/drain regions of the thin film transistor. Owing to the existence of this connection conductive layer, the thickness of the source/drain regions and channel region of the thin film transistor can be small. Thereby, the leak current of the thin film transistor can be suppressed at a small value.

The concentration of impurity of the connection conductive layer is smaller than the concentration of impurity of the first conductive layer, so that it is possible to reduce the degree of diffusion of impurity between the connection conductive layer and the second conductive layer. Thereby, it is possible to suppress the possibility of formation of the pn junction in the second conductive layer, compared with the prior art. Thus, it is possible to reduce the resistance of the junction portion between the connection conductive layer and the second conductive layer, compared with the prior art. As a result, the semiconductor device having the thin film transistor can ensure the intended data holding characteristics and the high operation speed.

In the method of manufacturing the thin film according to the invention, the layer forming the channel region of the thin film transistor is different from the layer forming the source/drain regions of the thin film transistor. Therefore, it is possible to form the impurity diffusion preventing layers at the interfaces between the channel region of the thin film transistor and the source/drain regions of the thin film transistor. As a result, it is possible to prevent reduction of the channel length of the thin film transistor.

In the method of manufacturing the thin film transistor according to another aspect of the invention, nitrogen is introduced into the semiconductor layer and is crystallized to form the nitride film in the semiconductor layer. Therefore, it is possible to form the nitride film functioning as the impurity diffusion preventing layer at the interfaces between the channel region of the thin film and the source/drain regions of the thin film transistor in the semiconductor layer. Thereby, it is possible to prevent reduction of the channel length of the thin film transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film transistor, comprising:

source/drain regions formed in a thin semiconductor layer which is formed on a semiconductor substrate with an insulating film therebetween, said source/drain regions containing impurity of a first conductivity type and defining a channel region sandwiched between said source region and said drain region, said channel region having ends overlapping a portion of said source/drain regions; and a gate electrode formed at a position opposed to said channel region with a gate insulating film therebetween, wherein a diffusion preventing layer for preventing diffusion of impurity is formed on at least one of interfaces between said channel region and said source/drain regions, wherein said diffusion preventing layer extends from a region between said gate electrode and said channel region to a position above said source/drain regions.

2. The thin film transistor according to claim 1, wherein said diffusion preventing layer is formed at the interface between said drain region and said channel region.

3. The thin film transistor according to claim 1, wherein said diffusion preventing layers are formed at the interface between said drain region and said channel region and at the interface between said source region and said channel region.

4. The thin film transistor according to claim 1, wherein said diffusion preventing layer is a dielectric film.

5. The thin film transistor according to claim 1, wherein the thickness of said diffusion preventing layer is 30 Å, or less.

6. The thin film transistor according to claim 2, wherein said diffusion preventing layer formed at the interface between said drain region and said channel region is located at a position spaced by a predetermined distance from said gate electrode in a channel length direction of said thin film transistor.

7. The thin film transistor according to claim 1, wherein said channel region is formed of a first semiconductor layer, and said source/drain regions are formed of a pair of second semiconductor layers.

8. The thin film transistor according to claim 7, wherein said diffusion preventing layer extends between said first semiconductor layer and said gate electrode and over surfaces of said pair of second semiconductor layers.

9. The thin film transistor according to claim 7, wherein a width of said first semiconductor layer in the channel width direction of said thin film transistor is at least a width of said second semiconductor layer in the channel width direction.

10. The thin film transistor according to claim 1, wherein said diffusion preventing layer is selected from the group consisting of a titanium nitride film and a silicon nitride film.

11. A semiconductor device having a thin film transistor, comprising:

a first conductive layer formed in a thin semiconductor layer which is formed on a semiconductor substrate with an insulating film therebetween, said first conductive layer containing impurity of a first conductivity type and forming source/drain regions of a thin film transistor;

a second conductive layer formed on said semiconductor substrate, said second conductive layer being electrically connected to said first conductive layer and containing impurity of a second conductivity type; and a connection conductive layer formed between said first and second conductive layers and containing impurity of the first conductivity type, wherein concentration of said impurity of the first conductivity type contained in said connection conductive layer is lower than that of said impurity of the first conductivity type contained in said first conductive layer.

12. The semiconductor device having a thin film transistor according to claim 11, wherein a diffusion preventing layer is formed at the interface between said connection conductive layer and said second conductive layer.

13. A semiconductor device having a thin film transistor, comprising:

a pair of first impurity regions of a first conductivity type formed in a thin semiconductor layer formed on a main surface of a semiconductor substrate of a first conductivity type with an insulating film posed therebetween, to define a first channel region;

a first gate electrode formed at a position opposite to said first channel region with a gate insulating film posed therebetween;

a conductive layer of a second conductivity type formed on the main surface of said semiconductor substrate and connected to one of said first impurity regions;

a connection conductive layer formed between one of said first impurity regions and said conductive layer and including an impurity of the first conductivity type;

a pair of second impurity regions of the second conductivity type formed on the main surface of said semiconductor substrate to define a second channel region, one of which is connected to said conductive layer; and a second gate electrode formed on said second channel region with a gate insulating film posed therebetween; wherein impurity concentration of the first conductivity type included in said connection conductive layer is lower than impurity concentration of the first conductivity type included in said first impurity regions.

14. The semiconductor device having a thin film transistor according to claim 13, wherein an impurity diffusion preventing layer is formed between said connection conductive layer and said conductive layer.

15. The semiconductor device having a thin film transistor according to claim 14, wherein said impurity diffusion preventing layer is selected from the group consisting of a titanium nitride layer and a silicon nitride layer.

16. The semiconductor device having a thin film transistor according to claim 13, wherein an impurity diffusion preventing layer is formed between said first impurity regions and said first channel region.

* * * * *